(12) United States Patent
Choi et al.

(10) Patent No.: US 12,381,189 B2
(45) Date of Patent: Aug. 5, 2025

(54) DISPLAY DEVICE

(71) Applicant: Samsung Display Co., LTD., Yongin-si (KR)

(72) Inventors: Hae Yun Choi, Hwaseong-si (KR); Min Woo Kim, Hwaseong-si (KR); Sung Kook Park, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 461 days.

(21) Appl. No.: 17/708,759

(22) Filed: Mar. 30, 2022

(65) Prior Publication Data
US 2023/0046443 A1 Feb. 16, 2023

(30) Foreign Application Priority Data

Aug. 10, 2021 (KR) .......................... 10-2021-0105688

(51) Int. Cl.
*H01L 25/075* (2006.01)
*H10H 20/857* (2025.01)

(52) U.S. Cl.
CPC ....... *H01L 25/0753* (2013.01); *H10H 20/857* (2025.01)

(58) Field of Classification Search
CPC ..... H01L 25/0753; H01L 33/62; H01L 33/60; H01L 27/156; H01L 33/36; H01L 33/483
See application file for complete search history.

(56) References Cited

U.S. PATENT DOCUMENTS

| 10,453,901 | B2 | 10/2019 | Kim et al. | |
|---|---|---|---|---|
| 10,686,018 | B2 | 6/2020 | Kim et al. | |
| 2012/0313844 | A1* | 12/2012 | Im | H10K 59/352 438/34 |
| 2017/0148773 | A1* | 5/2017 | Sakariya | H01L 33/60 |
| 2017/0207249 | A1* | 7/2017 | Rhee | H10K 59/131 |
| 2017/0294451 | A1* | 10/2017 | Kim | H01L 27/124 |
| 2017/0309688 | A1* | 10/2017 | Lee | H10K 59/352 |
| 2018/0083218 | A1* | 3/2018 | Choi | H10K 50/856 |
| 2018/0166015 | A1* | 6/2018 | Beak | H10K 59/1213 |
| 2019/0229235 | A1* | 7/2019 | Iguchi | H01L 27/156 |

(Continued)

FOREIGN PATENT DOCUMENTS

| CN | 112117296 A | 12/2020 |
|---|---|---|
| KR | 2018-0118488 A | 10/2018 |

(Continued)

*Primary Examiner* — Bitew A Dinke
(74) *Attorney, Agent, or Firm* — Womble Bond Dickinson (US) LLP

(57) ABSTRACT

A display device includes: a substrate; a partition wall on the substrate; a plurality of light emitting areas on the substrate, the light emitting areas including a first light emitting area, a second light emitting area, and a third light emitting area partitioned by the partition wall; a first light emitting element in the first light emitting area and configured to emit first light; a second light emitting element in the second light emitting area and configured to emit second light; and a third light emitting element in the third light emitting area and configured to emit third light. An area of the first light emitting area is larger than an area of the first light emitting element and is larger than an area of the second light emitting area and an area of the third light emitting area.

21 Claims, 48 Drawing Sheets

(56) References Cited

U.S. PATENT DOCUMENTS

| | | | |
|---|---|---|---|
| 2019/0252469 A1* | 8/2019 | Xiao | H10K 59/122 |
| 2019/0305036 A1* | 10/2019 | Ahn | H01L 33/62 |
| 2020/0066787 A1* | 2/2020 | Park | H01L 27/156 |
| 2020/0152713 A1* | 5/2020 | Yim | H10K 59/352 |
| 2020/0212267 A1* | 7/2020 | Kwak | H01L 33/24 |
| 2020/0227592 A1 | 7/2020 | Zhang et al. | |
| 2020/0243625 A1* | 7/2020 | Beak | H10K 59/1315 |
| 2020/0343230 A1* | 10/2020 | Sizov | H01L 25/0753 |
| 2020/0357846 A1* | 11/2020 | Lee | H01L 33/504 |
| 2020/0365567 A1* | 11/2020 | Park | H01L 25/0753 |
| 2021/0005583 A1* | 1/2021 | Iguchi | H01L 33/62 |
| 2021/0151422 A1* | 5/2021 | Iguchi | H01L 33/0095 |
| 2022/0005885 A1* | 1/2022 | Xiao | H10K 59/352 |
| 2022/0069182 A1* | 3/2022 | Iguchi | H01L 27/156 |
| 2022/0238610 A1* | 7/2022 | Xu | H10K 59/352 |
| 2022/0336541 A1* | 10/2022 | Niu | H10K 59/352 |
| 2022/0352245 A1* | 11/2022 | Seo | H01L 33/58 |
| 2022/0352420 A1* | 11/2022 | Park | H01L 33/382 |
| 2022/0352425 A1* | 11/2022 | Kim | H01L 25/0753 |
| 2022/0352437 A1* | 11/2022 | Song | H01L 33/507 |
| 2023/0047445 A1* | 2/2023 | Choi | H01L 25/167 |
| 2023/0051074 A1* | 2/2023 | Park | H01L 33/62 |
| 2023/0053037 A1* | 2/2023 | Choi | H01L 25/18 |
| 2023/0200128 A1* | 6/2023 | Su | H10K 77/10 257/40 |
| 2023/0261158 A1* | 8/2023 | Moriyama | H01L 33/62 257/79 |

FOREIGN PATENT DOCUMENTS

| | | |
|---|---|---|
| KR | 10-2019-0027051 A | 3/2019 |
| KR | 2019-0093830 A | 8/2019 |
| KR | 10-2020-0079817 A | 7/2020 |
| WO | WO-2020013403 A1 * | 1/2020 ......... H01L 25/0753 |

* cited by examiner

DISPLAY DEVICE

CROSS-REFERENCE TO RELATED APPLICATION

This application claims priority to and the benefit of Korean Patent Application No. 10-2021-0105688, filed on Aug. 10, 2021, in the Korean Intellectual Property Office, the disclosure of which is incorporated herein in its entirety by reference.

BACKGROUND

1. Field

Aspects of embodiments of the present disclosure relate to a display device.

2. Description of the Related Art

As society becomes increasingly information driven, the demand for display devices for displaying images in various forms is increasing. The display devices may be flat panel displays, such as liquid crystal displays, field emission displays, and light emitting displays. The light emitting display device may include an organic light emitting display device including an organic light emitting diode element as a light emitting element, an inorganic light emitting display device including an inorganic semiconductor element as a light emitting element, or a micro light emitting diode element as a light emitting element.

Recently, a head-mounted display including a light emitting display has been developed. The head-mounted display is a virtual reality (VR) or augmented reality (AR) glasses-type monitor device that is worn by a user in the form of glasses or a helmet and forms a focus at a short distance from the user's eyes.

A high-resolution, micro light emitting diode display panel including a micro-light emitting diode element may be applied to (e.g., used in) the head-mounted display.

SUMMARY

Aspects of embodiments of the present disclosure provide a display device including micro light emitting diode elements that emit red, green, or blue light.

A micro light emitting diode element that emits red light may exhibit luminous efficiency decreases as current density increases. To lower the current density, the area of the red light emitting diode element may be increased. Accordingly, a display device using the light emitting diode element having high luminous efficiency can be realized.

However, aspects of the present disclosure are not restricted to the one set forth above. The above and other aspects of the present disclosure will become more apparent to one of ordinary skill in the art to which the present disclosure pertains by referencing the detailed description of the present disclosure given below.

According to an embodiment of the present disclosure, a display device includes a substrate, a partition wall on the substrate; a plurality of light emitting areas on the substrate and including a first light emitting area, a second light emitting area, and a third light emitting area partitioned by the partition wall, a first light emitting element in the first light emitting area and configured to emit first light, a second light emitting element in the second light emitting area and configured to emit second light, and a third light emitting element in the third light emitting area and configured to emit third light. An area of the first light emitting area is larger than an area of the first light emitting element and is larger than an area of the second light emitting area and an area of the third light emitting area.

According to another embodiment of the present disclosure, a display device includes a substrate, a pixel electrode on the substrate, a common connection electrode on the substrate and spaced apart from the pixel electrode, a light emitting element on the pixel electrode, a first connection electrode on the common connection electrode, a partition wall on the first connection electrode, and a common electrode. At least a part of an upper surface of the first connection electrode is exposed without being covered by the partition wall, and the common electrode is connected to the upper surface of the first connection electrode exposed without being covered by the partition wall.

According to another embodiment of the present disclosure, a display device includes a substrate, a partition wall on the substrate, a plurality of light emitting areas including a first light emitting area, a second light emitting area, and a third light emitting area partitioned by the partition wall, and a plurality of common connection areas spaced apart from each of the light emitting areas. A distance between a first common connection area from among the common connection areas and a center point of the first light emitting area adjacent to the first common connection area is the same as a distance between the first common connection area and a center point of the second light emitting area adjacent to the first common connection area.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

Figure 1:
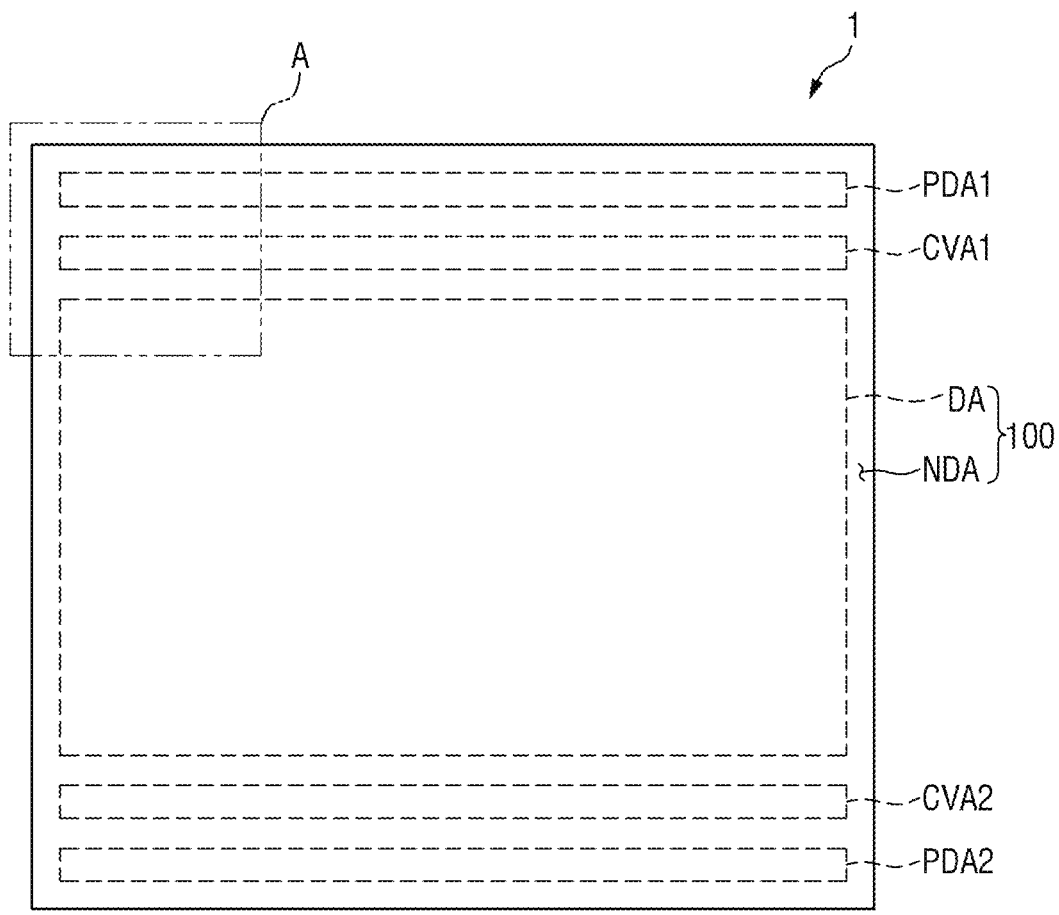
FIG. 1 is a layout view of a display device according to an embodiment.
Figure 1:
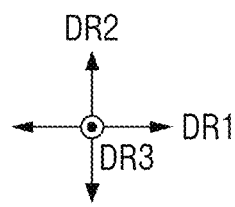

Hereinafter, embodiments of the present disclosure will be described with reference to the accompanying drawings.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present disclosure and is not intended to be limiting of the described example embodiments of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Figure 2:
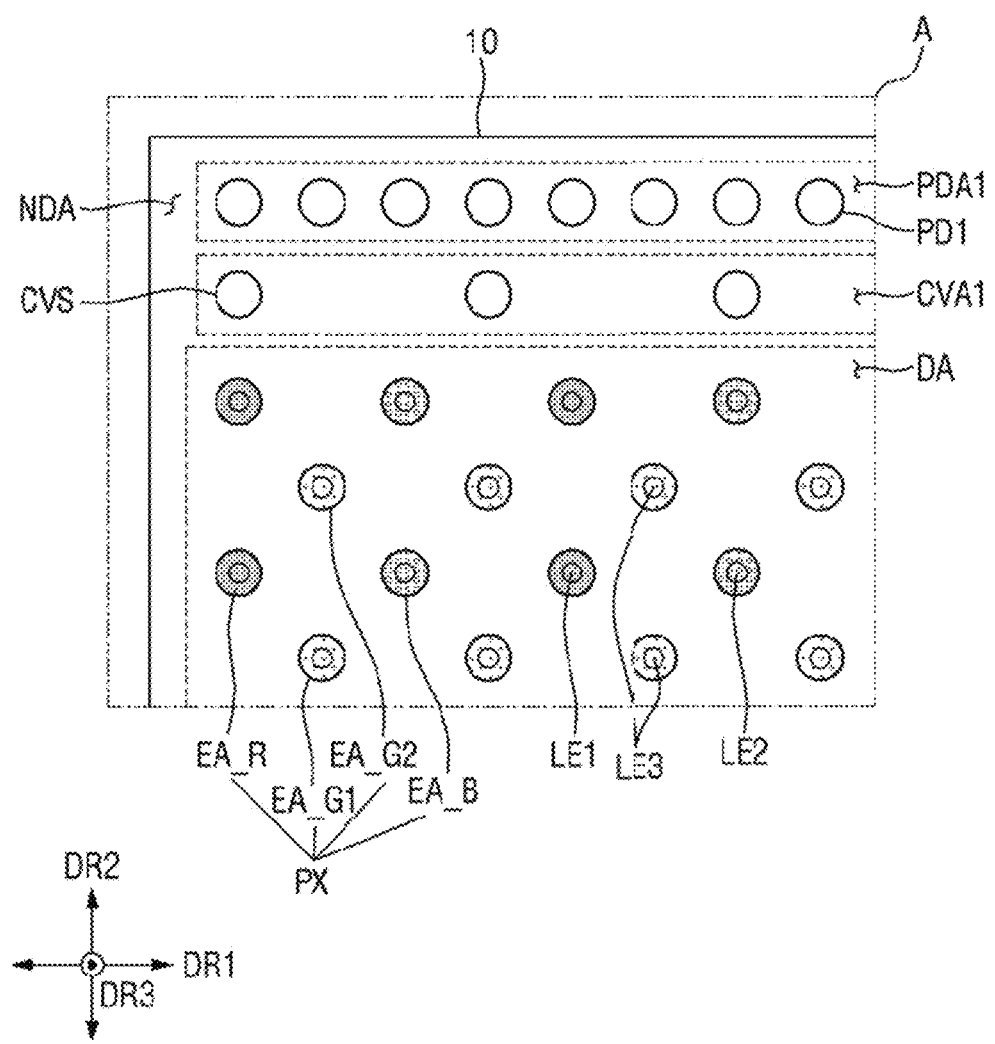
FIG. 2 is a detailed layout view of the area A of FIG. 1.
Figure 3:
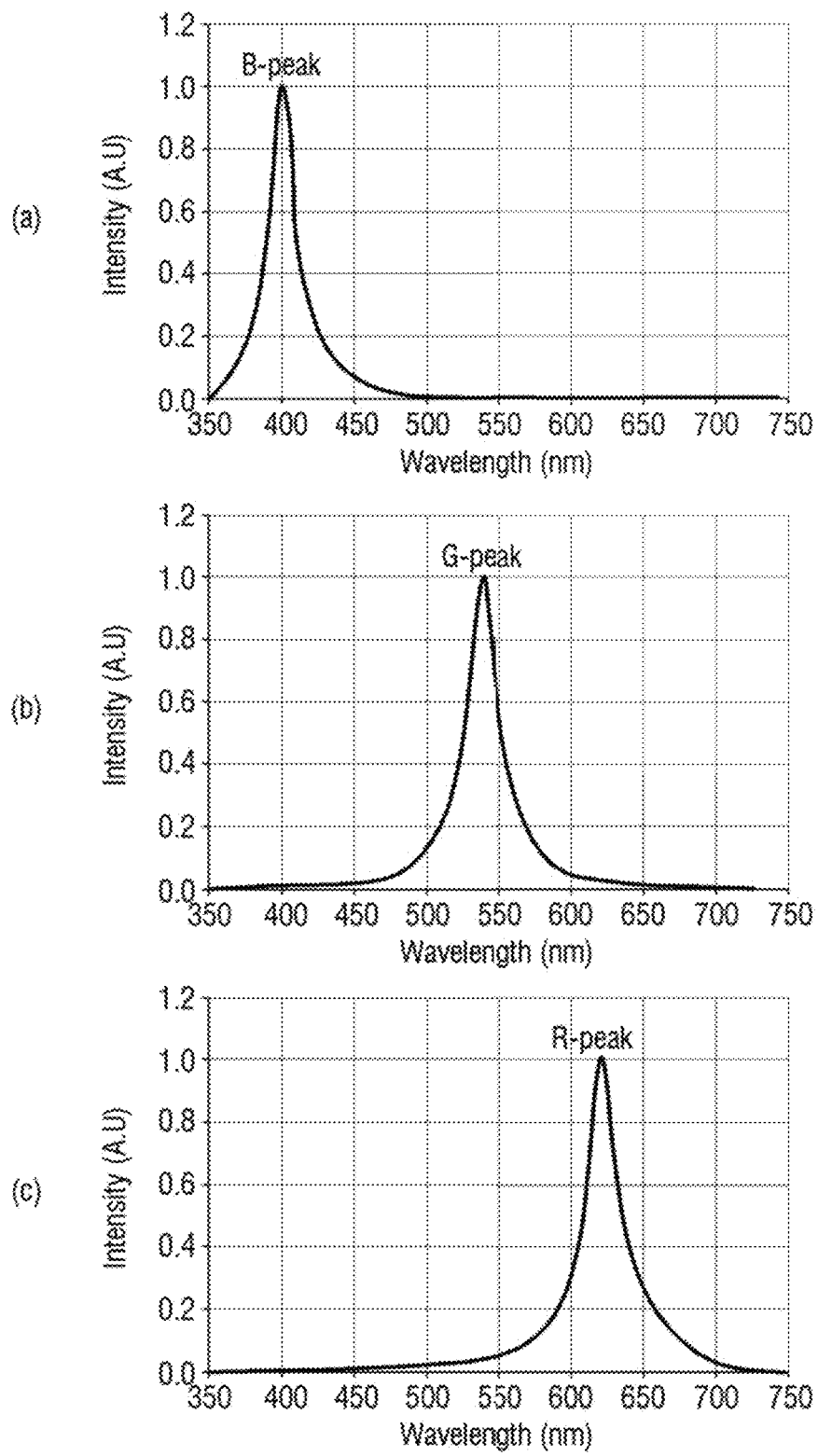
FIG. 3 is a graph illustrating an example of a main peak wavelength of first light, a main peak wavelength of second light, and a main peak wavelength of third light.

FIG. 1 is a layout view of a display device 1 according to an embodiment, and FIG. 2 is a detailed layout view of the area A of FIG. 1. FIG. 3 is a graph illustrating an example of a main peak wavelength of first light, a main peak wavelength of second light, and a main peak wavelength of third light.

In FIGS. 1 through 3, an embodiment in which the display device 1 is a micro light emitting diode display device (e.g., a micro or nano light emitting diode display device) including micro light emitting diodes (e.g., micro or nano light emitting diodes) as light emitting elements LE is primarily described, but embodiments of the present disclosure are not limited to this case.

In addition, in FIGS. 1 through 3, a first direction DR1 indicates a horizontal direction of a display panel 10, a second direction DR2 indicates a vertical direction of the display panel 10, and a third direction DR3 indicates a thickness direction of the display panel 10 or a thickness direction of a semiconductor circuit board 110. In this case, "left," "right," "upper," and "lower" indicate directions when the display panel 10 is seen in a plan view. For example, a "right side" indicates one side in the first direction DR1, a "left side" indicates the other side in the first direction DR1, an "upper side" indicates one side in the second direction DR2, and a "lower side" indicates the other side in the second direction DR2. In addition, "top" indicates one side (or surface) in the third direction DR3, and "bottom" indicates the other side (or other surface) in the third direction DR3.

Referring to FIGS. 1 through 3, the display device 1 according to an embodiment includes the display panel 10 having a display area DA and a non-display area NDA.

The display panel 10 may have a quadrangular planar shape having long sides in the first direction DR1 and short sides in the second direction DR2. However, the planar shape of the display panel 10 is not limited thereto, and the display panel 10 may also have a polygonal, circular, oval, or irregular planar shape other than the quadrangular shape.

The display area DA may be an area where an image is displayed, and the non-display area NDA may be an area where no image is displayed. The non-display area NDA may surround (e.g., may surround in a plan view or may extend around a periphery of) the display area DA.

The display area DA of the display panel 10 may include a plurality of pixels PX. Each of the pixels PX may be defined as a minimum light emitting unit that can display white light.

Each of the pixels PX may have a plurality of light emitting areas EA_R, EA_B, EA_G1, and EA_G2 that emit light. In an embodiment, each of the pixels PX may have four light emitting areas EA_R, EA_B, EA_G1, and EA_G2. The light emitting areas EA_R, EA_B, EA_G1, and EA_G2 may include a red light emitting area EA_R, a blue light emitting area EA_B, a first green light emitting area EA_G1, and a second green light emitting area EA_G2. For another example, each of the pixels PX may have three light emitting areas EA_R, EA_B, and EA_G1 composed of the red light emitting area EA_R, the blue light emitting area EA_B, and the first green light emitting area EA_G1. The light emitting areas EA_R, EA_B, EA_G1, and EA_G2 may respectively include light emitting elements LE1 through LE3 emitting light of different colors. Although the light emitting elements LE1 through LE3 have a circular planar shape in FIG. 2, embodiments of the present disclosure are not limited thereto. For example, the light emitting elements LE1 through LE3 may also have a polygonal shape, such as a quadrangle or an oval shape.

The red light emitting area EA_R may include a first light emitting element LE1 emitting first light. A first light emitting area EA1 may output the first light emitted from the first light emitting element LE1 as it is. The first light may be light in a red wavelength band. For example, a main peak wavelength R-peak of the first light may be in a range of about 600 to 750 nm as illustrated in FIG. 3C. However, embodiments of the present disclosure are not limited thereto, and the first light emitting area EA1 may also emit the second light or the third light. As will be described later, because light in the red wavelength band has relatively low luminous efficiency, a relatively large red light emitting area or a relatively large red light emitting element may be provided to lower current density.

The blue light emitting area EA_B may include a second light emitting element LE2 emitting second light. A second light emitting area EA2 may output the second light emitted from the second light emitting element LE2 as it is. The second light may be light in a blue wavelength band. For example, a main peak wavelength B-peak of the second light may be in a range of about 370 to 460 nm as illustrated in FIG. 3A. However, embodiments of the present disclosure are not limited thereto, and the second light emitting area EA2 may also emit the first light or the third light.

Each of the first and second green light emitting areas EA_G1 and EA_G2 may include a third light emitting element LE3 emitting third light. A third light emitting area EA3 may output the third light emitted from the third light emitting element LE3 as it is. The third light may be light in a green wavelength band. For example, a main peak wavelength G-peak of the third light may be in a range of about 480 to 560 nm as illustrated in FIG. 3B. However, embodiments of the present disclosure are not limited thereto.

For another example, the second green light emitting area EA_G2 may emit fourth light. The fourth light may be light in a yellow wavelength band. For example, a main peak wavelength of the fourth light may be in a range of about 550 to 600 nm. However, embodiments of the present disclosure are not limited thereto.

The non-display area NDA of the display panel 10 may include a first common voltage supply area CVA1, a second common voltage supply area CVA2, a first pad area PDA1, and a second pad area PDA2.

The first common voltage supply area CVA1 may be disposed (or arranged) between the first pad area PDA1 and the display area DA. The second common voltage supply area CVA2 may be disposed between the second pad area PDA2 and the display area DA. Each of the first common voltage supply area CVA1 and the second common voltage supply area CVA2 may include a plurality of common voltage supply units CVS connected to a common electrode CE (e.g., to the same common electrode CE). A common voltage may be supplied to the common electrode CE through the common voltage supply units CVS.

The common voltage supply units CVS of the first common voltage supply area CVA1 may be electrically connected to any one of first pads PD1 of the first pad area PDA1. For example, the common voltage supply units CVS of the first common voltage supply area CVA1 may receive the common voltage from any one of the first pads PD1 of the first pad area PDA1.

The common voltage supply units CVS of the second common voltage supply area CVA2 may be electrically connected to any one of second pads of the second pad area PDA2. For example, the common voltage supply units CVS of the second common voltage supply area CVA2 may receive the common voltage from any one of the second pads PD2 of the second pad area PDA2.

The first pad area PDA1 may be disposed on an upper side of the display panel 10. The first pad area PDA1 may include the first pads PD1 connected to an external circuit board.

The second pad area PDA2 may be disposed on a lower side of the display panel 10. The second pad area PDA2 may include the second pads for connection to an external circuit board. In some embodiments, the second pad area PDA2 may be omitted.

Figure 4:
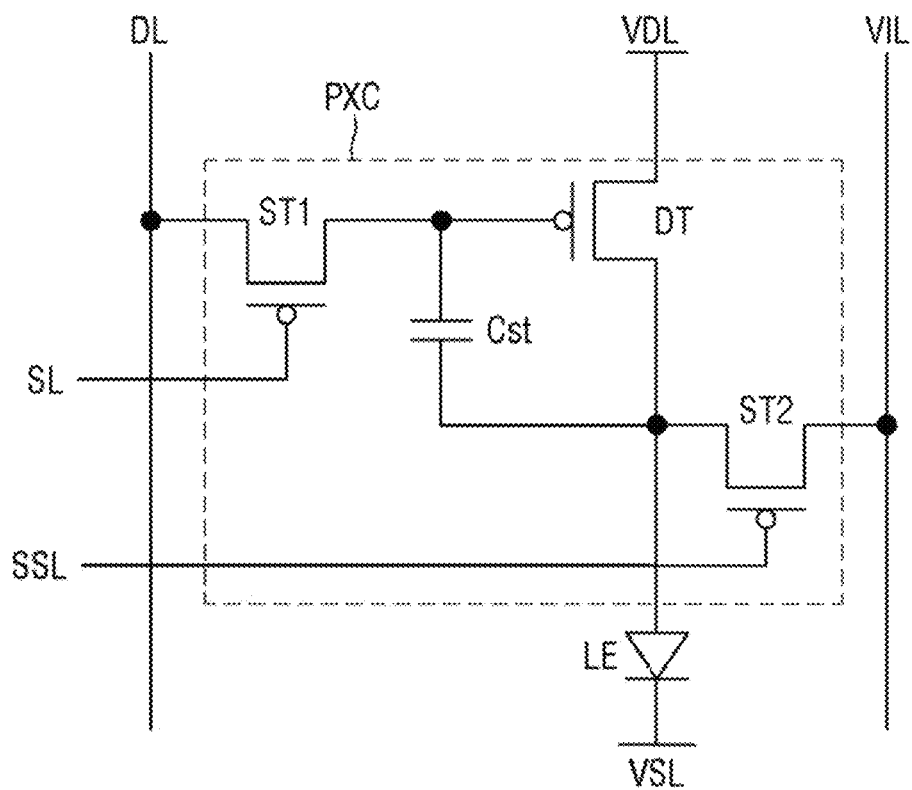
FIG. 4 is a pixel circuit diagram of the display device according to an embodiment.

FIG. 4 is a pixel circuit diagram of the display device 1 according to an embodiment.

Referring to FIG. 4, each of the pixels PX may include a light emitting element LE and a pixel circuit unit PXC for controlling the amount of light emitted from the light emitting element LE.

The light emitting element LE emits light according to a driving current Ids. The amount of light emitted from the light emitting element LE may be proportional to the driving current Ids. The light emitting element LE may be an inorganic light emitting element including an anode, a cathode, and an inorganic semiconductor disposed between the anode and the cathode. For example, the light emitting element LE may be a micro light emitting diode.

The anode of the light emitting element LE may be connected to a source electrode of a driving transistor DT, and the cathode may be connected to a second power line VSL to which a low-potential voltage, which is lower than a high-potential voltage, is supplied. In the circuit diagram shown in FIG. 4, an embodiment in which the anode of the light emitting element LE is a pixel electrode 111 (see, e.g., FIG. 7) and the cathode is the common electrode CE (see, e.g., FIG. 7) is illustrated as an example.

The driving transistor DT adjusts a current flowing from a first power line VDL, to which a first power supply voltage is supplied, to the light emitting element LE according to a voltage difference between a gate electrode and the source electrode.

The driving transistor DT may have the gate electrode connected to a first electrode of a first transistor ST1, the source electrode connected to the anode of the light emitting element LE, and a drain electrode connected to the first power line VDL to which a high-potential voltage is applied.

The first transistor ST1 is turned on by a scan signal of a scan line SL to connect a data line DL to the gate electrode of the driving transistor DT. The first transistor ST1 may have a gate electrode connected to the scan line SL, the first electrode connected to the gate electrode of the driving transistor DT, and a second electrode connected to the data line DL.

A second transistor ST2 is turned on by a sensing signal of a sensing signal line SSL to connect an initialization voltage line VIL to the source electrode of the driving transistor DT. The second transistor ST2 may have a gate electrode connected to the sensing signal line SSL, a first electrode connected to the initialization voltage line VIL, and a second electrode connected to the source electrode of the driving transistor DT.

The first electrode of each of the first and second transistors ST1 and ST2 may be a source electrode, and the second electrode may be a drain electrode. However, it should be noted that embodiments of the present disclosure are not limited thereto. For example, the first electrode of each of the first and second transistors ST1 and ST2 may be a drain electrode, and the second electrode may be a source electrode.

A capacitor Cst is formed between the gate electrode and the source electrode of the driving transistor DT. The capacitor Cst stores a voltage difference between a gate voltage and a source voltage of the driving transistor DT.

However, this is merely an example, and the pixel circuit unit PXC may also be structured to further include a plurality of transistors.

In addition, although an embodiment in which the driving transistor DT and the first and second transistors ST1 and ST2 are n-channel metal oxide semiconductor (NMOS) transistors is illustrated in FIG. 4 as an example, some or all of the transistors may be provided as p-channel metal oxide semiconductor (PMOS) transistors.

Figure 5:
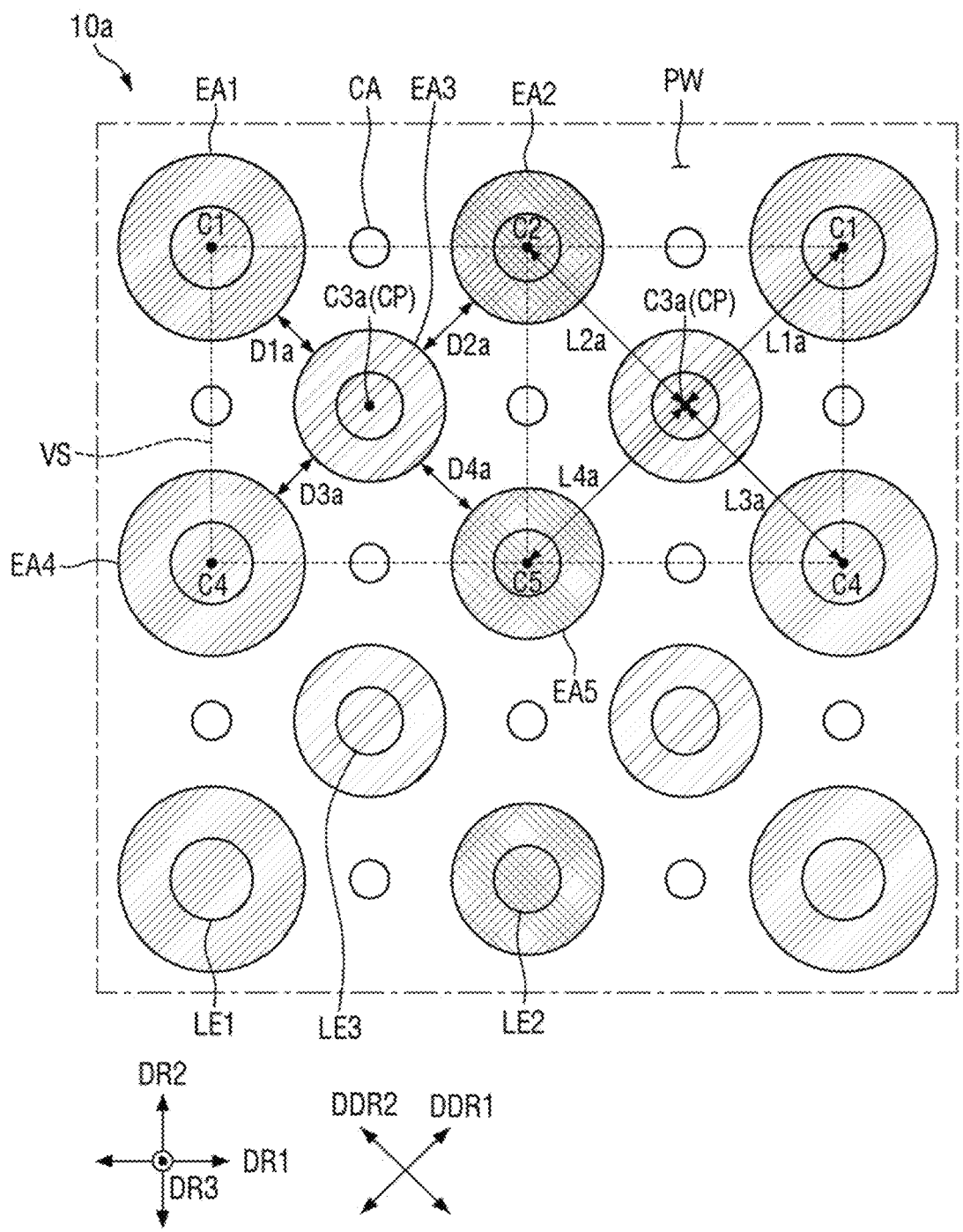
FIG. 5 is a plan layout view of pixels of a display panel according to an embodiment.

FIG. 5 is a plan layout view of pixels of a display panel 10a according to an embodiment.

Referring to FIG. 5, each of a plurality of pixels PX of the display panel 10a may include four light emitting areas EA and common connection areas CA. In the present disclosure, a red light emitting area EA_R is referred to as a first light emitting area EA1 or a fourth light emitting area EA4, a blue light emitting area EA_B is referred to as a second light emitting area EA2 or a fifth light emitting area EA5, and first and second green light emitting areas EA_G1 and EA_G2 are referred to as third light emitting areas EA3.

Each of the pixels PX may include the first light emitting area EA1, the second light emitting area EA2, and two neighboring third light emitting areas EA3.

The first light emitting area EA1 and the fourth light emitting area EA4 may be areas emitting light in the red wavelength band, that is, the first light. Each of the first light emitting area EA1 and the fourth light emitting area EA4 may include a first light emitting element LE1.

The second light emitting area EA2 and the fifth light emitting area EA5 may be areas emitting light in the blue wavelength band, that is, the second light. Each of the second light emitting area EA2 and the fifth light emitting area EA5 may include a second light emitting element LE2.

The third light emitting area EA3 may be an area emitting light in the green wavelength band, that is, the third light. The third light emitting area EA3 may include a third light emitting element LE3.

Each of the light emitting areas EA1 through EA5 may be defined by a partition wall PW. The partition wall PW may surround (e.g., may surround in a plan view or may extend around a periphery of) each of the light emitting elements LE1 through LE3. The partition wall PW may be spaced apart from the light emitting elements LE1 through LE3. The partition wall PW may have a mesh shape, a net shape, or a lattice shape in a plan view.

Although each of the light emitting areas EA1 through EA5 defined by the partition wall PW has a circular planar shape in FIG. 5, embodiments of the present disclosure are not limited thereto. For example, each of the light emitting areas EA1 through EA5 defined by the partition wall PW may also have a polygonal shape, such as a triangle, a quadrangle, a pentagon, a hexagon, or an octagon, an oval shape, or an irregular shape in a plan view.

The arrangement relationship between the light emitting areas EA1 through EA5 and the light emitting elements LE1 through LE3 will now be described.

In an embodiment, the first light emitting area EA1 and the second light emitting area EA2 may be alternately arranged along the first direction DR1 to form a first row, and the third light emitting areas EA3 may be repeatedly arranged along the first direction DR1 in a second row adjacent to the first row. The third light emitting areas EA3 belonging to the second row may be staggered in the first direction DR1 with respect to the first and second light emitting areas EA1 and EA2 belonging to the first row. The number of the third light emitting areas EA3 in the second row may be twice the number of the first light emitting areas EA1 or the second light emitting areas EA2 in the first row.

The fourth light emitting area EA4 and the fifth light emitting area EA5 may be alternately arranged along the first direction DR1 in a third row adjacent to the second row. The fourth light emitting area EA4 and the fifth light emitting area EA5 in the third row may be substantially the same as the first light emitting area EA1 and the second light emitting area EA2 in the first row.

For example, the first light emitting area EA1 and the second light emitting area EA2 may be arranged in the first direction DR1, and the fourth light emitting area EA4 and the fifth light emitting area EA5 may be arranged in the first direction DR1. The second light emitting area EA2, the third light emitting area EA3, and the fourth light emitting area EA4 may be arranged (e.g., sequentially arranged) in a first diagonal direction DDR1, and the first light emitting area EA1, the third light emitting area EA3, and the fifth light emitting area EA5 may be arranged (e.g., sequentially arranged) in a second diagonal direction DDR2. The first diagonal direction DDR1 may be a direction obliquely inclined between the first direction DR1 and the second direction DR2, and the second diagonal direction DDR2 may be a direction orthogonal to the first diagonal direction DDR1. For example, the first diagonal direction DDR1 may be a direction inclined 45 degrees to the first direction DR1 and the second direction DR2, but embodiments of the present disclosure are not limited thereto.

The arrangement relationship between the light emitting elements LE1 through LE3 respectively disposed in the light emitting areas may be the same as the arrangement relationship between the light emitting areas. For example, the first light emitting element LE1 and the second light emitting element LE2 may be alternately arranged along the first direction DR1 to form a first row, and the third light emitting elements LE3 may be repeatedly arranged along the first direction DR1 in a second row adjacent to the first row. The third light emitting elements LE3 in the second row may be staggered in the first direction DR1 with respect to the first and second light emitting elements LE1 and LE2 in the first row. The first light emitting element LE1 and the second light emitting element LE2 may be alternately arranged again along the first direction DR1 in a third row adjacent to the second row.

Similarly, the first light emitting area EA1 and the fourth light emitting area EA4 may be alternately arranged along the second direction DR2 to form a first column, and the third light emitting areas EA3 may be repeatedly arranged along the second direction DR2 in a second column adjacent to the first column. The third light emitting areas EA3 in the second column may be staggered in the second direction DR2 with respect to the first and fourth light emitting areas EA1 and EA4 in the first column. The number of the third light emitting areas EA3 in the second column may be twice the number of the first light emitting areas EA1 or the fourth light emitting areas EA4 in the first column. The second light emitting area EA2 and the fifth light emitting area EA5 may be alternately arranged along the second direction DR2 in a third column adjacent to the second column. The second light emitting area EA2 and the fifth light emitting area EA5 in the third column may be staggered in the second direction DR2 with respect to the third light emitting areas EA3 in the second column.

In the display panel 10a according to an embodiment of the present disclosure, the first light emitting element LE1 emitting the first light is repeatedly arranged in the first column, and the second light emitting element LE2 emitting the second light is repeatedly arranged in the third column. However, embodiments of the present disclosure are not limited thereto. For example, the first light emitting element LE1 and the second light emitting element LE2 may be alternately arranged in the first column, and the first light emitting element LE1 and the second light emitting element LE2 may be alternately arranged in the third column.

The area (e.g., the size or surface area) of each light emitting area may be different. For example, the area of the first light emitting area EA1, the area of the second light emitting area EA2, and the area of the third light emitting area EA3 may be different. The area of the first light emitting area EA1 may be the same as the area of the fourth light emitting area EA4, and the area of the second light emitting area EA2 may be the same as the area of the fifth light emitting area EA5. For example, the areas of the first light emitting area EA1 and the fourth light emitting area EA4 may be larger than the areas of the second light emitting area EA2, the third light emitting area EA3, and the fifth light emitting area EA5.

To increase the luminous efficiency of the first light, which is light in the red wavelength band, the areas of the first light emitting area EA1 and the fourth light emitting area EA4 may be increased to increase the luminous efficiency of red light. Because the current density decreases as the area of a light emitting area increases, the luminous efficiency increases.

A common connection electrode 113 (see, e.g., FIG. 7) may be disposed in a common connection area CA. The common connection area CA may be an area in which the common connection electrode 113 and a common electrode CE are connected to each other. The common connection electrode 113 may be electrically connected to a second power line VSL of a pixel circuit unit PXC in the common connection area CA. For example, the common connection electrode 113 may receive a common voltage through the common connection area CA.

The common connection area CA may be disposed on a side or the other side of each of the light emitting areas EA1 through EA5 in a direction. The direction may be the first direction DR1 or the second direction DR2.

A plurality of common connection areas CA may include a first common connection area CA1 (see, e.g., FIG. 6A) disposed between the first light emitting area EA1 and the second light emitting area EA2, a second common connection area CA2 disposed between the first light emitting area EA1 and the fourth light emitting area EA4, a third common connection area CA3 disposed between the second light emitting area EA2 and the fifth light emitting area EA5, and a fourth common connection area CA4 disposed between the fourth light emitting area EA4 and the fifth light emitting area EA5.

In the first row, the first light emitting area EA1, the first common connection area CA1, and the second light emitting area EA2 may be alternately arranged. In the second row, the second common connection area CA2, the third light emitting area EA3, and the third common connection area CA3 may be alternately arranged. In the third row, the fourth light emitting area EA4, the fourth common connection area CA4, and the fifth light emitting area EA5 may be alternately arranged.

The common connection areas CA may be arranged in a diamond shape having a virtual center point CP of a virtual quadrangle VS as its center. The common connection areas CA may face each other with respect to the virtual center point CP of the virtual quadrangle VS.

For example, the first common connection area CA1 may face the fourth common connection area CA4 with respect to the virtual center point CP of the virtual quadrangle VS, and the second common connection area CA2 may face the third common connection area CA3 with respect to the virtual center point CP of the virtual quadrangle VS. The first common connection area CA1, the second common connection area CA2, the third common connection area CA3, and the fourth common connection area CA4 may be arranged in a diamond shape.

A distance between the first common connection area CA1 and a center point C1 of an adjacent first light emitting area EA1 may be the same as a distance between the first common connection area CA1 and a center point C2 of an adjacent second light emitting area EA2 and a distance between the first common connection area CA1 and a center point C3a of an adjacent third light emitting area EA3.

However, a minimum distance between the first common connection area CA1 and the first light emitting area EA1 may be smaller than a minimum distance between the first common connection area CA1 and the adjacent second light emitting area EA2.

In addition, a minimum distance between the second common connection area CA2 and the third light emitting area EA3 may be the same as a minimum distance between the third common connection area CA3 and the third light emitting area EA3.

Although a common connection area CA is disposed on a side or the other side of each of the light emitting areas EA1 through EA5 in one direction in the present disclosure, embodiments of the present disclosure are not limited thereto. Similar to the second common connection area CA2 and the third common connection area CA3, the common connection area CA may be alternately arranged only with the third light emitting area EA3 in the second row. The arrangement of the common connection areas CA is not limited thereto.

Because the light emitting areas EA include the light emitting elements LE emitting different light or the same light, the common connection electrode 113 of the common connection area CA may be disposed between the first light emitting element LE1 and the second light emitting element LE2, and the third light emitting element LE3 and the common connection electrode 113 of the common connection area CA may be alternately arranged.

The area of each of the light emitting areas EA1 through EA5 partitioned by the partition wall PW may be larger than the area of each of the light emitting elements LE1 through LE3.

Distances between the light emitting areas and the light emitting elements will now be described.

Referring to FIG. 5, the first light emitting area EA1 of the display panel 10a may include the center point C1, the second light emitting area EA2 may include the center point C2, the third light emitting area EA3 may include the center point C3a, the fourth light emitting area EA4 may include a center point C4, and the fifth light emitting area EA5 may include a center point C5.

The virtual quadrangle VS may be formed by extending (or by connecting) the center point C1 of the first light emitting area EA1, the center point C2 of the second light emitting area EA2, the center point C4 of the fourth light emitting area EA4, and the center point C5 of the fifth light emitting area EA5. For example, vertices of the virtual quadrangle VS may be the center points C1, C2, C4, and C5 of the first, second, fourth, and fifth light emitting areas EA1, EA2, EA4, and EA5, and the virtual quadrangle VS may be a virtual quadrangle formed by connecting the center points C1, C2, C4, and C5. The virtual quadrangle VS may be variously modified to a rectangle, a rhombus, a square, or the like.

An intersection point of two straight lines connecting facing vertices of the virtual quadrangle VS is defined as the virtual center point CP. The center point C1 of the first light emitting area EA1 and the center point C5 of the fifth light emitting area EA5 face each other with respect to the virtual center point CP, and the center point C2 of the second light emitting area EA2 and the center point C4 of the fourth light emitting area EA4 may face each other with respect to the virtual center point CP.

In the display panel 10a according to an embodiment, the center point C3a of the third light emitting area EA3 may overlap (or may be at or coincident with) the virtual center point CP of the virtual quadrangle VS.

In such an embodiment, when a distance between the center point C1 of the first light emitting area EA1 and the center point C3a of the third light emitting area EA3 is defined as a first center distance L1a and a distance between the center point C2 of the second light emitting area EA2 and the center point C3a of the third light emitting area EA3 is defined as a second center distance L2a, the first center distance L1a may be the same as the second center distance L2a.

Similarly, when a distance between the center point C4 of the fourth light emitting area EA4 and the center point C3a of the third light emitting area EA3 is defined as a third center distance L3a and a distance between the center point C5 of the fifth light emitting area EA5 and the center point C3a of the third light emitting area EA3 is defined as a fourth center distance L4a, the third center distance L3a may be the same as the fourth center distance L4a.

Thus, the first center distance L1a, the second center distance L2a, the third center distance L3a, and the fourth center distance L4a may be the same.

The center point C1 of the first light emitting area EA1 may coincide with a center point of the first light emitting element LE1, the center point C2 of the second light emitting area EA2 may coincide with a center point of the second light emitting element LE2, and the center point C3a of the third light emitting area EA3 may coincide with a center point of the third light emitting element LE3. Accordingly, the first center distance L1a may be a distance between the center point of the first light emitting element LE1 and the center point of the third light emitting element LE3, and the second center distance L2a may be a distance between the center point of the second light emitting element LE2 and the center point of the third light emitting element LE3.

Minimum distances between the light emitting areas EA1 through EA5 including the first through third light emitting elements LE1 through LE3 emitting different light may be different from each other.

A minimum distance between the first light emitting area EA1 and the third light emitting area EA3 may be defined as a first distance D1a, and a minimum distance between the second light emitting area EA2 and the third light emitting area EA3 may be defined as a second distance D2a. In this case, the first distance D1a may be smaller than the second distance D2a.

Similarly, a minimum distance between the fourth light emitting area EA4 and the third light emitting area EA3 may be defined as a third distance D3a, and a minimum distance between the fifth light emitting area EA5 and the third light emitting area EA3 may be defined as a fourth distance D4a. In this case, the third distance D3a may be smaller than the fourth distance D4a.

The common connection areas CA adjacent to or overlapping the virtual quadrangle VS may be spaced apart from the virtual center point CP of the virtual quadrangle VS by the same distance.

Because a display device 1 including the display panel 10a according to an embodiment can express colors by sharing adjacent pixels, high resolution can be realized with a small number of pixels.

Figure 6A:
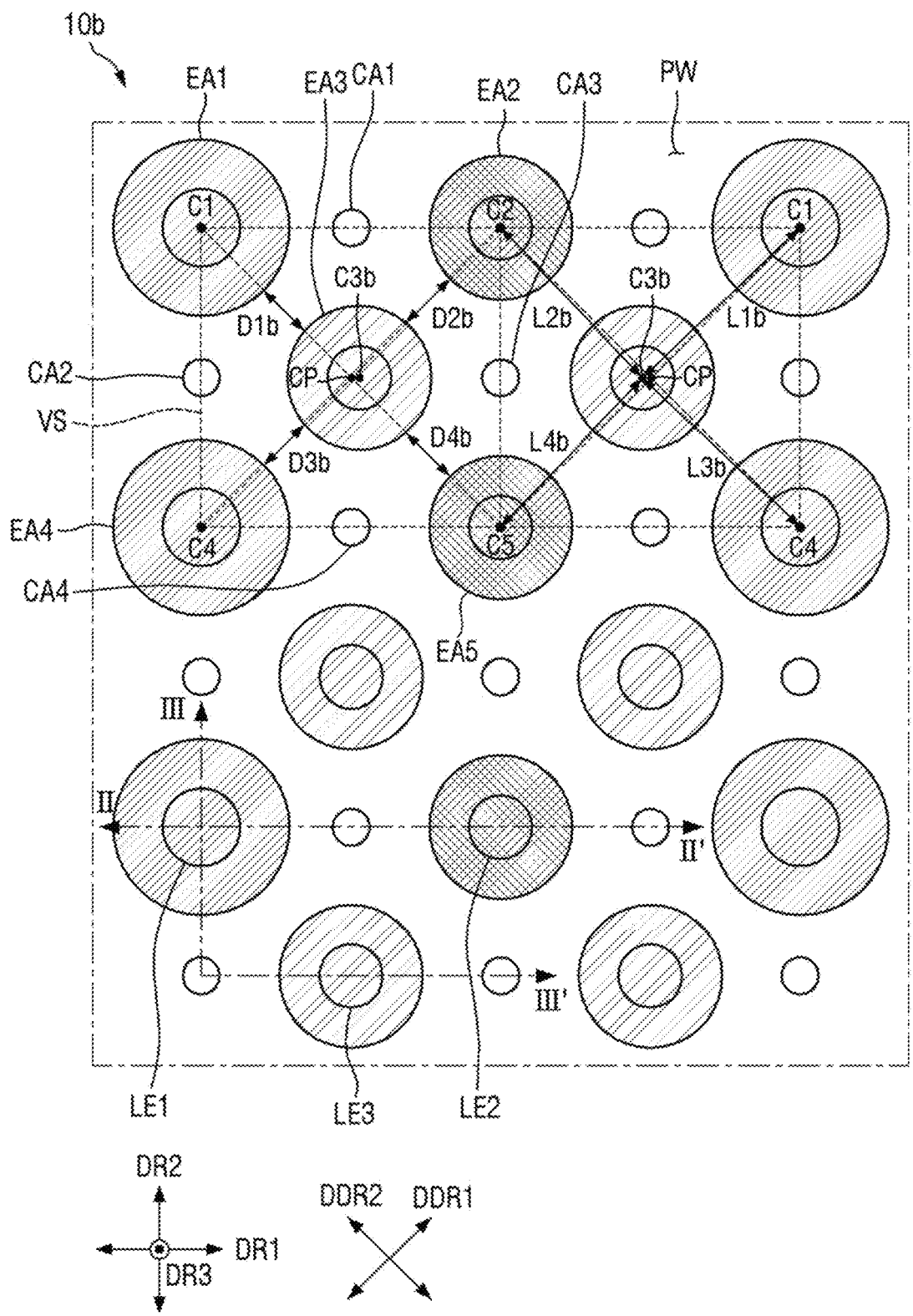
FIG. 6A is a plan layout view of pixels of a display panel according to an embodiment.

FIG. 6A is a plan layout view of pixels of a display panel 10b according to an embodiment.

Referring to FIG. 6A, the display panel 10b according to the illustrated embodiment is different from the embodiment shown in FIG. 5 in that a third light emitting area EA3 and a center point C3b of the third light emitting area EA3 are spaced apart from a virtual center point CP of a virtual quadrangle VS without overlapping the virtual center point CP. Other redundant descriptions already provided in connection with FIG. 5 will be omitted.

The center point C3b of the third light emitting area EA3 may be relatively far from a center point C1 of a first light emitting area EA1 and a center point C4 of a fourth light emitting area EA4 and may be relatively close to a center point C2 of a second light emitting area EA2 and a center point C5 of a fifth light emitting area EA5.

A distance between the center point C1 of the first light emitting area EA1 and the center point C3b of the third light emitting area EA3 may be defined as a first center distance L1b, and a distance between the center point C2 of the second light emitting area EA2 and the center point C3b of the third light emitting area EA3 may be defined as a second center distance L2b. In this case, the first center distance L1b may be smaller than the second center distance L2b.

Similarly, a distance between the center point C4 of the fourth light emitting area EA4 and the center point C3b of the third light emitting area EA3 may be defined as a third center distance L3b, and a distance between the center point C5 of the fifth light emitting area EA5 and the center point C3b of the third light emitting area EA3 may be defined as a fourth center distance L4b. In this case, the third center distance L3b may be smaller than the fourth center distance L4b.

The first center distance L1b may be the same as the third center distance L3b, and the second center distance L2b may be the same as the fourth center distance L4b.

Because the third light emitting area EA3 is disposed closer to the second light emitting area EA2 and the fifth light emitting area EA5 than to the first light emitting area EA1 and the fourth light emitting area EA4, a first distance D1b, a second distance D2b, a third distance D3b, and a fourth distance D4b may be the same even if the first light emitting area EA1 and the fourth light emitting area EA4 are large.

A plurality of common connection areas CA may include a first common connection area CA1 disposed between the first light emitting area EA1 and the second light emitting area EA2, a second common connection area CA2 disposed between the first light emitting area EA1 and the fourth light emitting area EA4, a third common connection area CA3 disposed between the second light emitting area EA2 and the fifth light emitting area EA5, and a fourth common connection area CA4 disposed between the fourth light emitting area EA4 and the fifth light emitting area EA5 as described above.

A distance between the first common connection area CA1 and the center point C1 of an adjacent first light emitting area EA1 is the same as a distance between the first common connection area CA1 and the center point C2 of an adjacent second light emitting area EA2. However, the distance between the first common connection area CA1 and the center point C1 of the adjacent first light emitting area EA1 may be smaller than a distance between the first common connection area CA1 and the center point C3b of an adjacent third light emitting area EA3.

A minimum distance between the first common connection area CA1 and the first light emitting area EA1 may be smaller than a minimum distance between the first common connection area CA1 and the adjacent second light emitting area EA2.

A minimum distance between the second common connection area CA2 and the third light emitting area EA3 may be greater than a minimum distance between the third common connection area CA3 and the third light emitting area EA3. Because a display device 1 including the display panel 10b according to an embodiment can express colors by sharing adjacent pixels, high resolution can be realized with a small number of pixels.

In addition, while the areas of the light emitting areas EA1 through EA5 including first through third light emitting elements LE1 through LE3 emitting different light are different from each other, the minimum distances (e.g., D1b, D2b, D3b, and D4b) between the light emitting areas may be formed to be the same. Therefore, a display device having high luminous efficiency can be realized.

Figure 6B:
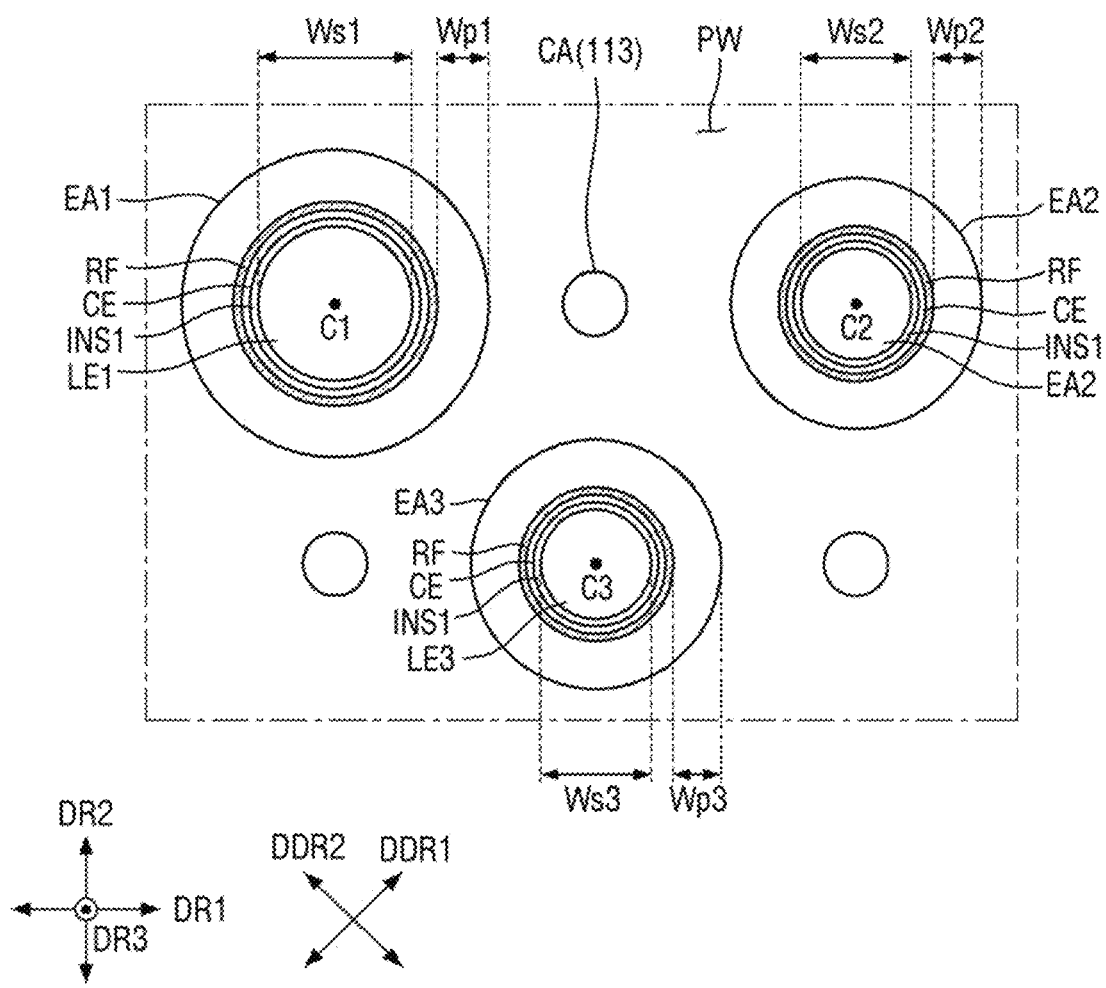
FIG. 6B is an enlarged plan layout view of a portion of FIG. 6A.
Figure 7:
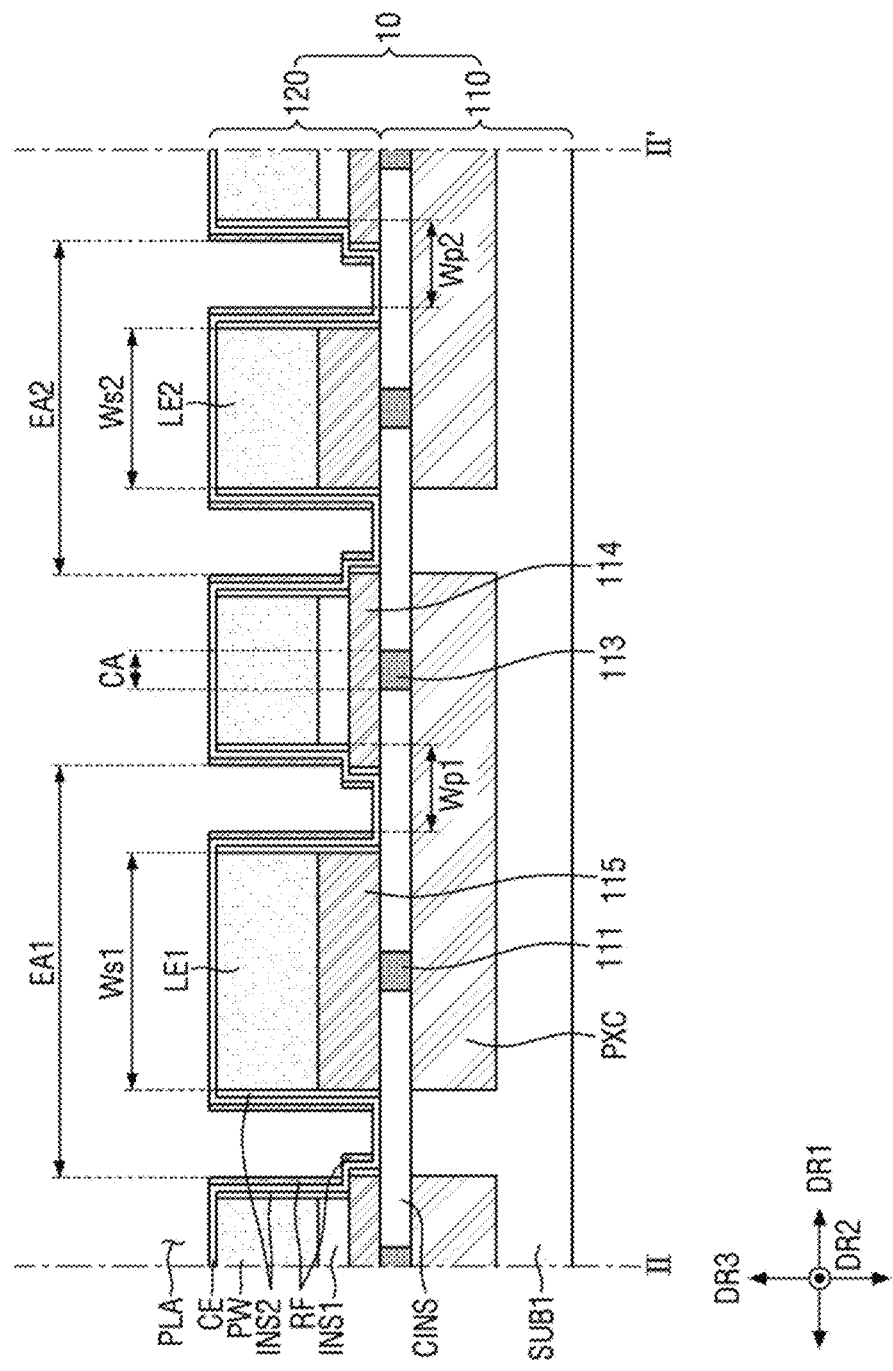
FIG. 7 is a cross-sectional view of an example of the display panel taken along the line II-II' of FIG. 6A.
Figure 8:
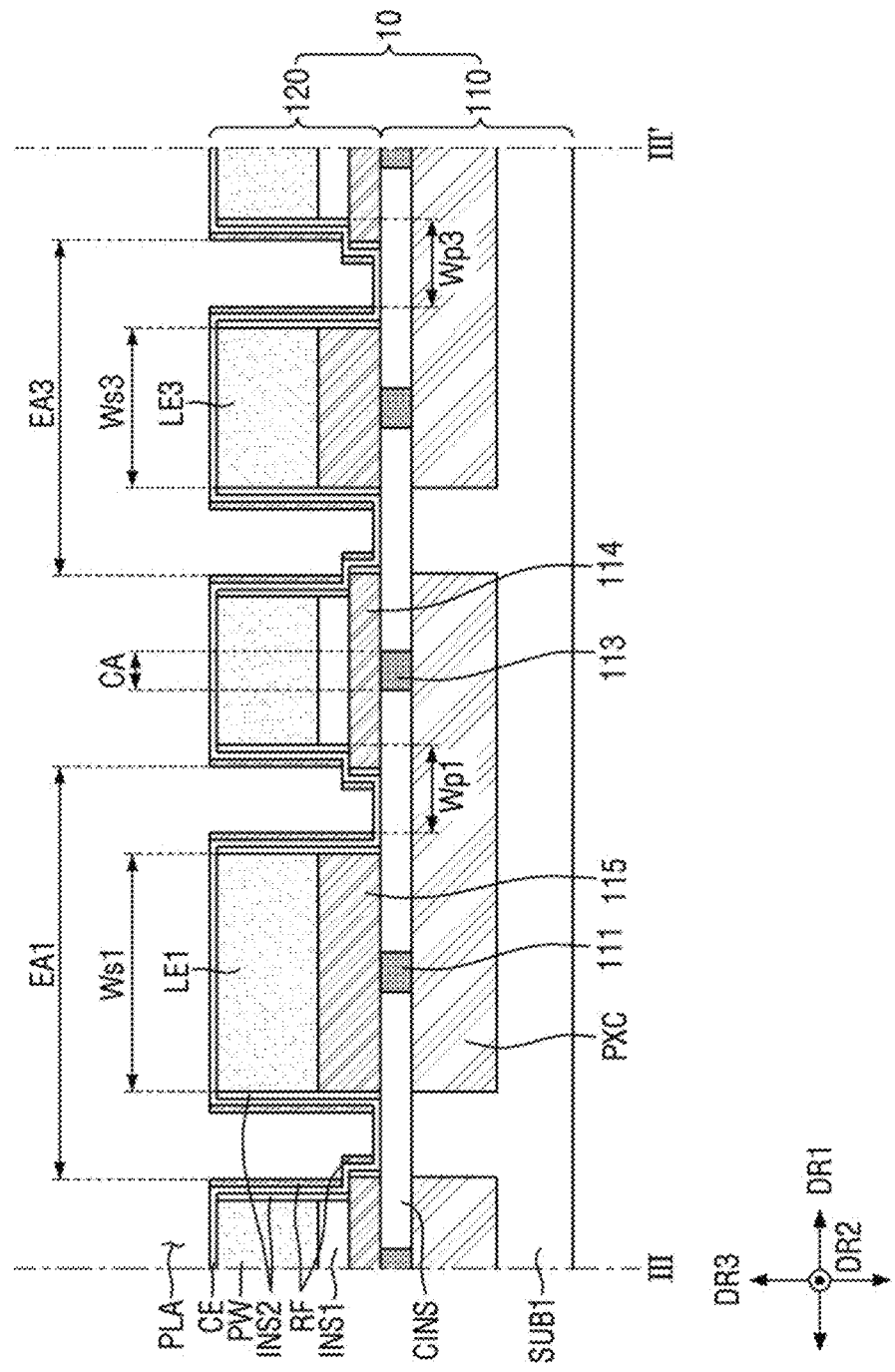
FIG. 8 is a cross-sectional view of an example of the display panel taken along the line III-III' of FIG. 6A.
Figure 9:
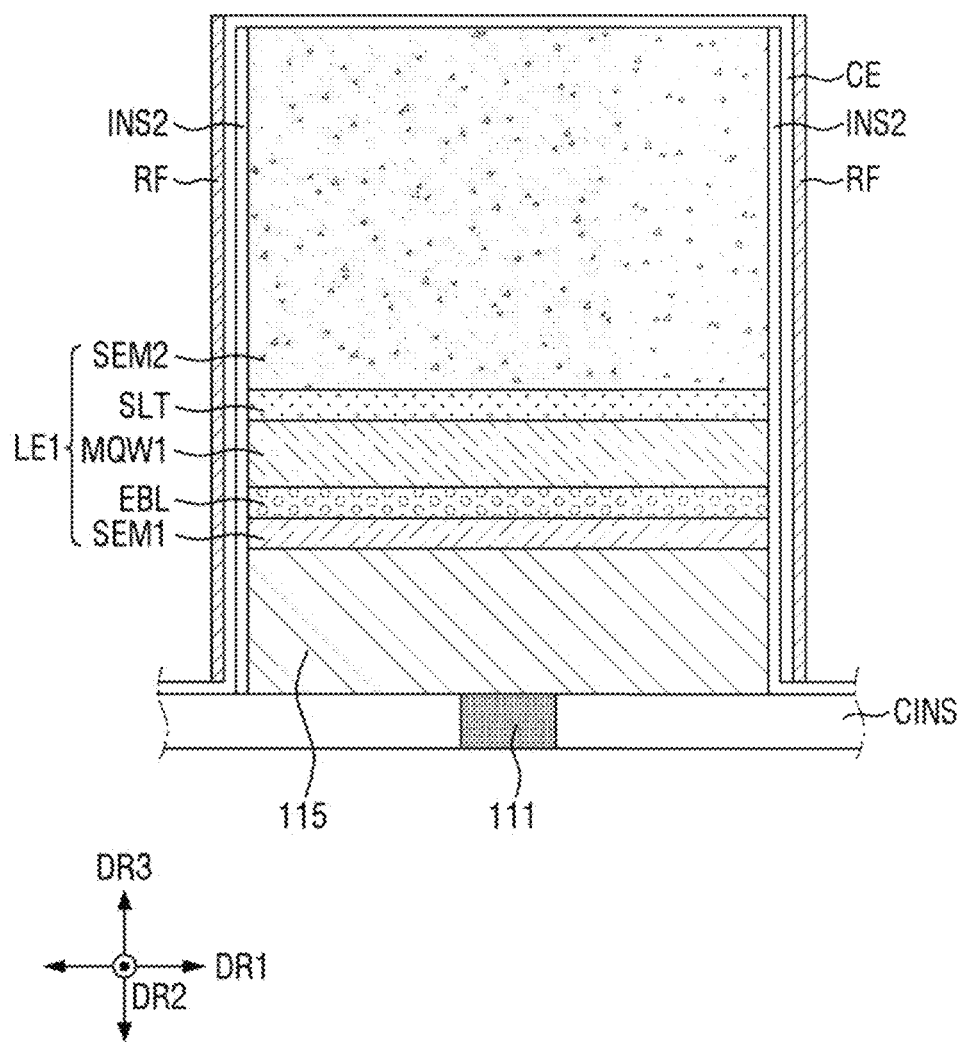
FIG. 9 is an enlarged cross-sectional view of a light emitting element according to an embodiment.
Figure 10:
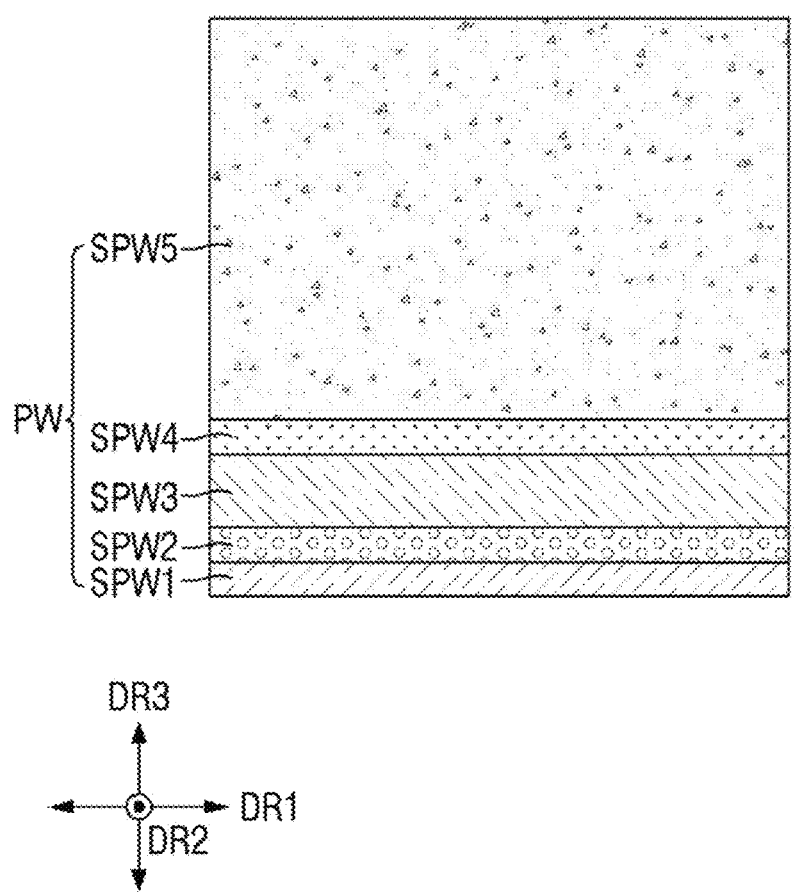
FIG. 10 is an enlarged cross-sectional view of a partition wall according to an embodiment.

FIG. 6B is an enlarged plan layout view of a portion of FIG. 6A. FIG. 7 is a cross-sectional view of an example of the display panel 10b taken along the line II-II' of FIG. 6A. FIG. 8 is a cross-sectional view of an example of the display panel 10b taken along the line III-III' of FIG. 6A. FIG. 9 is an enlarged cross-sectional view of a light emitting element according to an embodiment. FIG. 10 is an enlarged cross-sectional view of a partition wall PW according to an embodiment.

Referring to FIGS. 7 and 8, a display panel 10 may include a semiconductor circuit board 110 and a light emitting element layer 120.

The semiconductor circuit board 110 may include a first substrate SUB1, a plurality of pixel circuit units PXC, pixel electrodes 111, and common connection electrodes 113.

The first substrate SUB1 may be a silicon wafer substrate. The first substrate SUB1 may be made of monocrystalline silicon.

Each of the pixel circuit units PXC may be disposed in the first substrate SUB1. Each of the pixel circuit units PXC may include a complementary metal oxide semiconductor (CMOS) circuit formed using a semiconductor process. Each of the pixel circuit units PXC may include at least one transistor formed using a semiconductor process. In addition, each of the pixel circuit units PXC may further include at least one capacitor formed using a semiconductor process.

The pixel circuit units PXC may be disposed in a display area DA. Each of the pixel circuit units PXC may be connected to a corresponding pixel electrode 111.

For example, the pixel circuit units PXC and the pixel electrodes 111 may be connected one-to-one to each other. Each of the pixel circuit units PXC may apply a pixel voltage or an anode voltage to the pixel electrode 111.

In addition, the pixel circuit units PXC may be connected to the common connection electrodes 113, respectively. Each of the common connection electrodes 113 may be electrically connected to a second power line VSL (see FIG. 4). Each of the pixel circuit units PXC may be connected to a corresponding common connection electrode 113. However, embodiments of the present disclosure are not limited thereto, and the pixel circuit units PXC may also be simultaneously connected to one common connection electrode 113. Each of the pixel circuit units PXC may apply a common voltage received from the second power line VSL to the common connection electrode 113.

Each of the pixel electrodes 111 may be disposed on a corresponding pixel circuit unit PXC. Accordingly, light emitting elements LE can be individually driven. Each of the pixel electrodes 111 may be an exposed electrode exposed from the pixel circuit unit PXC. For example, each of the pixel electrodes 111 may protrude from an upper surface of the pixel circuit unit PXC. Each of the pixel electrodes 111 may be integrally formed with the pixel circuit unit PXC. Each of the pixel electrodes 111 may receive the pixel voltage (or the anode voltage) from the pixel circuit unit PXC. The pixel electrodes 111 may include aluminum (Al).

Each of the common connection electrodes 113 may be spaced apart from the pixel electrodes 111. Each of the common connection electrodes 113 may be an exposed electrode exposed from a pixel circuit unit PXC. For example, each of the common connection electrodes 113 may protrude from the upper surface of the pixel circuit unit PXC. The common connection electrodes 113 may include aluminum (Al).

Each of the common connection electrodes 113 may be disposed on the pixel circuit unit PXC to receive the common voltage from the second power line VSL. Accordingly, each of the common connection electrodes 113 may electrically connect the second power line VSL of the pixel circuit unit PXC to a common electrode CE of the light emitting element layer 120.

For example, the second power line VSL of the pixel circuit unit PXC may be disposed under each of the common connection electrodes 113 so that each of the common connection electrodes 113 is electrically connected to the second power line VSL. Accordingly, each of the common connection electrodes 113 may electrically connect the second power line VSL of the pixel circuit unit PXC to the common electrode CE of the light emitting element layer 120.

Each of the common connection electrodes 113 may be disposed between the partition wall PW and the first substrate SUB1. According to an embodiment, each of the common connection electrodes 113 may overlap the partition wall PW in the third direction DR3 in a common connection area CA. Each of the common connection electrodes 113 may be electrically connected to the common electrode CE of the light emitting element layer 120 through a first connection electrode 114 and the partition wall PW. For example, the common voltage of the pixel circuit unit PXC may be provided to the common electrode CE.

In each common connection area CA, the second power line VSL of the pixel circuit unit PXC may be electrically connected to the common electrode CE through the common connection electrode 113, the first connection electrode 114, and the partition wall PW. Accordingly, the common voltage provided to the common electrode CE through the common connection electrode 113 may be provided to a light emitting element LE.

The pixel electrodes 111 and the common connection electrodes 113 may be planarized by a connection insulating layer CINS. The connection insulating layer CINS may be made of an inorganic layer, such as a silicon oxide layer ($SiO_2$), an aluminum oxide layer ($Al_2O_3$), or a hafnium oxide layer ($HfO_x$).

The light emitting element layer 120 may include a plurality of light emitting areas EA1 through EA3 to emit light. The light emitting element layer 120 may include the first connection electrodes 114, second connection electrodes 115, a plurality of light emitting elements LE1 through LE3, a first insulating layer INS1, the partition wall PW, a second insulating layer INS2, the common electrode CE, and a reflective layer RF.

Each of the first connection electrodes 114 may be disposed on the connection insulating layer CINS and a corresponding common connection electrode 113. For example, the first connection electrodes 114 may be connected one-to-one to the common connection electrodes 113 and may electrically connect the common connection electrodes 113 and the partition wall PW. The first connection electrodes 114 may overlap the partition wall PW in the third direction DR3, and at least a part of an upper surface of each of the first connection electrodes 114 may be exposed without being covered by the partition wall PW.

Each of the first connection electrodes 114 may include a part protruding in the horizontal direction, but embodiments of the present disclosure are not limited thereto. When each of the first connection electrodes 114 includes a protruding part, a horizontal width of each of the first connection electrodes 114 may be greater than a horizontal width of the partition wall PW. For example, the horizontal width may be a width in the first direction DR1 or a width in the second direction DR2.

The common electrode CE may be connected to each of the first connection electrodes 114 at the horizontally protruding part of the first connection electrode 114. Therefore, when the first connection electrodes 114 do not provide the common voltage to the light emitting elements LE, they do not need to include the horizontally protruding part. In this case, the horizontal width of each of the first connection electrodes 114 may be substantially the same as the horizontal width of the partition wall PW. Each of the second connection electrodes 115 may be disposed on the connection insulating layer CINS and a corresponding pixel electrode 111. For example, the second connection electrodes 115 may be connected one-to-one to the pixel electrodes 111 and may electrically connect the pixel electrodes 111 and the light emitting elements LE.

Each of the first connection electrodes 114 may act as a bonding metal for bonding the common connection electrodes 113 to the partition wall PW, and the second connection electrodes 115 may act as bonding metals for bonding the pixel electrodes 111 to the light emitting elements LE during a manufacturing process. For example, the first and second connection electrodes 114 and 115 may include at least any one of gold (Au), copper (Cu), aluminum (Al), and tin (Sn). In some embodiments, the first and second connection electrodes 114 and 115 may include a first layer including any one of gold (Au), copper (Cu), aluminum (Al), and tin (Sn) and a second layer including another one of gold (Au), copper (Cu), aluminum (Al), and tin (Sn). In such an embodiment, the second layer may be disposed on the first layer.

A thickness of the first connection electrodes 114 in the third direction DR3 and a thickness of the second connection electrodes 115 in the third direction DR3 may be different from each other. Therefore, the upper surfaces of the light emitting elements LE1 through LE3 may be planarized with the upper surfaces of the partition wall PW included in the light emitting element layer 120. However, embodiments of the present disclosure are not limited thereto, and the first connection electrodes 114 and the second connection electrodes 115 may also be formed to have the same height.

The light emitting elements LE1 through LE3 may be disposed on the second connection electrodes 115, respectively. A first light emitting element LE1 may be disposed in a first light emitting area EA1, a second light emitting element LE2 may be disposed in a second light emitting area EA2, and a third light emitting element LE3 may be disposed in a third light emitting area EA3.

The first light emitting element LE1 may be disposed on the second connection electrode 115 in the first light emitting area EA1. A length of the first light emitting element LE1 in the third direction DR3 may be greater than a horizontal length of the first light emitting element LE1. The horizontal length refers to a length in the first direction DR1 or a length in the second direction DR2. For example, the length of the first light emitting element LE1 in the third direction DR3 may be about 1 to about 5 μm.

The second light emitting element LE2 may be disposed on the second connection electrode 115 in the second light emitting area EA2, and the third light emitting element LE3 may be disposed on the second connection electrode 115 in the third light emitting area EA3. Lengths of the second light emitting element LE2 and the third light emitting element LE3 in the third direction DR3 may be substantially the same as the length of the first light emitting element LE1 in the third direction DR3.

The detailed cross-sectional structure of a light emitting element will be described with reference to FIG. 9. The light emitting element may be a micro light emitting diode element or a nano light emitting diode. The first light emitting element LE1 may include a first semiconductor layer SEM1, an electron blocking layer EBL, a first active layer MQW1, a superlattice layer SLT, and a second semiconductor layer SEM2 in the third direction DR3. The first semiconductor layer SEM1, the electron blocking layer EBL, the first active layer MQW1, the superlattice layer SLT, and the second semiconductor layer SEM2 may be sequentially stacked in the third direction DR3.

The second light emitting element LE2 may include a first semiconductor layer SEM1, an electron blocking layer EBL, a second active layer MQW2, a superlattice layer SLT, and a second semiconductor layer SEM2 sequentially stacked in the third direction DR3, and the third light emitting element LE3 may include a first semiconductor layer SEM1, an electron blocking layer EBL, a third active layer MQW3, a superlattice layer SLT, and a second semiconductor layer SEM2 sequentially stacked in the third direction DR3.

The first semiconductor layers SEM1 of the first through third light emitting elements LE1 through LE3 may be disposed on the second connection electrodes 115 in the first through third light emitting areas EA1 through EA3, respectively. The first semiconductor layers SEM1 may be doped with a first conductivity type dopant, such as Mg, Zn, Ca, Se, or Ba. For example, the first semiconductor layers SEM1 may be p-GaN doped with p-type Mg. A thickness of the first semiconductor layers SEM1 may be about 30 to about 200 nm.

The electron blocking layers EBL of the first through third light emitting elements LE1 through LE3 may be disposed on the first semiconductor layers SEM1. The electron blocking layers EBL may be layers for suppressing or preventing excessive electrons from flowing into the active layers MQW. For example, the electron blocking layers EBL may be p-AlGaN doped with p-type Mg. A thickness of the electron blocking layers EBL may be about 10 to about 50 nm. In some embodiments, the electron blocking layers EBL may be omitted.

The first active layer MQW1 of the first light emitting element LE1 may be disposed on the electron blocking layer EBL in the first light emitting area EA1. The first active layer MQW1 may emit light through combination of electron-hole pairs according to an electrical signal received through the first semiconductor layer SEM1 and the second semiconductor layer SEM2 of the first light emitting element LE1. The first active layer MQW1 may emit first light having a main peak wavelength of about 600 to about 750 nm, that is, may emit light in a red wavelength band.

The second active layer MQW2 of the second light emitting element LE2 may be disposed on the electron blocking layer EBL in the second light emitting area EA2. The second active layer MQW2 may emit light through combination of electron-hole pairs according to an electrical signal received through the first semiconductor layer SEM1 and the second semiconductor layer SEM2 of the second light emitting element LE2. The second active layer MQW2 may emit the second light having a main peak wavelength of about 370 to about 460 nm, that is, may emit light in a blue wavelength band.

The third active layer MQW3 of the third light emitting element LE3 may be disposed on the electron blocking layer EBL in the third light emitting area EA3. The third active layer MQW3 may emit light through combination of electron-hole pairs according to an electrical signal received through the first semiconductor layer SEM1 and the second semiconductor layer SEM2 of the third light emitting element LE3. The third active layer MQW3 may emit the third light having a main peak wavelength of about 480 to about 560 nm, that is, may emit light in a green wavelength band.

Each of the first active layer MQW1, the second active layer MQW2, and the third active layer MQW3 may include a material having a single or multiple quantum well structure. When each of the first active layer MQW1, the second active layer MQW2, and the third active layer MQW3 includes a material having a multiple quantum well structure, it may have a structure in which a plurality of well layers and a plurality of barrier layers are alternately stacked.

The first active layer MQW1 may include InGaN or GaAs, and the second active layer MQW2 and the third active layer MQW3 may include InGaN, but embodiments of the present disclosure are not limited thereto. When each of the first active layer MQW1, the second active layer MQW2, and the third active layer MQW3 includes InGaN, the concentration of indium (In) in the first active layer MQW1 may be higher than the concentration of indium (In) in the third active layer MQW3, and the concentration of indium (In) in the third active layer MQW3 may be higher than the concentration of indium (In) in the second active layer MQW2.

The superlattice layers SLT of the first through third light emitting elements LE1 through LE3 may be disposed on the first active layer MQW1, the second active layer MQW2, and the third active layer MQW3, respectively. The superlattice layers SLT may be layers for relieving stress between the first active layer MQW1 and the second semiconductor layer SEM2 of the first light emitting element LE1, stress between the second active layer MQW2 and the second semiconductor layer SEM2 of the second light emitting element LE2, and stress between the third active layer MQW3 and the second semiconductor layer SEM2 of the third light emitting element LE3. For example, the superlattice layers SLT may be made of InGaN or GaN. A thickness of the superlattice layers SLT may be about 50 to about 200 nm. In some embodiments, the superlattice layers SLT may be omitted.

The second semiconductor layers SEM2 of the first through third light emitting elements LE1 through LE3 may be disposed on the superlattice layers SLT. The second semiconductor layers SEM2 may be doped with a second conductivity type dopant, such as Si, Ge, or Sn. For example, the second semiconductor layers SEM2 may be n-GaN doped with n-type Si. A thickness of the second semiconductor layers SEM2 may be about 500 nm to about 1 μm.

The first insulating layer INS1 may be disposed on the common connection electrodes 113. The first insulating layer INS1 may be made of an inorganic layer, such as a silicon oxide layer ($SiO_2$), an aluminum oxide layer ($Al_2O_3$), or a hafnium oxide layer ($HfO_x$).

The partition wall PW may be disposed on the first insulating layer INS1. The partition wall PW may be spaced apart from each of the light emitting elements LE1 through LE3. The partition wall PW may surround each of the first through third light emitting elements LE1 through LE3. The partition wall PW may overlap the common connection electrodes 113 in the common connection areas CA.

Because the partition wall PW is formed in the same process as the light emitting elements, all or part of the partition wall PW may include the same material as the light emitting elements.

Referring to FIG. 10, the partition wall PW may include a plurality of sub-partition walls SPW1 through SPW5 sequentially stacked in the third direction DR3. For example, the partition wall PW may include a first sub-partition wall SPW1, a second sub-partition wall SPW2, a third sub-partition wall SPW3, a fourth sub-partition wall SPW4, and a fifth sub-partition wall SPW5.

The first sub-partition wall SPW1 may be made of the same material as the first semiconductor layer SEM1 of any one of the first through third light emitting elements LE1 through LE3. The first sub-partition wall SPW1 may be formed in the same process as the first semiconductor layer SEM1. A thickness of the first sub-partition wall SPW1 may be substantially the same as the thickness of the first semiconductor layer SEM1 of any one of the first through third light emitting elements LE1 through LE3.

The second sub-partition wall SPW2 may be made of the same material as the electron blocking layer EBL of any one of the first through third light emitting elements LE1 through LE3. The second sub-partition wall SPW2 may be formed in the same process as the electron blocking layer EBL. A thickness of the second sub-partition wall SPW2 may be substantially the same as the thickness of the electron blocking layer EBL of any one of the first through third light emitting elements LE1 through LE3. When the electron blocking layer EBL is omitted, the second sub-partition wall SPW2 may also be omitted.

The third sub-partition wall SPW3 may be made of the same material as any one of the first through third active layers MQW1 through MQW3. The third sub-partition wall SPW3 may be formed in the same process as any one of the first through third active layers MQW1 through MQW3. A thickness of the third sub-partition wall SPW3 may be substantially the same as the thickness of any one of the first through third active layers MQW1 through MQW3.

The fourth sub-partition wall SPW4 may be made of the same material as the superlattice layer SLT of any one of the first through third light emitting elements LE1 through LE3. The fourth sub-partition wall SPW4 may be formed in the same process as the superlattice layer SLT. A thickness of the fourth sub-partition wall SPW4 may be substantially the same as the thickness of the superlattice layer SLT of any one of the first through third light emitting elements LE1 through LE3.

The fifth sub-partition wall SPW5 may be formed of the same material as that of the second semiconductor layer SEM2 of the first through third light emitting elements LE1 through LE3. The fifth sub-partition wall SPW5 may be formed in the same process as the second semiconductor layer SEM2. A thickness of the fifth sub-partition wall SPW5 may be substantially the same as the thickness of the second semiconductor layer SEM2 of any one of the first through third light emitting elements LE1 through LE3. For another example, when the fifth sub-partition wall SPW5 is not removed in a process of manufacturing the display panel 10, the fifth sub-partition wall SPW5 may be thicker than the second semiconductor layer SEM2.

The second insulating layer INS2 may be disposed on side surfaces of the partition wall PW, side surfaces of the first connection electrodes 114, side surfaces of the second connection electrodes 115, and side surfaces of each of the first through third light emitting elements LE1 through LE3. The second insulating layer INS2 may be made of an inorganic layer, such as a silicon oxide layer ($SiO_2$), an aluminum oxide layer ($Al_2O_3$), or a hafnium oxide layer ($HfO_x$). A thickness of the second insulating layer INS2 may be about 0.1 μm.

The common electrode CE may be disposed on upper and side surfaces of each of the first through third light emitting elements LE1 through LE3 and upper and side surfaces of the partition wall PW. For example, the common electrode CE may cover the upper and side surfaces of each of the first through third light emitting elements LE1 through LE3 and the upper and side surfaces of the partition wall PW.

The common electrode CE may contact the second insulating layer INS2 and may contact the upper surface of each of the first through third light emitting elements LE1 through LE3 and the upper surface of the partition wall PW. In addition, the common electrode CE may contact the first insulating layer INS1, the second insulating layer INS2, and upper surfaces of the first connection electrodes 114 exposed without being covered by the partition wall PW.

The common voltage supplied to the common connection electrodes 113 through the second power lines VSL of the pixel circuit units PXC may be supplied to the first through third light emitting elements LE1 through LE3. An end of each of the first through third light emitting elements LE1 through LE3 may receive the pixel voltage (or the anode voltage) of the pixel electrode 111 through the second connection electrode 115, and the other end may receive the common voltage through the first connection electrode 114 and the common electrode CE. Each of the first through third light emitting elements LE1 through LE3 may emit light of a predetermined luminance according to a voltage difference between the pixel voltage and the common voltage. For example, the first light emitting element LE1 may emit the first light, the second light emitting element LE2 may emit the second light, and the third light emitting element LE3 may emit the third light.

The common electrode CE may include a transparent conductive material. The common electrode CE may be made of a transparent conductive oxide (TCO), such as indium tin oxide (ITO) or indium zinc oxide (IZO). A thickness of the common electrode CE may be about 0.1 μm.

The reflective layer RF reflects light travelling in a lateral direction, not in an upward direction, from among the light emitted from the first through third light emitting elements LE1 through LE3. The reflective layer RF may include a metal material having high reflectivity, such as aluminum (Al). A thickness of the reflective layer RF may be about 0.1 μm.

The reflective layer RF may be disposed on the side surfaces of the partition wall PW, the side surfaces of the first connection electrodes 114, the side surfaces of the second connection electrodes 115, and the side surfaces of the first through third light emitting elements LE1 through LE3. The reflective layer RF may contact the common electrode CE disposed on the side surfaces of the partition wall PW, the side surfaces of the first connection electrodes 114, the side surfaces of the second connection electrodes 115, and the side surfaces of the first through third light emitting elements LE1 through LE3.

A planarization layer PLA may expose the respective upper surfaces of the first light emitting element LE1, the second light emitting element LE2, and the third light emitting element LE3 without covering them. The planarization layer PLA may fill a space between the light emitting elements LE1 through LE3 to planarize a step (e.g., a step difference) due to the light emitting elements LE1 through LE3. The planarization layer PLA may cover side surfaces of the reflective layer RF covering each of the light emitting elements LE1 through LE3 and an upper surface of the common electrode CE.

A plurality of color filters may be disposed on the planarization layer PLA. In addition, an optical lens may be disposed on the planarization layer PLA.

Referring to FIGS. 6B, 7, and 8, a width of the first light emitting area EA1 in a direction may be greater than a width of the second light emitting area EA2 in the direction and a width of the third light emitting area EA3 in the direction. The widths of the second light emitting area EA2 and the third light emitting area EA3 in the direction may be the same, but embodiments of the present disclosure are not limited thereto.

Similarly, a width Ws1 of the first light emitting element LE1 included in the first light emitting area EA1 in a direction may be greater than a width Ws2 of the second light emitting element LE2 included in the second light emitting area EA2 in the direction and a width Ws3 of the third light emitting element LE3 included in the third light emitting area EA3 in the direction. The width Ws2 of the second light emitting element LE2 in the direction and the width Ws3 of the third light emitting element LE3 in the direction may be the same, but embodiments of the present disclosure are not limited thereto.

It is apparent from the drawings that the magnitude relationship between the widths Ws1 through Ws3 of the first through third light emitting elements LE1 through LE3 in the direction can also be applied to the magnitude relationship between widths to the reflective layer RF disposed on the side surfaces of the first through third light emitting elements LE1 through LE3.

A distance Wp1 between the first light emitting element LE1 and the partition wall PW adjacent thereto may be the same as a distance Wp2 between the second light emitting element LE2 and the partition wall PW adjacent thereto and a distance Wp3 between the third light emitting element LE3 and the partition wall PW adjacent thereto.

In the drawings, the distances Wp1, Wp2, and Wp3 between the first to third light emitting devices LE1, LE2, and LE3 and the partition wall PW adjacent thereto are distances between the corresponding reflective film RF disposed on the side surfaces of the first to third light emitting devices LE1, LE2, and the partition wall PW adjacent thereto. However, in the drawings, the distance between the first to third light emitting elements LE1, LE2, and LE3 and the partition wall PW adjacent thereto may be changed (or varied) to correspond to the distance between the side surface of the first to third light emitting elements LE1, LE2, and the partition wall PW adjacent thereto.

Although the distances Wp1 through Wp3 between the first through third light emitting elements LE1 through LE3 and the partition wall PW adjacent thereto are Wp1 through Wp3 between the first through third light emitting elements LE1 through LE3 and the partition wall PW adjacent thereto corresponding also have the same magnitude relationship.

Because the display device 1 according to an embodiment includes the first light emitting element LE1 emitting the first light, the second light emitting element LE2 emitting the second light, and the third light emitting element LE3 emitting the third light, it can display various colors without a wavelength conversion layer or color filters. Therefore, process efficiency can be improved or maximized.

In addition, because the luminous efficiency of each light emitting element itself can be utilized, a display device having higher efficiency can be realized.

In addition, by increasing the area (or width in a direction) of the first light emitting element LE1, the luminous efficiency of the light emitting element of the first light emitting element LE1 can be increased, and the maximum distances (e.g., D1b, D2b, D3b and D4b) between each of the light emitting elements LE1, LE2, and LE3 can be constantly maintained.

Figure 11:
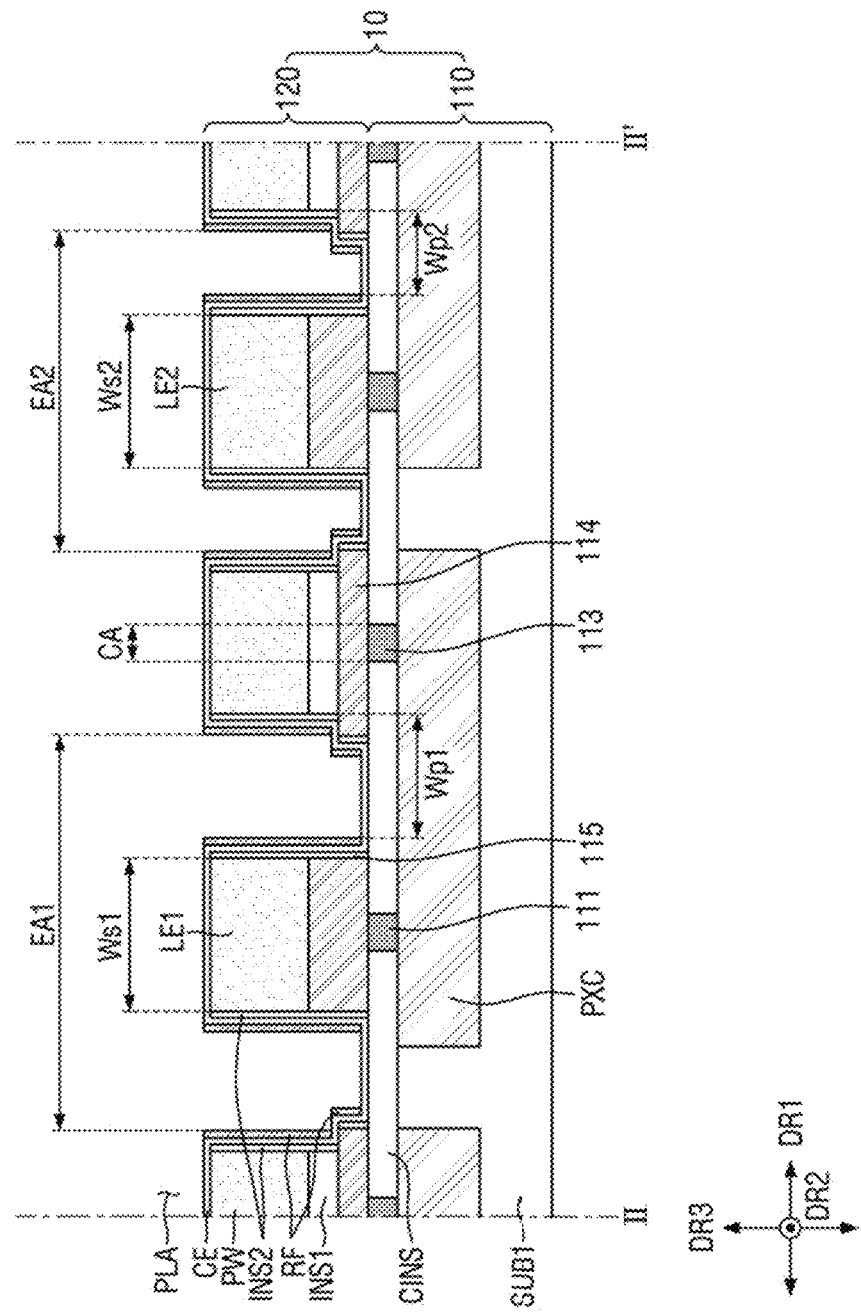
FIG. 11 is a cross-sectional view of another example of the display panel taken along the line II-II' of FIG. 6A.
Figure 12:
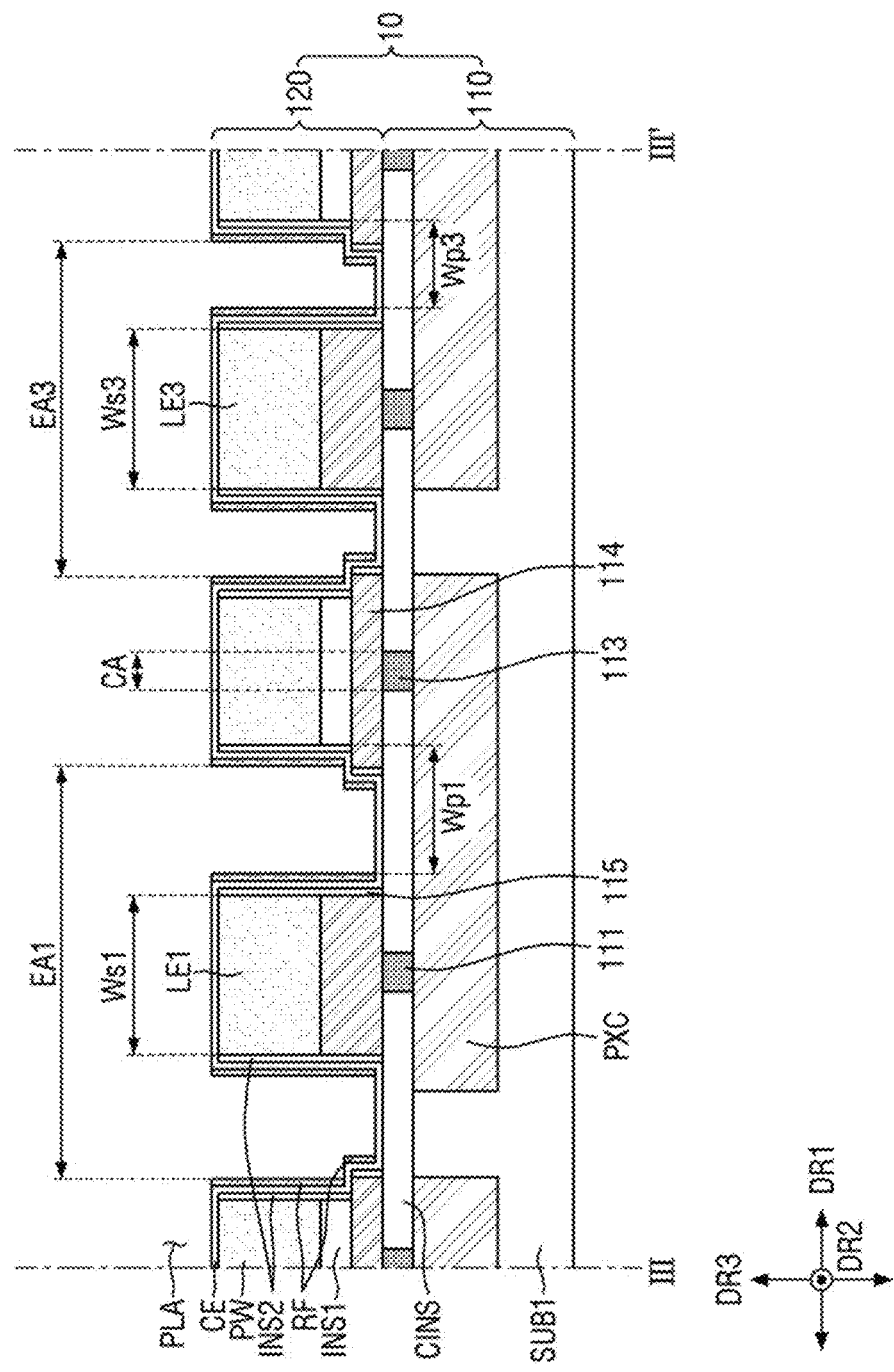
FIG. 12 is a cross-sectional view of another example of the display panel taken along the line III-III' of FIG. 6A.

FIG. 11 is a cross-sectional view of another example of the display panel 10b taken along the line II-II' of FIG. 6A, and FIG. 12 is a cross-sectional view of another example of the display panel 10b taken along the line III-III' of FIG. 6A.

FIGS. 11 and 12 are the same as the embodiment shown FIGS. 6B, 7, and 8 in that a width of a first light emitting area EA1 in a direction is greater than a width of a second light emitting area EA2 in the direction and a width of a third light emitting area EA3 in the direction but are different from the embodiment shown in FIGS. 6B, 7, and 8 in that a width Ws1 of a first light emitting element LE1 in the direction, a width Ws2 of a second light emitting element LE2 in the direction, and a width Ws3 of a third light emitting element LE3 in the direction are the same.

In addition, FIGS. 11 and 12 are different from the embodiment shown in FIGS. 6B, 7, and 8 in that a distance Wp1 between the first light emitting element LE1 and a partition wall PW adjacent thereto is greater than a distance Wp2 between the second light emitting element LE2 and the partition wall PW adjacent thereto and a distance Wp3 between the third light emitting element LE3 and the partition wall PW adjacent thereto. Although the distance Wp2 between the second light emitting element LE2 and the partition wall PW adjacent thereto and the distance Wp3 between the third light emitting element LE3 and the partition wall PW adjacent thereto are the same, embodiments of the present disclosure are not limited thereto.

A display device 1 according to the illustrated embodiment may have a large area in order to increase the luminous efficiency of the first light emitting area EA1 emitting first light (e.g., light in a red wavelength band), but minimum distances (e.g., D1b, D2b, D3b and D4b) between the light emitting areas EA1 through EA3 may be kept constant.

Embodiments of various planar shapes of a plurality of light emitting areas EA1 through EA5 will now be described with reference to FIGS. 13 through 25.

FIGS. 13 through 25 are examples of various plan layout views of pixels of a display panel according to embodiments.

Figure 13:
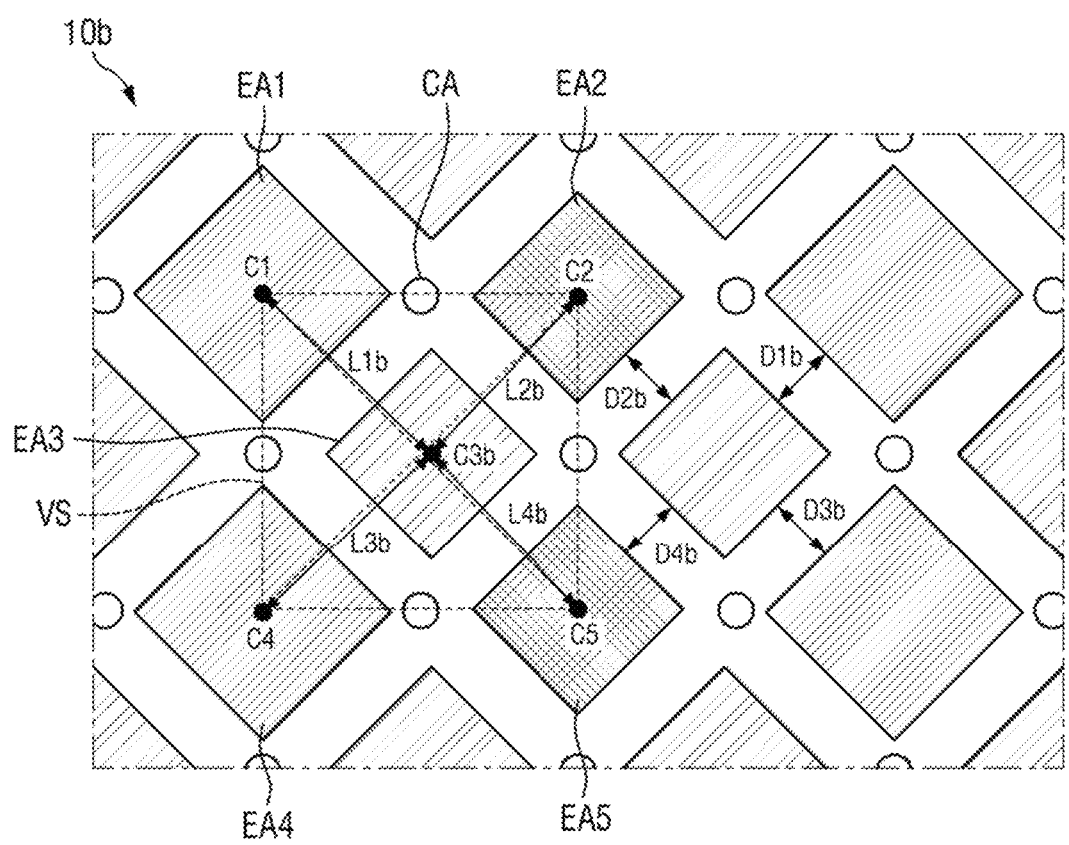
FIGS. 13 through 25 are examples of various plan layout views of pixels of a display panel according to embodiments.
Figure 13:
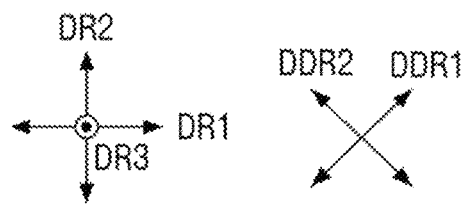

FIG. 13 is different from the embodiment shown in FIG. 6A in that each of a plurality of light emitting areas EA1 through EA5 has a quadrangular planar shape having four sides.

Figure 14:
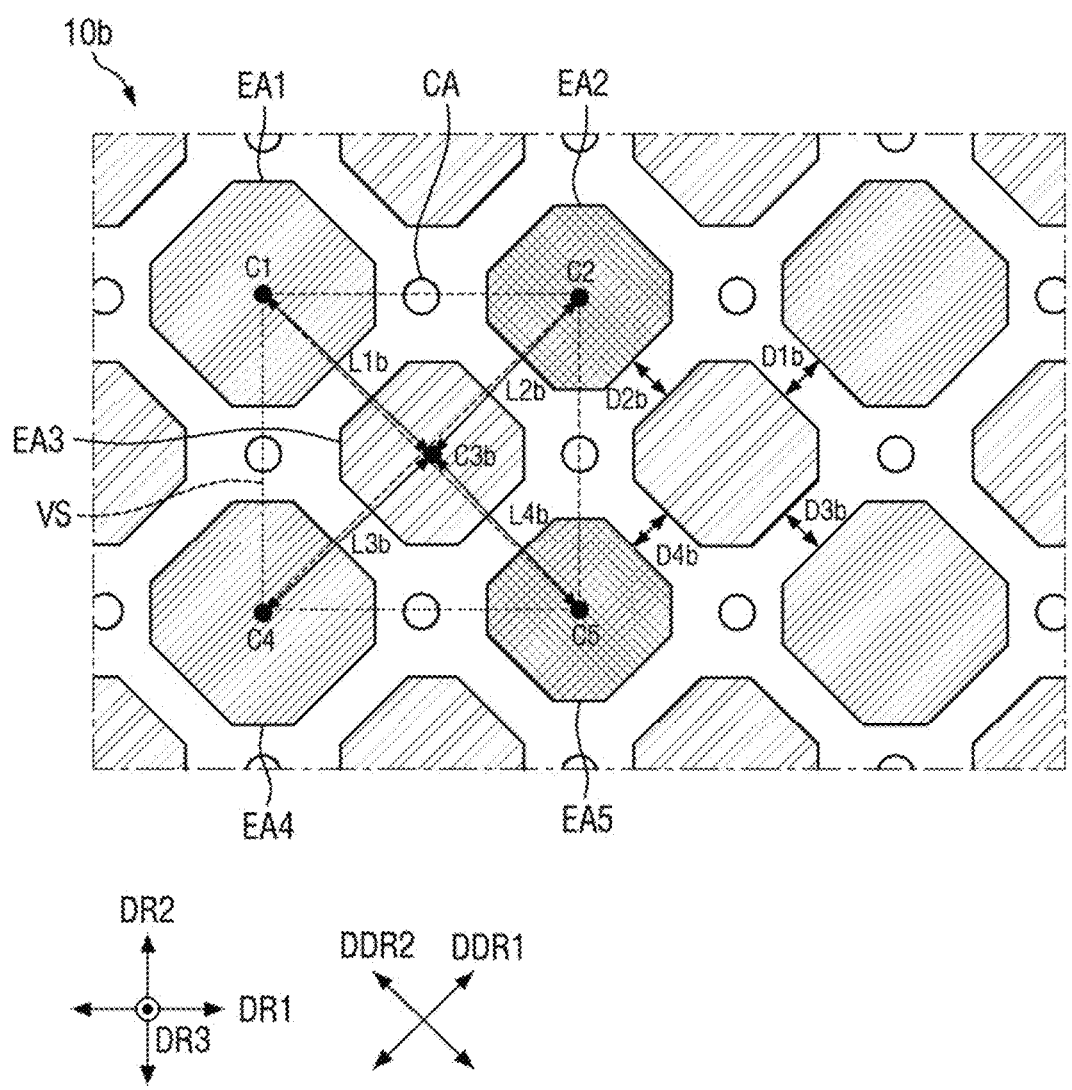

Referring to FIG. 14, each of a plurality of light emitting areas EA1 through EA5 may have an octagonal planar shape having eight sides. In each of the light emitting area EA1 through EA5, sides extending in the first direction DR1 and the second direction DR2 may be shorter than sides extending in the first diagonal direction DDR1 and the second diagonal direction DDR2.

Figure 15:
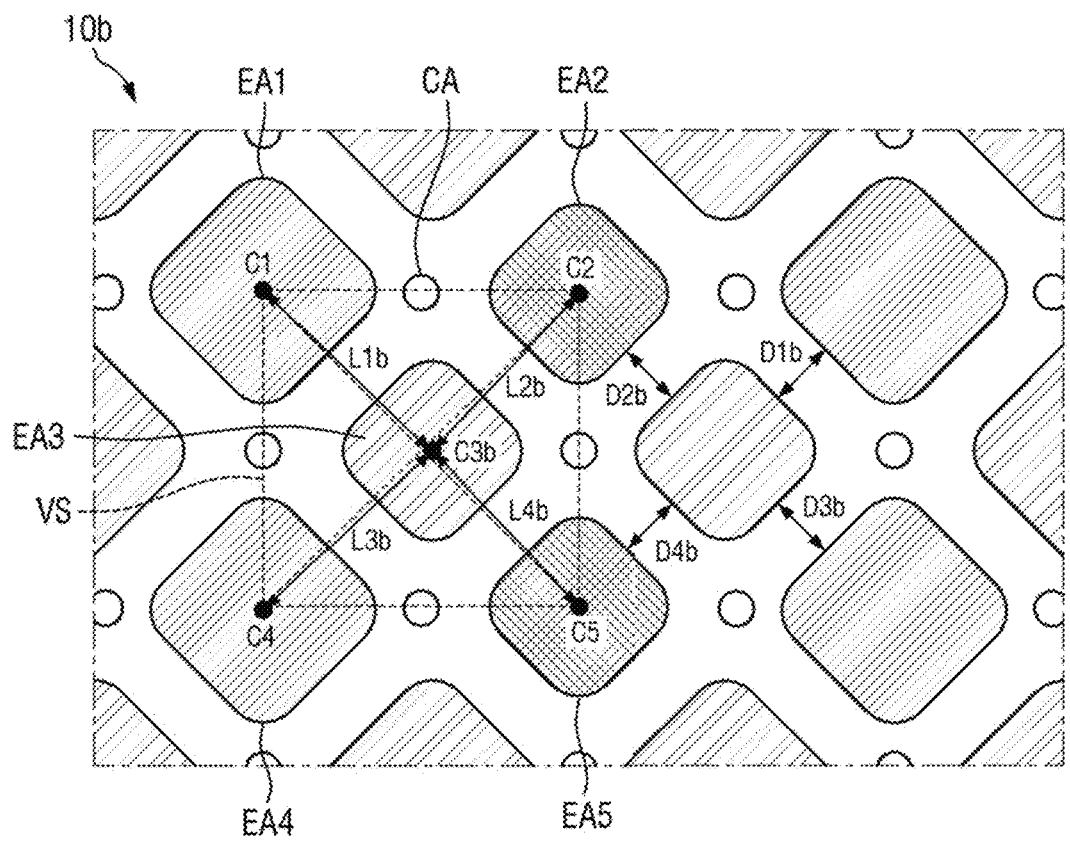

Referring to FIG. 15, each of a plurality of light emitting areas EA1 through EA5 may have a quadrangular planar shape modified to have outwardly rounded vertices. For example, each of the light emitting areas EA1 through EA5 shown in FIG. 15 may have an irregular planar shape including curved parts.

Figure 16:
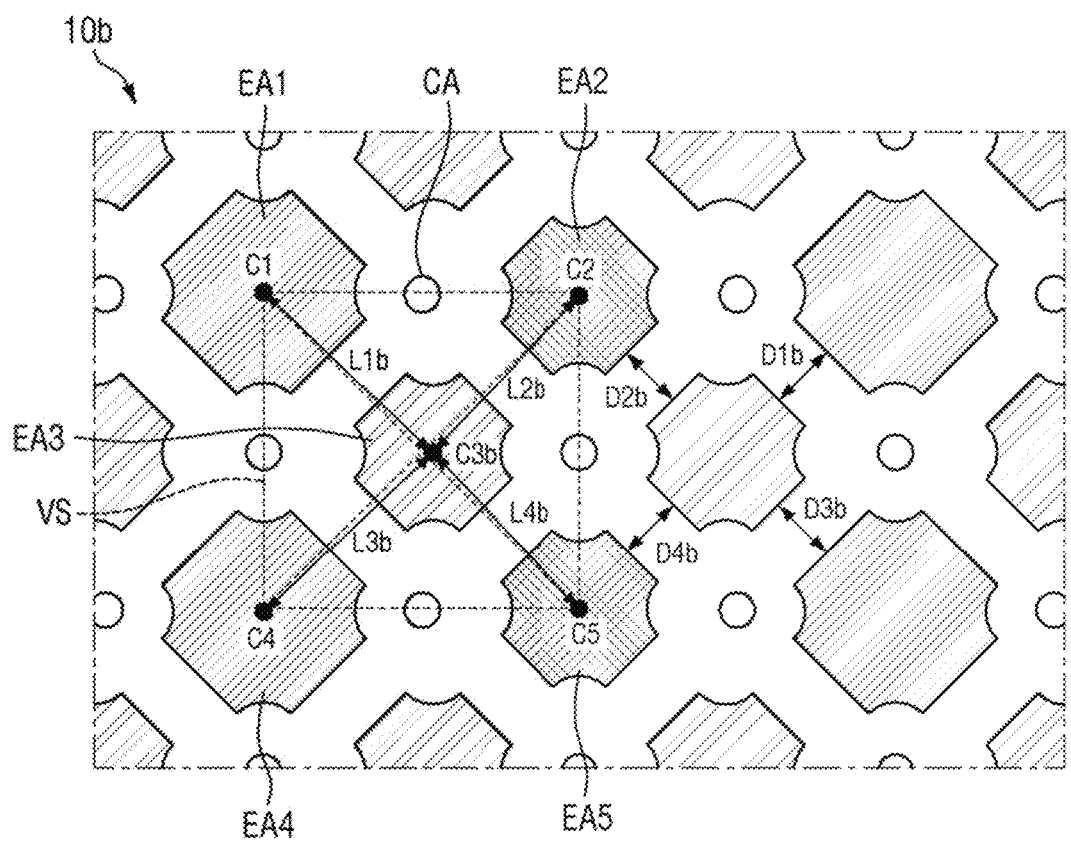

Referring to FIG. 16, each of a plurality of light emitting areas EA1 through EA5 may have an octagonal planar shape having eight sides. In this embodiment, four sides parallel to the first direction DR1 and the second direction DR2 may have an inwardly rounded shape, and four sides parallel to the first diagonal direction DDR1 and the second diagonal direction DDR2 may have a line shape. For example, each of the light emitting areas EA1 through EA5 shown in FIG. 16 may have an irregular planar shape in which four sides have a line shape and four sides have a rounded shape.

Figure 17:
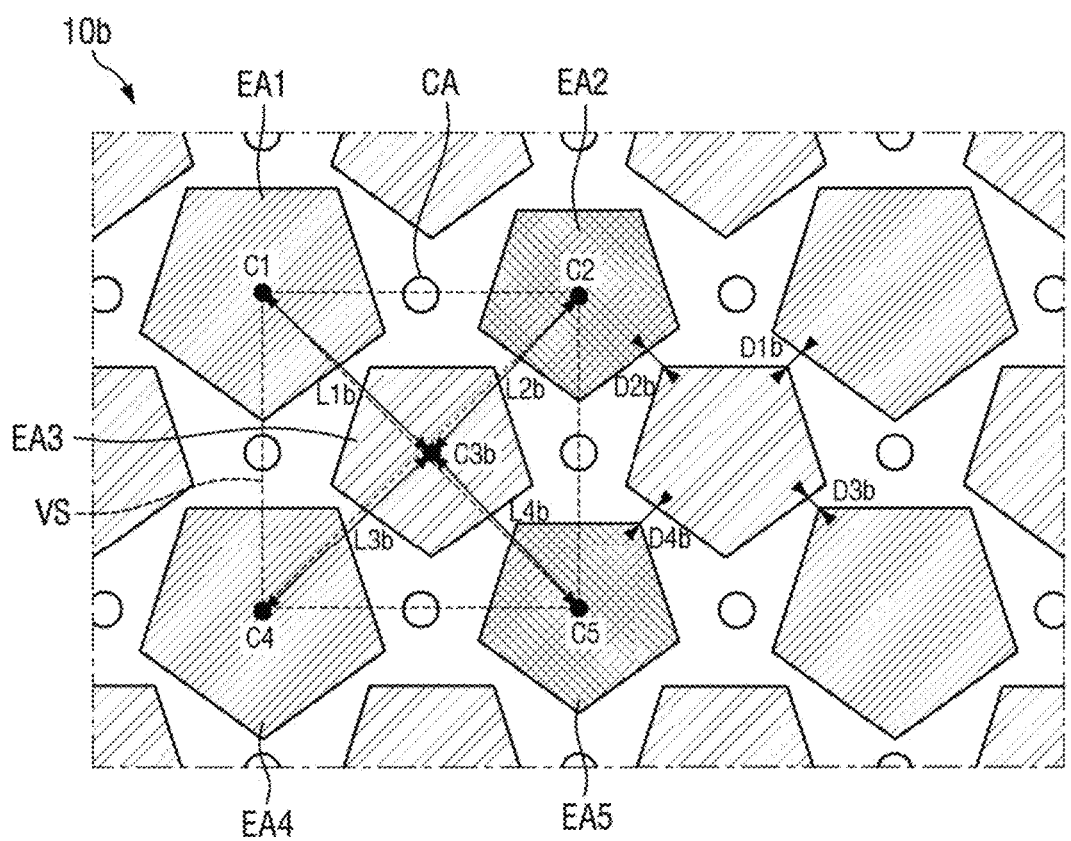

Referring to FIG. 17, each of a plurality of light emitting areas EA1 through EA5 may have a pentagonal planar shape having five sides. Each of the light emitting areas EA1 through EA5 may have a pentagonal planar shape in which one side is parallel to the first direction DR1 and a vertex facing the one side is disposed below the one side.

Figure 18:
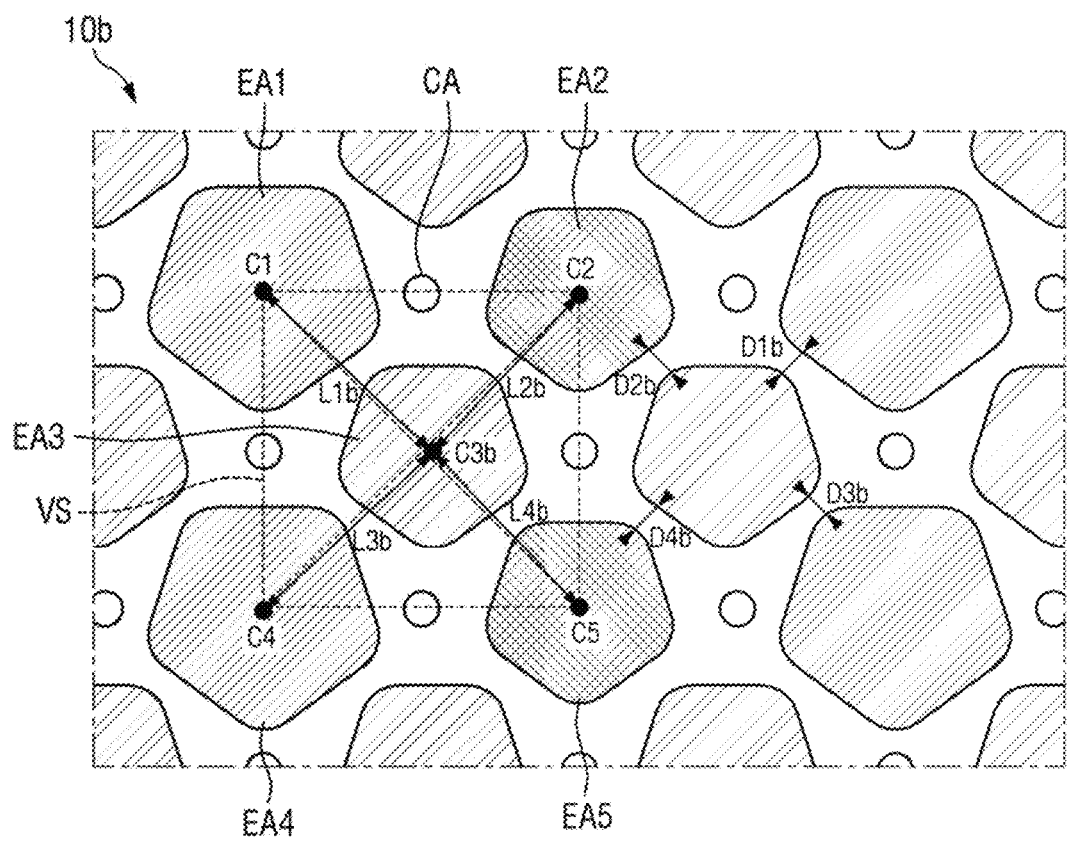

Referring to FIG. 18, each of a plurality of light emitting areas EA1 through EA5 may have a pentagonal planar shape modified to have outwardly rounded vertices. For example, each of the light emitting areas EA1 through EA5 shown in FIG. 18 may have an irregular planar shape including curved parts.

Figure 19:
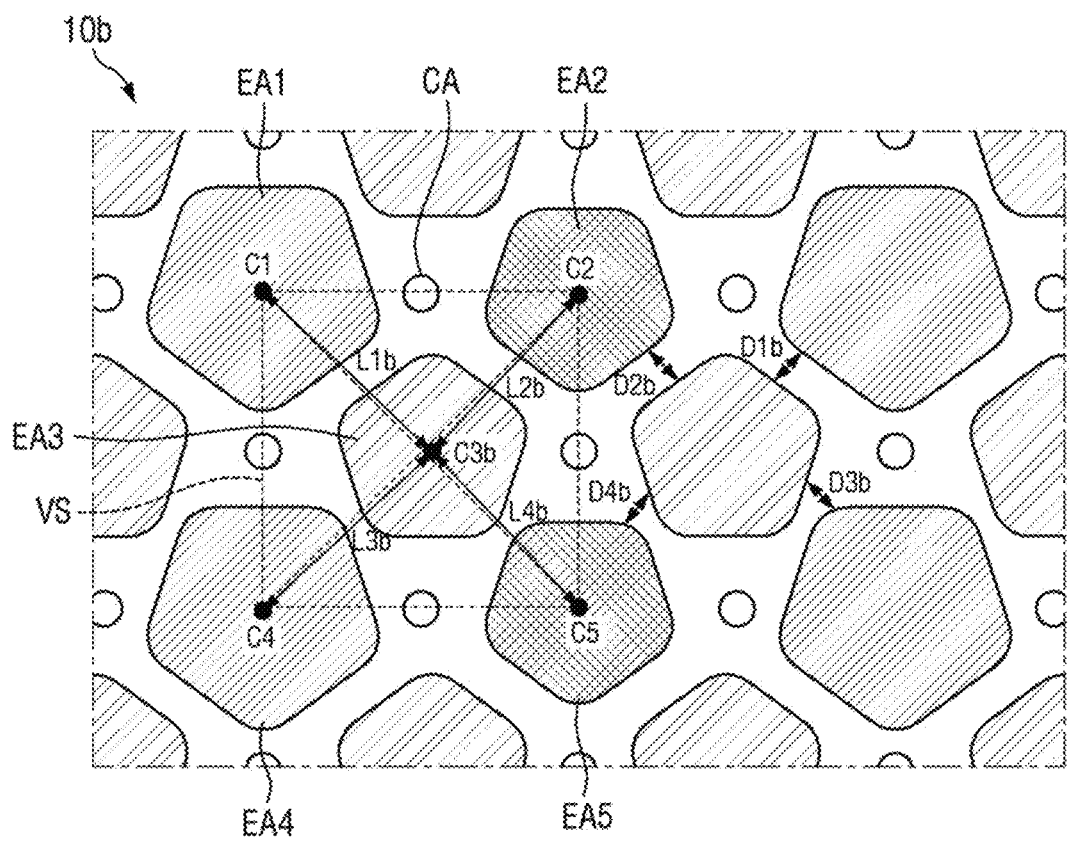

Referring to FIG. 19, each of a plurality of light emitting areas EA1 through EA5 may have a pentagonal planar shape, but light emitting areas disposed in a first row and a third row may have a different planar shape from light emitting areas disposed in a second row. For example, first light emitting areas EA1 and second light emitting areas EA2 of the first row and fourth light emitting areas EA4 and fifth light emitting areas EA5 of the third row may have a pentagonal shape in which one side is parallel to the first direction DR1 and a vertex facing the one side is disposed below the one side. On the other hand, third light emitting areas EA3 of the second row may have a pentagonal shape in which one side is parallel to the first direction DR1 and a vertex facing the one side is disposed above the one side. In the illustrated embodiment, each of the light emitting areas EA1 through EA5 is illustrated as having a rounded pentagonal shape as shown in FIG. 18 but may also have a pentagonal planar shape having five vertices as shown in FIG. 17.

Figure 20:
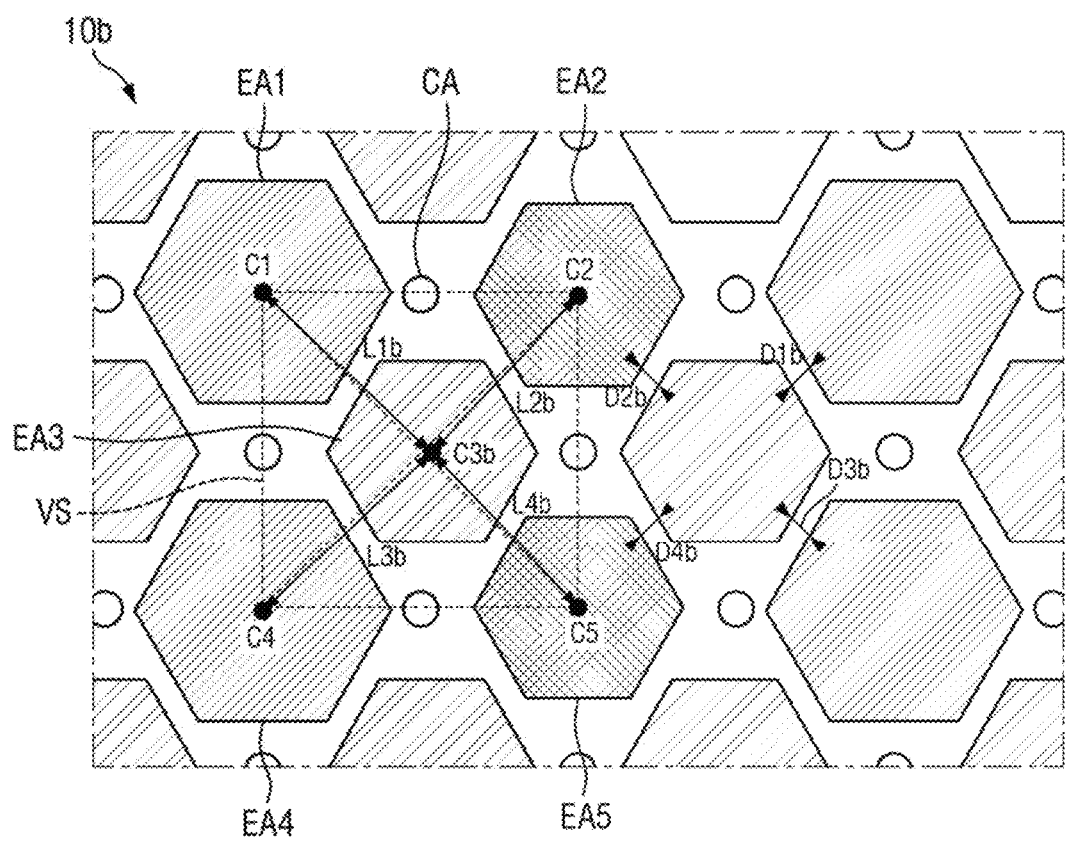

Referring to FIG. 20, each of a plurality of light emitting areas EA1 through EA5 may have a hexagonal planar shape having six sides. Each of the light emitting areas EA1 through EA5 may have a hexagonal planar shape having two sides parallel to the first direction DR1.

Figure 21:
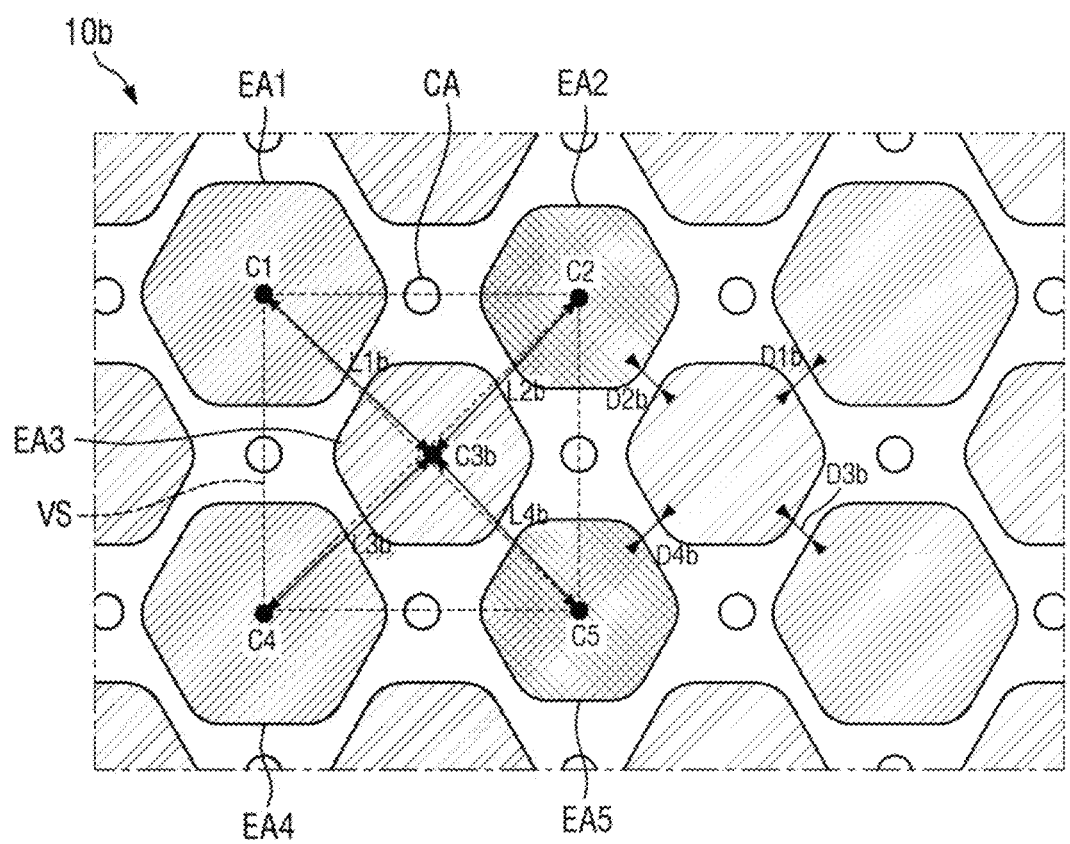

Referring to FIG. 21, each of a plurality of light emitting areas EA1 through EA5 may have a hexagonal planar shape modified to have outwardly rounded vertices. For example, each of the light emitting areas EA1 through EA5 shown in FIG. 21 may have an irregular planar shape including curved parts.

Figure 22:
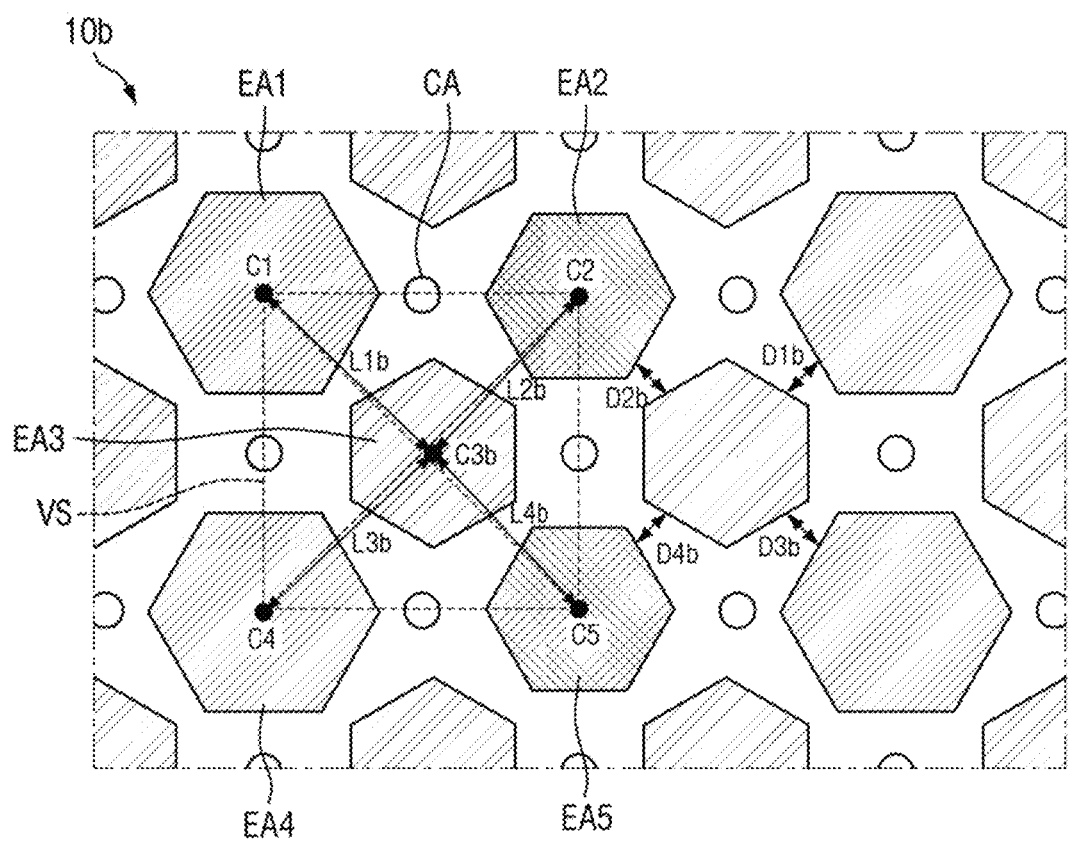

Referring to FIG. 22, each of a plurality of light emitting areas EA1 through EA5 may have a hexagonal planar shape, but light emitting areas disposed in a first row and a third row may have a different planar shape from light emitting areas disposed in a second row. For example, first light emitting areas EA1 and second light emitting areas EA2 of the first row and fourth light emitting areas EA4 and fifth light emitting areas EA5 of the third row may have a hexagonal shape having two sides parallel to the first direction DR1. On the other hand, third light emitting areas EA3 of the second row may have a hexagonal shape having two sides parallel to the second direction DR2

Figure 23:
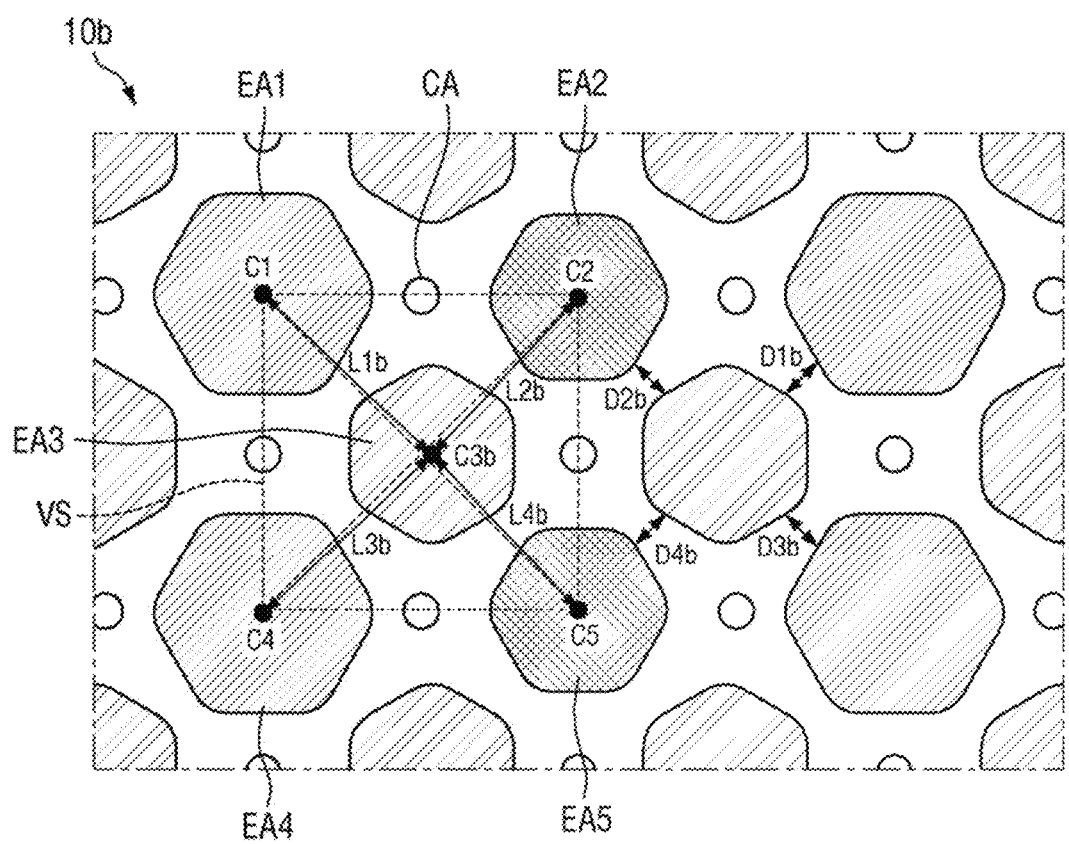

Referring to FIG. 23, a plurality of light emitting areas EA1 through EA5 may be arranged as illustrated in FIG. 22, but may each be modified to have outwardly rounded vertices.

Figure 24:
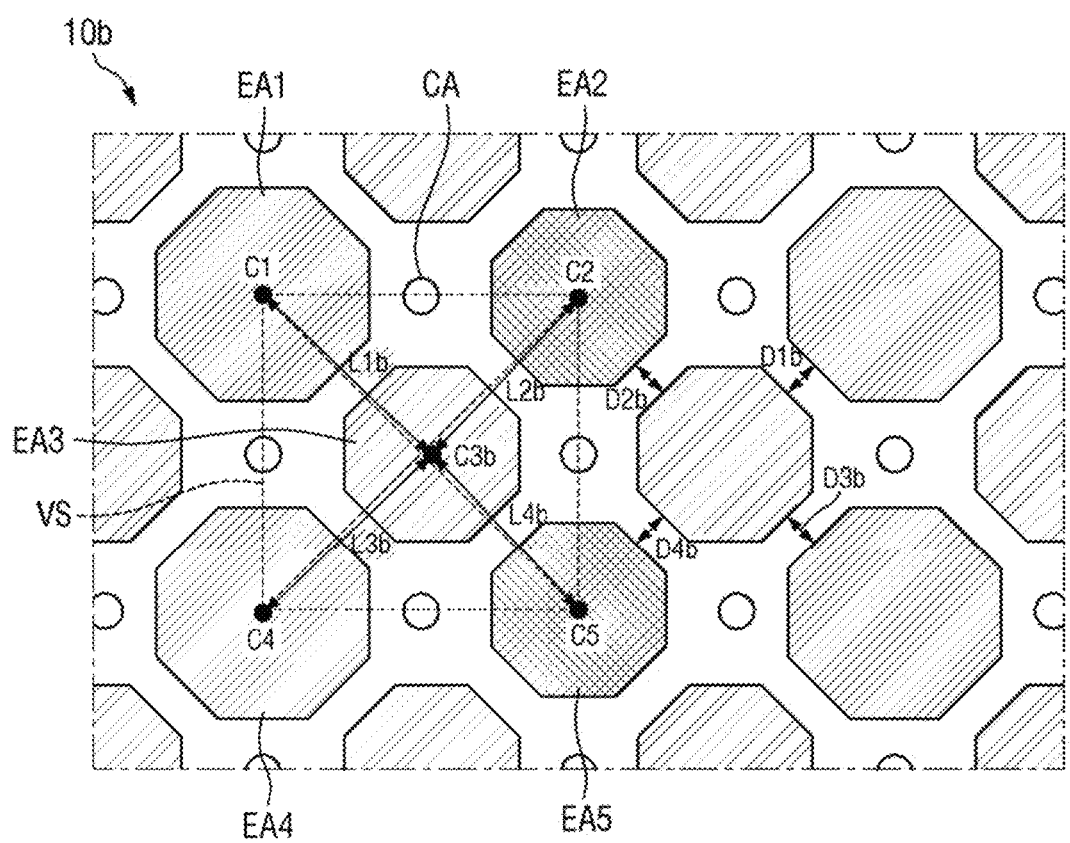

Referring to FIG. 24, each of a plurality of light emitting areas EA1 through EA5 may have an octagonal planar shape having eight sides. However, embodiments of the present disclosure are not limited thereto, and each of the light emitting areas EA1 through EA5 may also have an octagonal planar shape modified to have outwardly rounded vertices.

Figure 25:
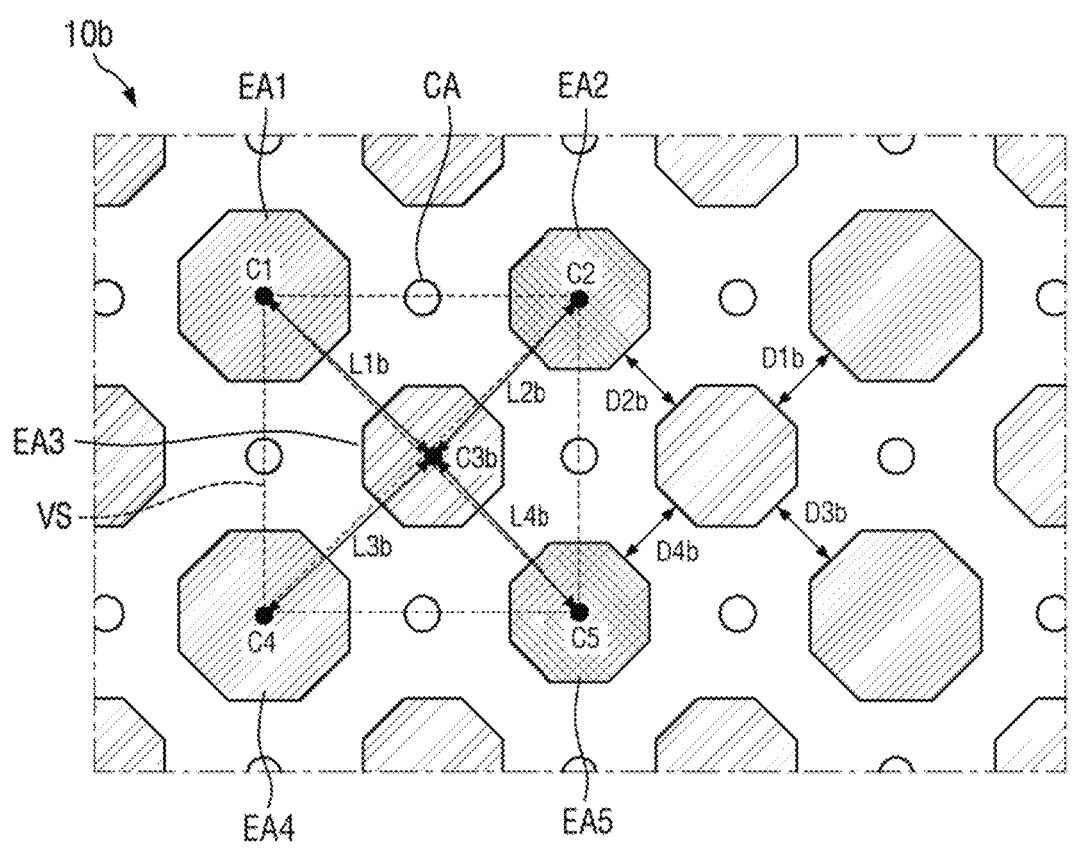

Referring to FIG. 25, each of a plurality of light emitting areas EA1 through EA5 may have an octagonal planar shape having eight sides. Because the area of each of the light emitting areas EA1 through EA5 is reduced, a distance between the light emitting areas may increase.

The embodiments shown in FIGS. 13 through 25 are the same as the embodiment shown in FIG. 6A in that a center point C3*b* of the third light emitting area EA3 and a virtual center point CP of a virtual quadrangle VS are spaced apart from each other, a first center distance L1*b* is greater than a second center distance L2*b*, and a third center distance L3*b* is greater than a fourth center distance L4*b*. In addition, the embodiments shown in FIGS. 13 through 25 are the same as the embodiment shown in FIG. 6A in that a first distance D1*b*, a second distance D2*b*, a third distance D3*b*, and a fourth distance D4*b* are the same.

Accordingly, even when the area of the first light emitting area EA1 emitting first light (e.g., light in a red wavelength band) is larger than the areas of the second and third light emitting areas EA2 and EA3 emitting second light and third light, because minimum distances between the light emitting areas are the same, a display device having high luminous efficiency can be realized.

Display device 1 according to other embodiments will now be described.

Figure 26:
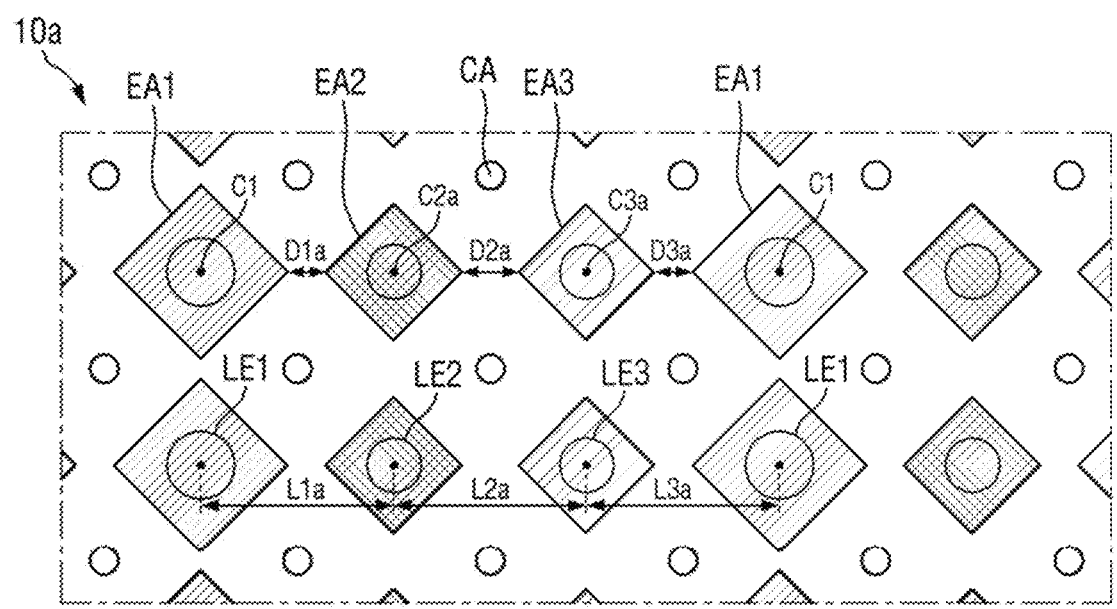
FIG. 26 is a plan layout view of pixels of a display panel according to an embodiment.
Figure 26:
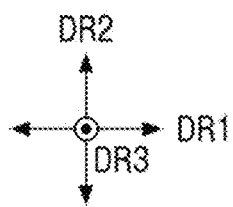

FIG. 26 is a plan layout view of pixels of a display panel 10*a* according to an embodiment.

The display panel 10*a* according to the illustrated embodiment is different from the previous embodiments including four light emitting areas EA_G, EA_B, EA_G1, and EA_G2 in that each of a plurality of pixels PX includes three light emitting areas EA1 through EA3 and a plurality of common connection areas CA surrounding (e.g., surrounding in a plan view or extending around a periphery of) the light emitting areas EA1 through EA3.

Each of the pixels PX may include a first light emitting area EA1 including a first light emitting element LE1, a second light emitting area EA2 including a second light emitting element LE2, and a third light emitting area EA3 including a third light emitting element LE3.

The common connection areas CA may face each other with respect to one light emitting area. Four common connection areas CA facing each other may form a square or rectangular shape in a plan view. Common connection electrodes 113 included in the common connection areas CA may be arranged as described above, but embodiments of the present disclosure are not limited thereto.

One common connection area CA may be disposed between two light emitting elements adjacent to each other in the first diagonal direction DDR1 and the second diagonal direction DDR2 from among the first light emitting elements LE1, the second light emitting elements LE2, and the third light emitting elements LE3. The common connection area CA is not disposed between two light emitting elements adjacent to each other in the first direction DR1 and the second direction DR2.

Each of the light emitting areas EA1 through EA3 defined by a partition wall PW may have a polygonal shape, such as a triangle, a quadrangle, a pentagon, a hexagon, or an octagon, an oval shape, or an irregular shape in a plan view The arrangement relationship between the light emitting areas EA1 through EA3 and the light emitting elements LE1 through LE3 will now be described.

In an embodiment, the first light emitting area EA1, the second light emitting area EA2, and the third light emitting area EA3 may be alternately arranged along the first direction DR1. The first light emitting area EA1 may be repeatedly arranged along the second direction DR2 to form a first column, the second light emitting area EA2 may be repeatedly arranged along the second direction DR2 in a second column adjacent to the first column, and the third light emitting area EA3 may be repeatedly arranged along the second direction DR2 in a third column adjacent to the second column.

Similarly, the first light emitting element LE1 included in the first light emitting area EA1, the second light emitting element LE2 included in the second light emitting area EA2, and the third light emitting element LE3 included in the third light emitting area EA3 may be alternately arranged along the first direction DR1.

In the illustrated embodiment, the first light emitting element LE1 emitting first light (e.g., light in a red wavelength band), the second light emitting element LE2 emitting second light (e.g., light in a blue wavelength band), and the third light emitting element LE3 emitting third light (e.g., light in a green wavelength band) are repeatedly arranged in the first direction DR1, but embodiments of the present disclosure are not limited thereto. For example, the first light emitting element LE1 emitting the first light, the third light emitting element LE3 emitting the third light, and the second light emitting element LE2 emitting the second light may be sequentially arranged along the first direction DR1.

The area of each light emitting area may be different. For example, the area of the first light emitting area EA1, the area of the second light emitting area EA2, and the area of the third light emitting area EA3 may be different from each other. For example, the area of the first light emitting area EA1 may be larger than the area of the second light emitting area EA2 and the area of the third light emitting area EA3. The area of the second light emitting area EA2 and the area of the third light emitting area EA3 may be substantially the same, but embodiments of the present disclosure are not limited thereto.

For example, to increase the luminous efficiency of the first light, which is light in the red wavelength band, the area of the first light emitting area EA1 may be increased to increase the red light luminous efficiency. Because the current density decreases as the area of a light emitting area increases, the luminous efficiency increases as the area is increased.

The area of each of the light emitting areas EA1 through EA3 partitioned by the partition wall PW may be larger than the area of each of the light emitting elements LE1 through LE3.

Distances between the light emitting areas and the light emitting elements will now be described.

Referring to FIG. 26, the first light emitting area EA1 of the display panel 10a may include a center point C1, the second light emitting area EA2 may include a center point C2a, and the third light emitting area EA3 may include a center point C3a.

In the illustrated embodiment, when a distance between the center point C1 of the first light emitting area EA1 and the center point C2a of the second light emitting area EA2 is defined as a first center distance L1a, a distance between the center point C2a of the second light emitting area EA2 and the center point C3a of the third light emitting area EA3 is defined as a second center distance L2a, and a distance between the center point C3a of the third light emitting area EA3 and the center point C1 of another neighboring first light emitting area EA1 is defined as a third center distance L3a, the first center distance L1a, the second center distance L2a, and the third center distance L3a may be the same.

In such an embodiment, because the area of the first light emitting area EA1 is relatively large, when a minimum distance between the first light emitting area EA1 and the second light emitting area EA2 is defined as a first distance D1a, a minimum distance between the second light emitting area EA2 and the third light emitting area EA3 is defined as a second distance D2a, and a minimum distance between the third light emitting area EA3 and another neighboring first light emitting area EA1 is defined as a third distance D3a, the first distance D1a and the third distance D3a may be smaller than the second distance D2a.

Figure 27:
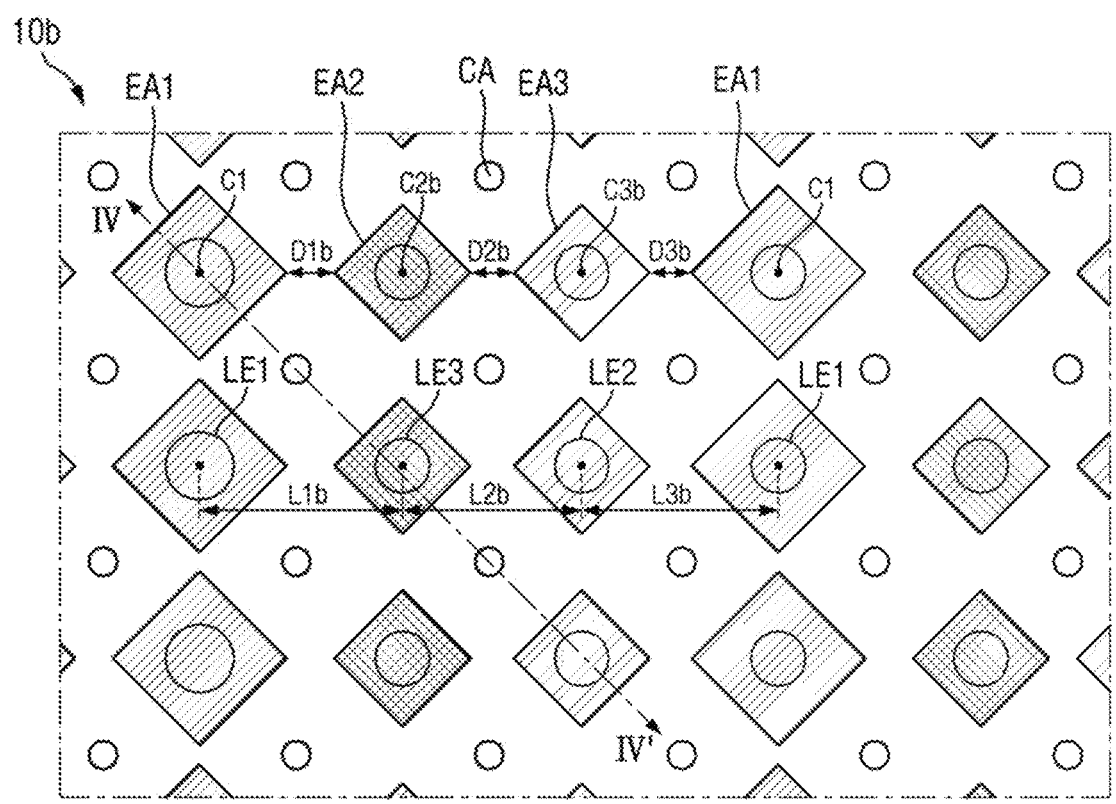
FIG. 27 is a plan layout view of pixels of a display panel according to an embodiment.
Figure 27:
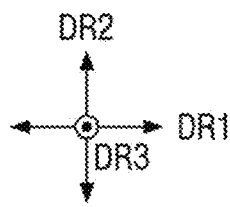

FIG. 27 is a plan layout view of pixels of a display panel 10b according to an embodiment.

Referring to FIG. 27, the display panel 10b according to the illustrated embodiment is different from the display panel 10a according to the embodiment shown in FIG. 26 in that a second light emitting area EA2 moves to (e.g., is shifted to) the right and a third light emitting area EA3 moves to the left. Accordingly, a first distance D1b, a second distance D2b, and a third distance D3b may be the same.

In addition, when a distance between a center point C1 of a first light emitting area EA1 and a center point C2b of the second light emitting area EA2 is defined as a first center distance L1b, a distance between the center point C2b of the second light emitting area EA2 and a center point C3b of the third light emitting area EA3 is defined as a second center distance L2b, and a distance between the center point C3b of the third light emitting area EA3 and the center point C1 of another neighboring first light emitting area EA1 is defined as a third center distance L3b, the first center distance L1b, the second center distance L2b, and the third center distance L3b may be different. For example, the second center distance L2b may be smaller than the first center distance L1 and the third center distance L3b.

In a display device 1 including the display panel 10b according to an embodiment, the areas of the light emitting areas EA1 through EA3 including first through third light emitting elements LE1 through LE3 emitting different light are different, but minimum distances (e.g., D1b, D2b, D3b and D4b) between the light emitting areas are the same. Therefore, a display device having high luminous efficiency can be realized.

Figure 28:
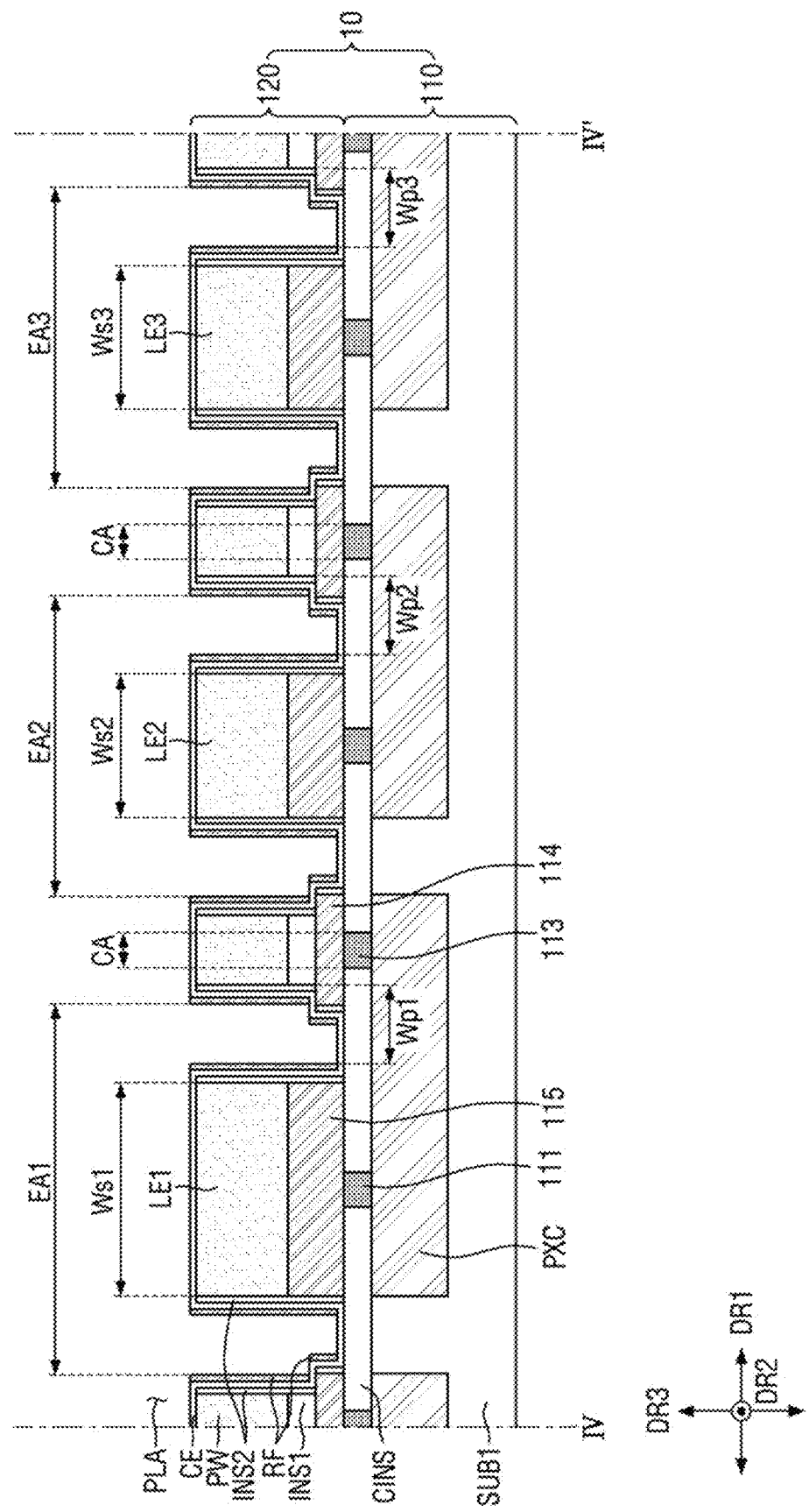
FIG. 28 is a cross-sectional view of an example of the display panel taken along the line IV-IV' of FIG. 27.

FIG. 28 is a cross-sectional view of an example of the display panel 10b taken along the line IV-IV' of FIG. 27.

Referring to FIG. 28, a display panel 10 is the same as that shown in FIGS. 7 and 8 in that it includes a semiconductor circuit board 110 and a light emitting element layer 120.

In a first light emitting area EA1, a pixel circuit unit PXC of a first substrate SUB1 may apply a pixel voltage to a pixel electrode 111 that is electrically connected to a first light emitting element LE1. In a common connection area CA adjacent to the first light emitting area EA1, the pixel circuit unit PXC may provide a common voltage to a common electrode CE by applying the common voltage to a common connection electrode 113 adjacent to the first light emitting element LE1. The first light emitting element LE1 may emit first light according to a voltage difference between the pixel voltage and the common voltage.

In a second light emitting area EA2, a pixel circuit unit PXC of the first substrate SUB1 may apply a pixel voltage to a pixel electrode 111 that is electrically connected to a second light emitting element LE2. In a common connection area CA adjacent to the second light emitting area EA2, the pixel circuit unit PXC may provide a common voltage to the common electrode CE by applying the common voltage to a common connection electrode 113 adjacent to the second light emitting element LE2. The second light emitting element LE2 may emit second light according to a voltage difference between the pixel voltage and the common voltage.

In a third light emitting area EA3, a pixel circuit unit PXC of the first substrate SUB1 may apply a pixel voltage to a pixel electrode 111 that is electrically connected to a third light emitting element LE3. In a common connection area CA adjacent to the third light emitting area EA3, the pixel circuit unit PXC may provide a common voltage to the common electrode CE by applying the common voltage to a common connection electrode 113 adjacent to the third light emitting element LE3. The third light emitting element LE3 may emit third light according to a voltage difference between the pixel voltage and the common voltage.

A width of the first light emitting area EA1 in a direction may be greater than a width of the second light emitting area EA2 in the direction and a width of the third light emitting area EA3 in the direction. The widths of the second light emitting area EA2 and the third light emitting area EA3 in the direction may be the same, but embodiments of the present disclosure are not limited thereto.

Similarly, a width Ws1 of the first light emitting element LE1 included in the first light emitting area EA1 in a direction may be greater than a width Ws2 of the second light emitting element LE2 included in the second light emitting area EA2 in the direction and a width Ws3 of the third light emitting element LE3 included in the third light emitting area EA3 in the direction. The width Ws2 of the second light emitting element LE2 in the direction and the width Ws3 of the third light emitting element LE3 in the direction may be the same, but embodiments of the present disclosure are not limited thereto.

A distance Wp1 between the first light emitting element LE1 and a partition wall PW adjacent thereto may be the same as a distance Wp2 between the second light emitting element LE2 and the partition wall PW adjacent thereto and a distance Wp3 between the third light emitting element LE3 and the partition wall PW adjacent thereto.

Because a display device 1 according to an embodiment includes the first light emitting element LE1 emitting the first light, the second light emitting element LE2 emitting the second light, and the third light emitting element LE3 emitting the third light, the display device 1 can display various colors without a wavelength conversion layer or color filters. Therefore, process efficiency can be improved or maximized.

In addition, because the luminous efficiency of each light emitting element itself can be utilized, a display device having higher efficiency can be realized.

In addition, the area (or width in a direction) of the first light emitting element LE1 may be increased in order to increase the luminous efficiency of the first light emitting element LE1 emitting the first light (e.g., light in a red wavelength band), but minimum distances (e.g., D1$b$, D2$b$, D3$b$ and D4$b$) between the light emitting elements LE1 through LE3 may be kept constant.

Figure 29:
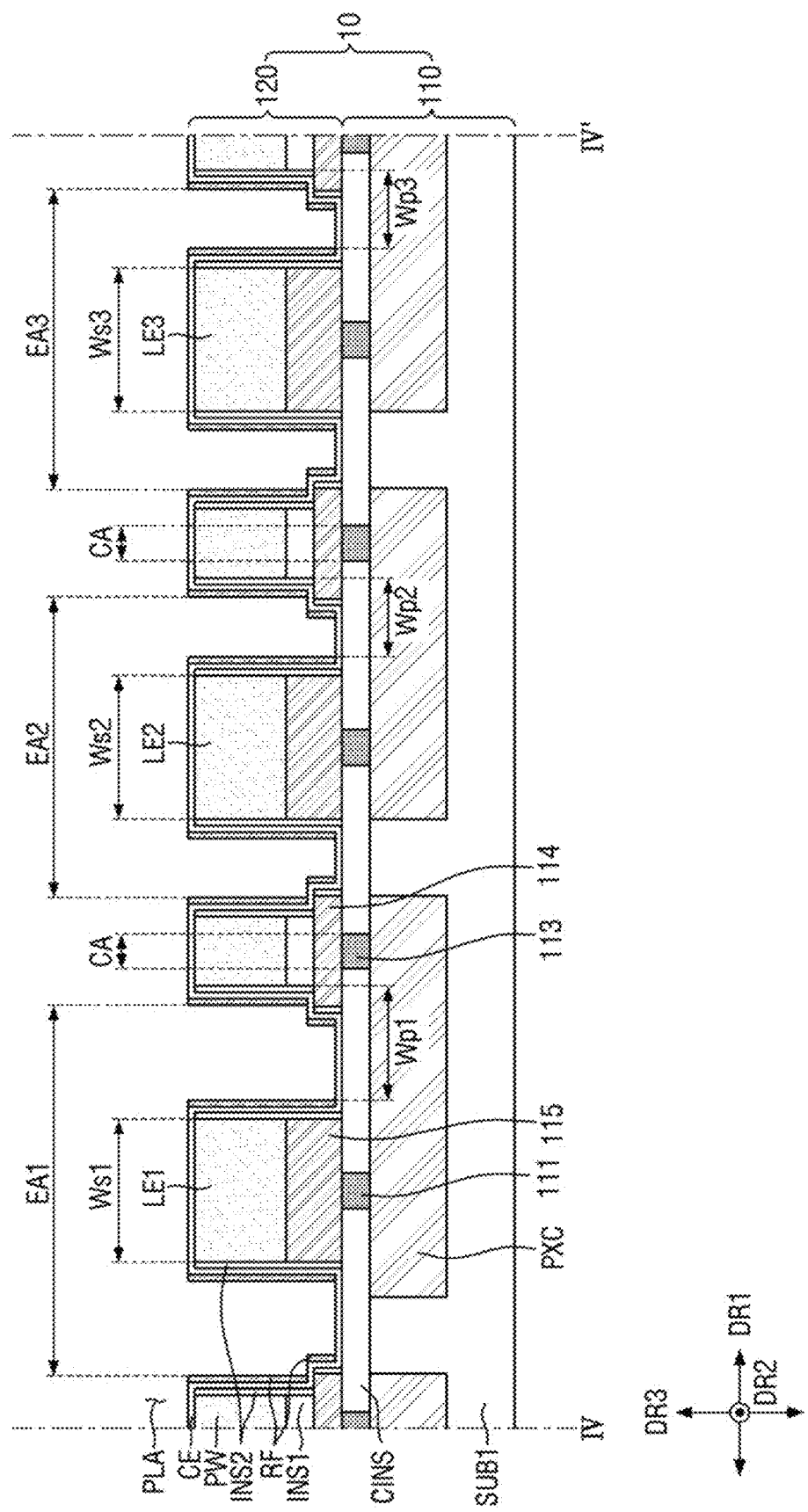
FIG. 29 is a cross-sectional view of another example of the display panel taken along the line IV-IV' of FIG. 27.

FIG. 29 is a cross-sectional view of another example of the display panel 10$b$ taken along the line IV-IV' of FIG. 27.

The embodiment shown in FIG. 29 is the same as the embodiment shown in FIG. 28 in that a width of a first light emitting area EA1 in a direction is greater than a width of a second light emitting area EA2 in the direction and a width of a third light emitting area EA3 in the direction but is different from the embodiment shown in FIG. 28 in that a width Ws1 of a first light emitting element LE1 in the direction is the same as a width Ws2 of a second light emitting element LE2 in the direction and a width Ws3 of a third light emitting element LE3 in the direction.

In addition, the embodiment shown in FIG. 29 is different from the embodiment shown in FIG. 28 in that a distance Wp1 between the first light emitting element LE1 and a partition wall PW adjacent thereto is greater than a distance Wp2 between the second light emitting element LE2 and the partition wall PW adjacent thereto and a distance Wp3 between the third light emitting element LE3 and the partition wall PW adjacent thereto. Although the distance Wp2 between the second light emitting element LE2 and the partition wall PW adjacent thereto and the distance Wp3 between the third light emitting element LE3 and the partition wall PW adjacent thereto are the same, embodiments of the present disclosure are not limited thereto.

In a display device 1 according to the illustrated embodiment, the area of the first light emitting area EA1 may be increased in order to increase the luminous efficiency of the first light emitting area EA1 emitting first light (e.g., light in a red wavelength band), but minimum distances (e.g., D1$b$, D2$b$, D3$b$ and D4$b$) between the light emitting areas EA1 through EA3 may be kept constant.

Embodiments of various planar shapes of a plurality of light emitting areas EA1 through EA3 will now be described with reference to FIGS. 30 through 42.

FIGS. 30 through 42 are examples of various plan layout views of pixels of a display panel according to embodiments.

Figure 30:
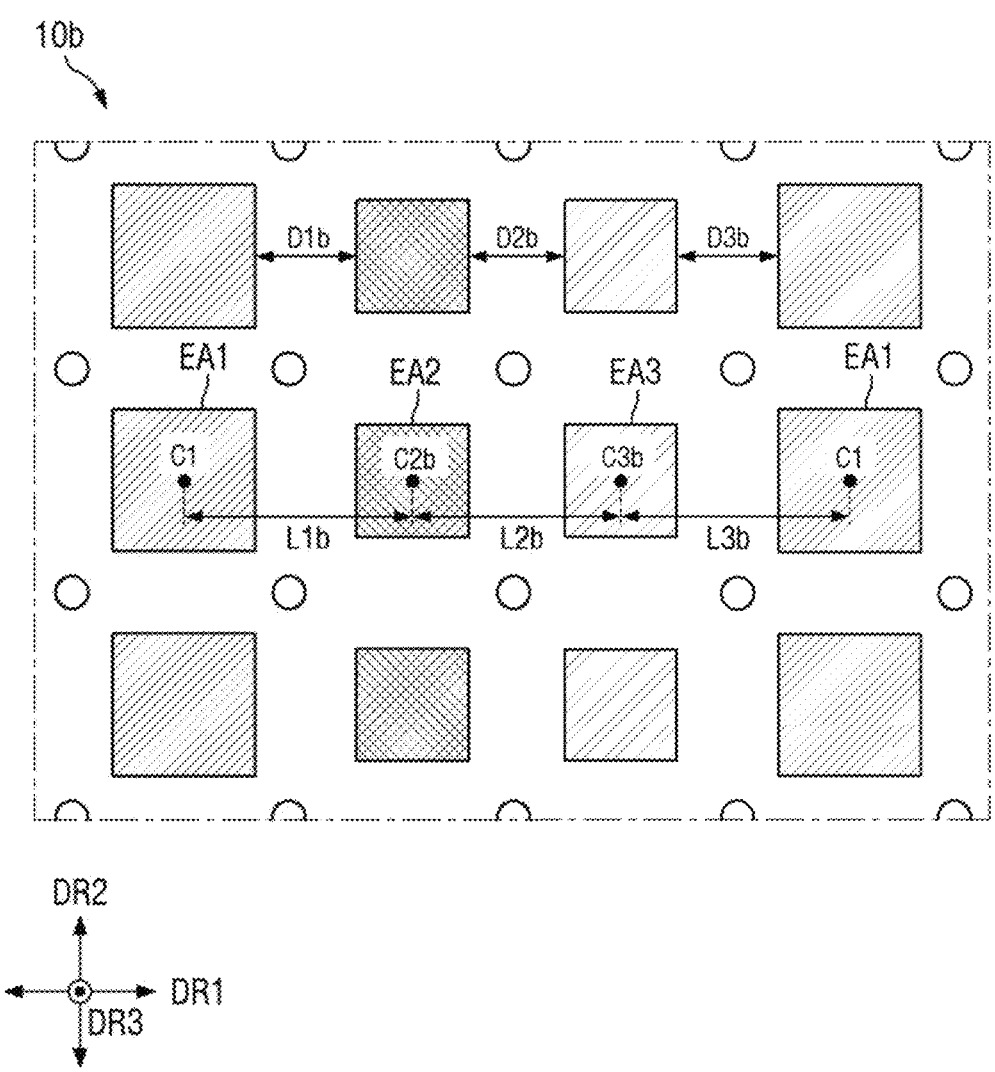
FIGS. 30 through 42 are examples of various plan layout views of pixels of a display panel according to embodiments.

The embodiment shown in FIG. 30 is the same as the embodiment shown in FIG. 27 in that each of a plurality of light emitting areas EA1 through EA3 has a quadrangular planar shape having four sides but is different from the embodiment shown in FIG. 27 in that four angles form right angles.

Figure 31:
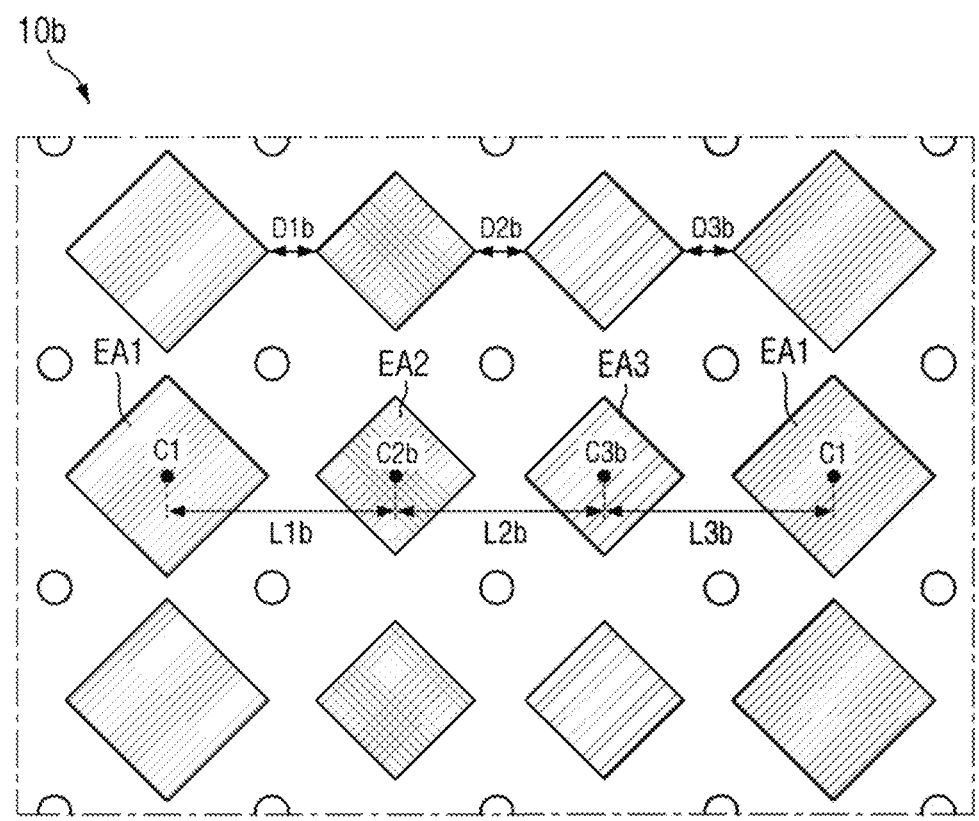
Figure 31:
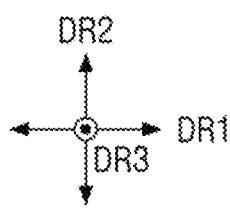

Referring to FIG. 31, each of a plurality of light emitting areas EA1 through EA3 may have a diamond planar shape having four sides.

Figure 32:
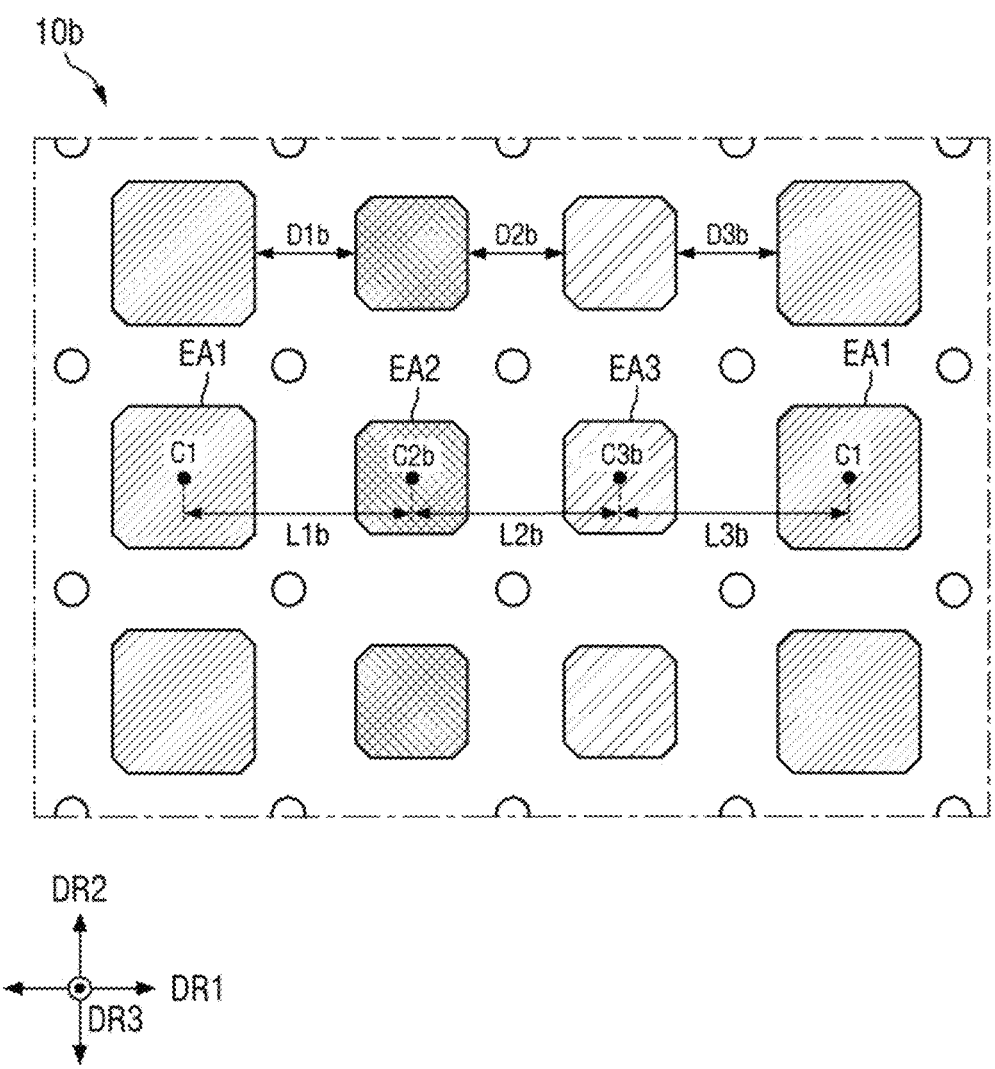

Referring to FIG. 32, each of a plurality of light emitting areas EA1 through EA3 may have an octagonal planar shape having eight sides. In each of the light emitting area EA1 through EA3, sides extending in the first direction DR1 and the second direction DR2 may be longer than sides extending in the first diagonal direction DDR1 and the second diagonal direction DDR2.

Figure 33:
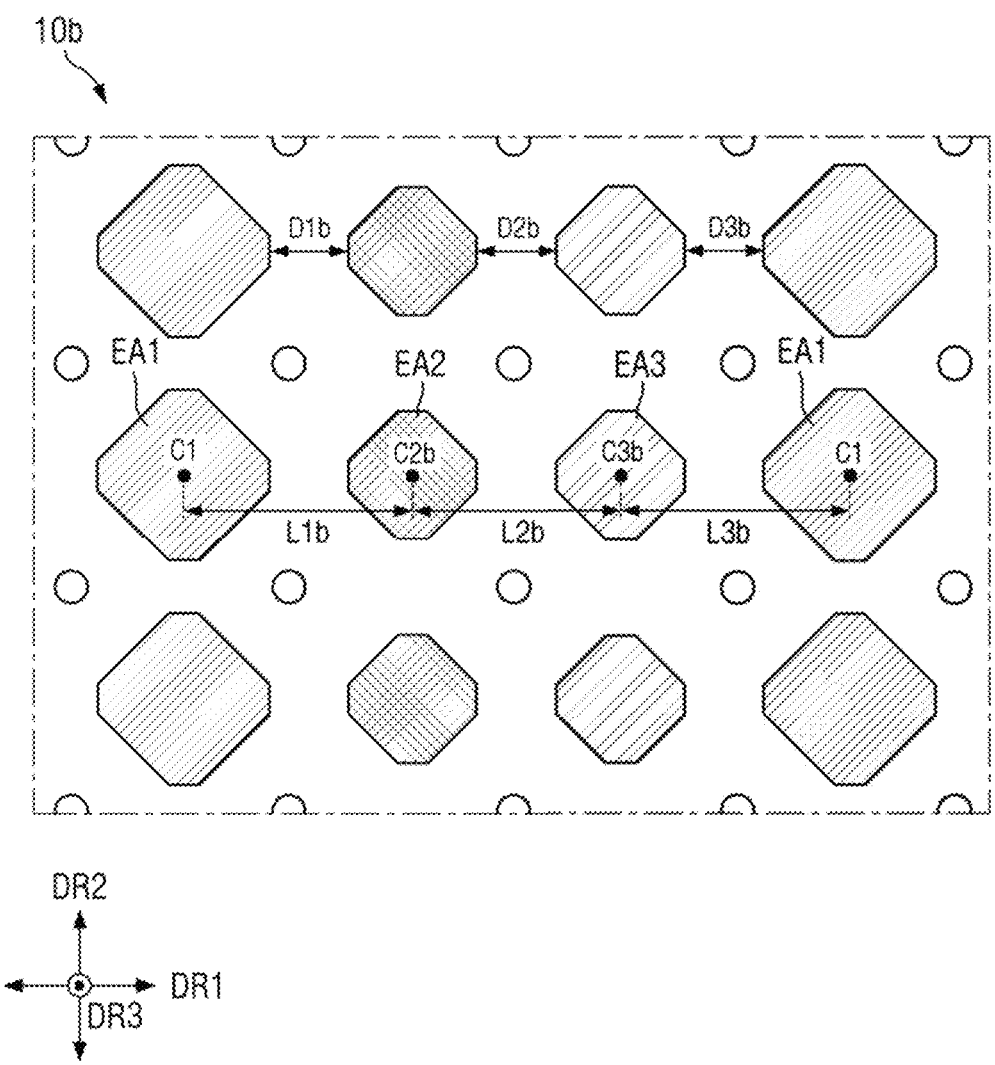

Referring to FIG. 33, each of a plurality of light emitting areas EA1 through EA3 may have an octagonal planar shape having eight sides. In each of the light emitting area EA1 through EA3, sides extending in the first direction DR1 and the second direction DR2 may be shorter than sides extending in the first diagonal direction DDR1 and the second diagonal direction DDR2.

Figure 34:
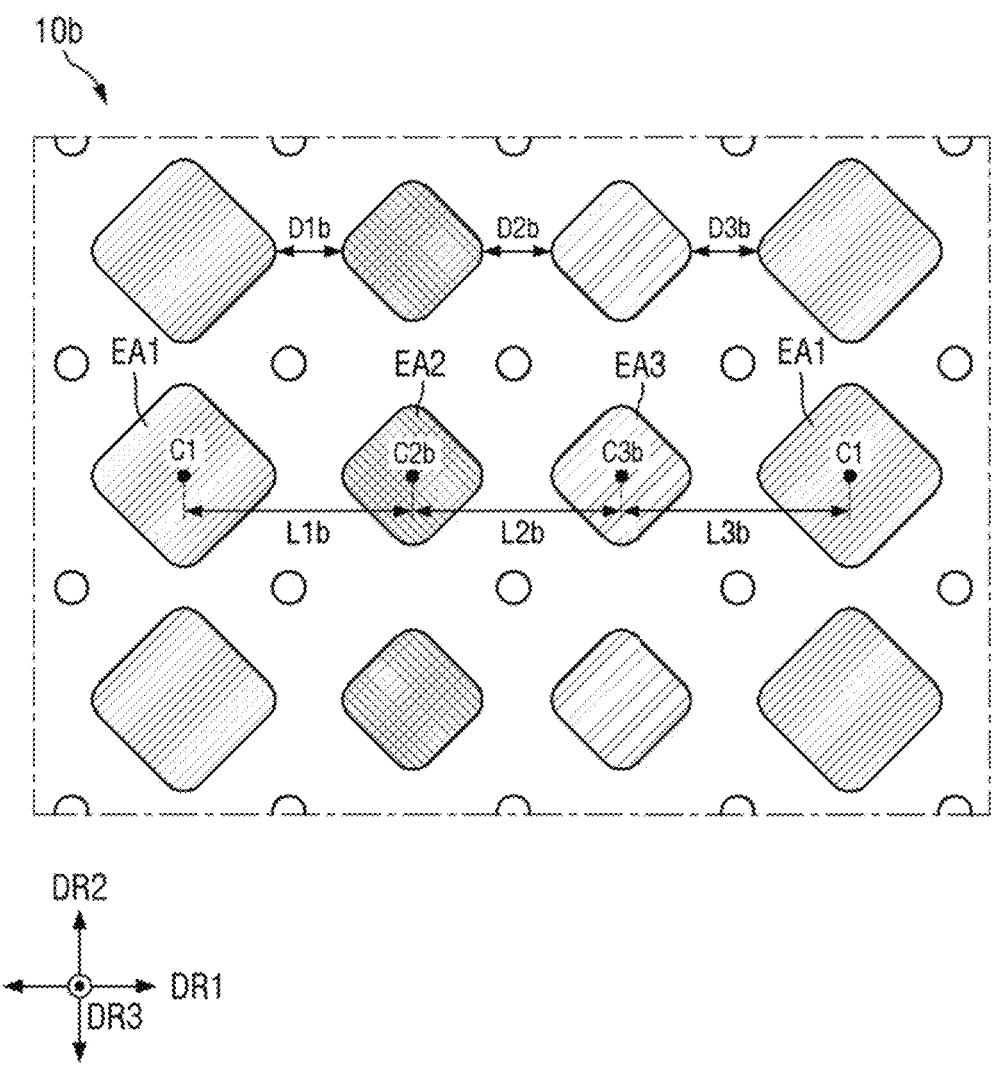

Referring to FIG. 34, each of a plurality of light emitting areas EA1 through EA3 may have a diamond planar shape having four sides but modified to have outwardly rounded vertices. For example, each of the light emitting areas EA1 through EA3 shown in FIG. 34 may have an irregular planar shape including curved parts.

Figure 35:
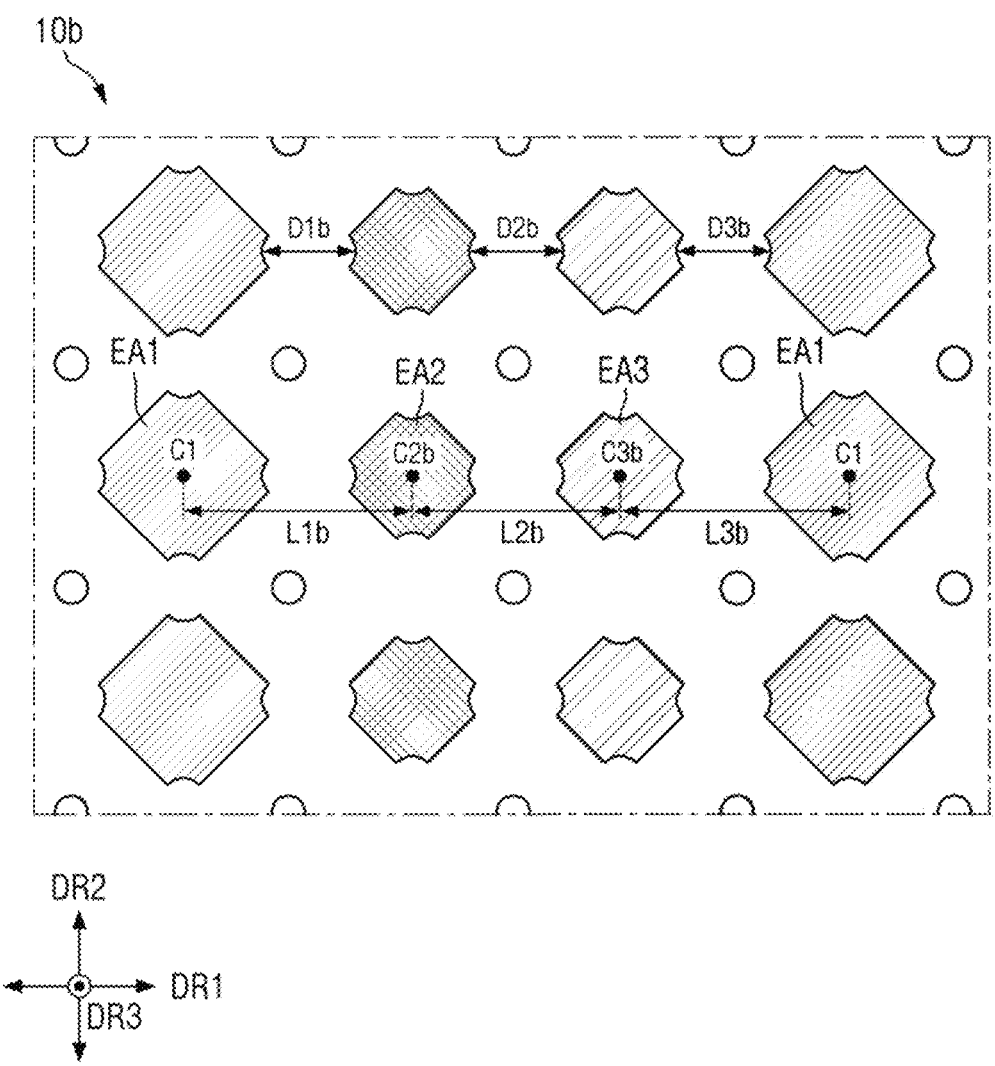

Referring to FIG. 35, each of a plurality of light emitting areas EA1 through EA3 may have an octagonal planar shape having eight sides. In this embodiment, four sides parallel to the first direction DR1 and the second direction DR2 may have an inwardly rounded shape, and four sides parallel to the first diagonal direction DDR1 and the second diagonal direction DDR2 may have a line shape. For example, each of the light emitting areas EA1 through EA3 shown in FIG. 35 may have an irregular planar shape in which four sides have a line shape and four sides have a rounded shape.

Figure 36:
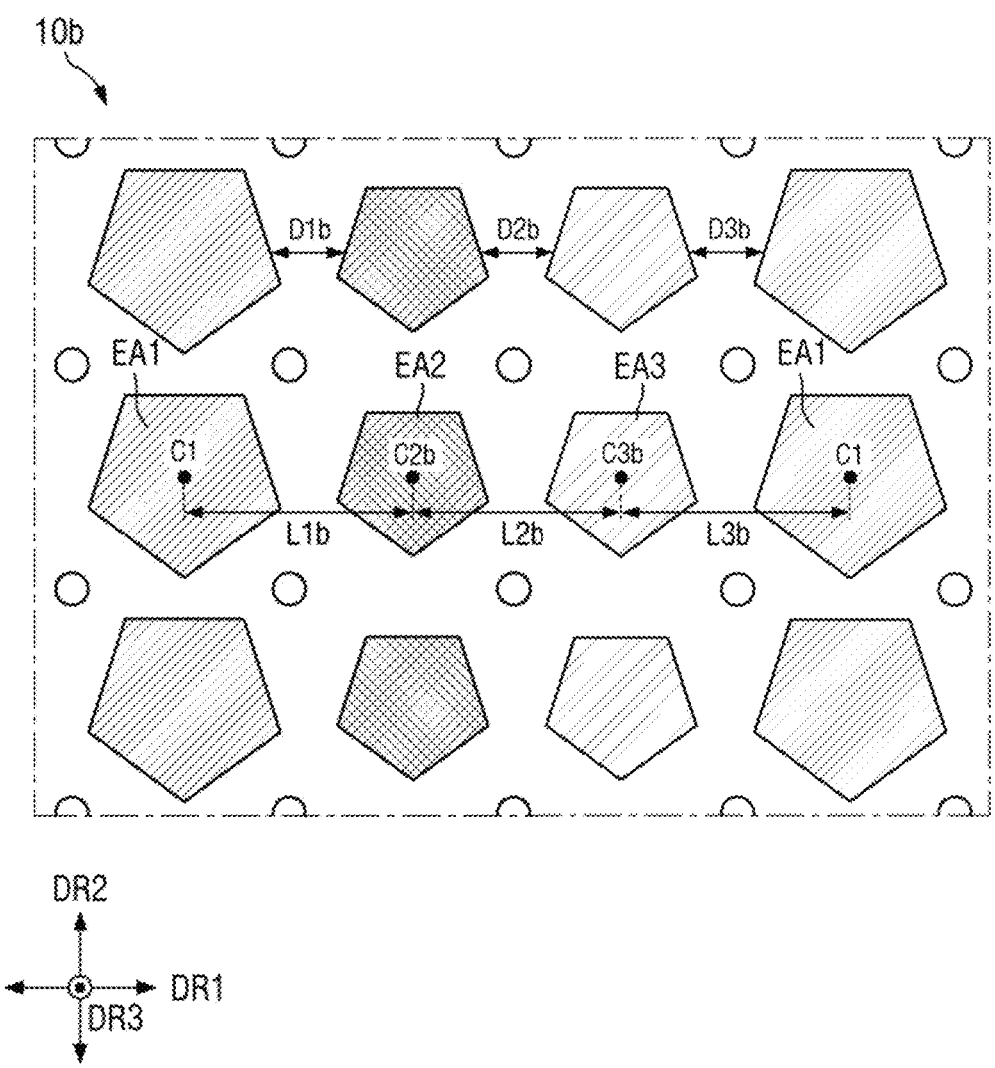

Referring to FIG. 36, each of a plurality of light emitting areas EA1 through EA3 may have a pentagonal planar shape having five sides. Each of the light emitting areas EA1 through EA3 may have a pentagonal planar shape in which one side is parallel to the first direction DR1 and a vertex facing the one side is disposed below the one side.

Figure 37:
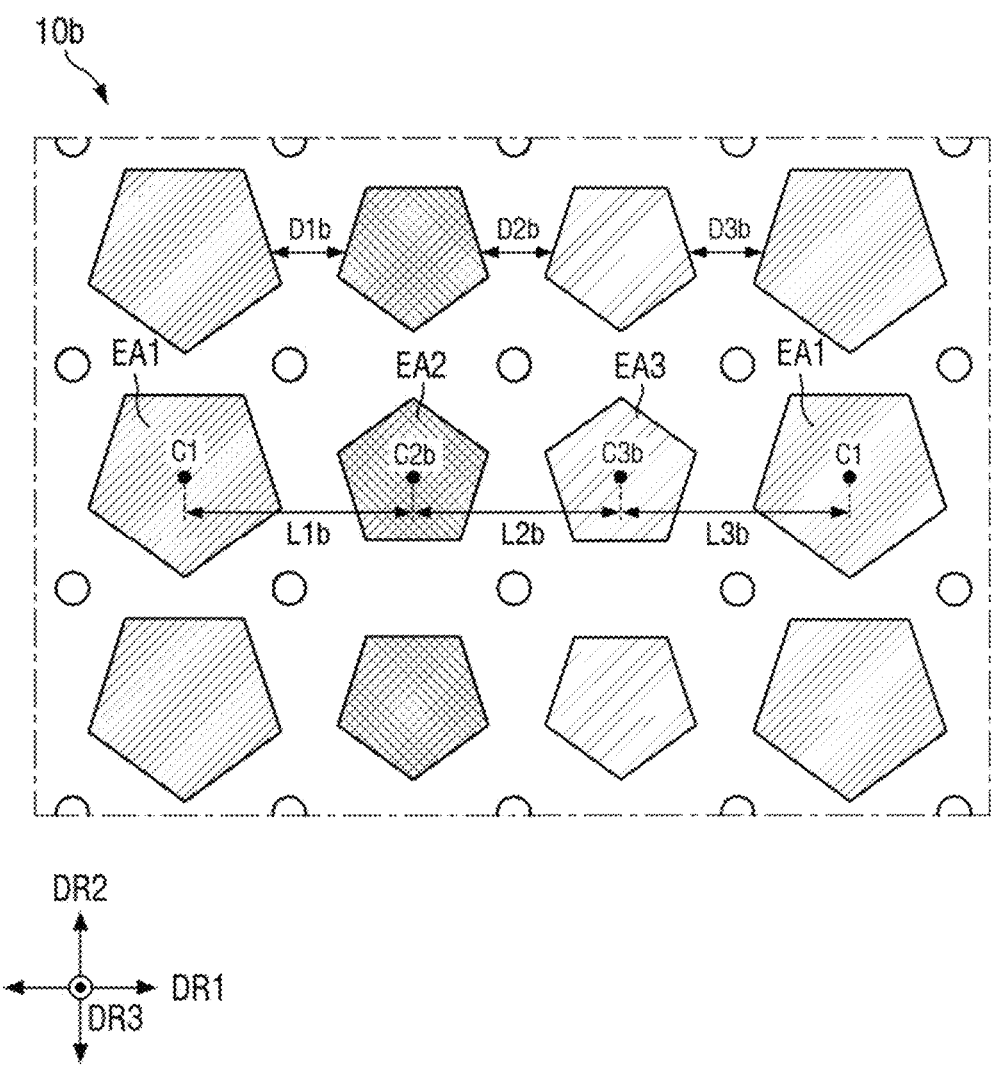

Referring to FIG. 37, each of a plurality of light emitting areas EA1 through EA3 may have a pentagonal planar shape, but light emitting areas disposed in a first row and a third row may have a different planar shape from light emitting areas disposed in a second row. For example, first light emitting areas EA1, second light emitting areas EA2, and third light emitting areas EA3 disposed in the first row and the third row may have a pentagonal shape in which one side is parallel to the first direction DR1 and a vertex facing the one side is disposed below the one side. On the other hand, the first light emitting areas EA1 disposed in the second row may have a pentagonal shape in which one side is parallel to the first direction DR1 and a vertex facing the one side is disposed below the one side, and the second light emitting areas EA2 and the third light emitting areas EA3 disposed in the second row may have a pentagonal shape in which one side is parallel to the first direction DR1 and a vertex facing the one side is disposed above the one side.

Figure 38:
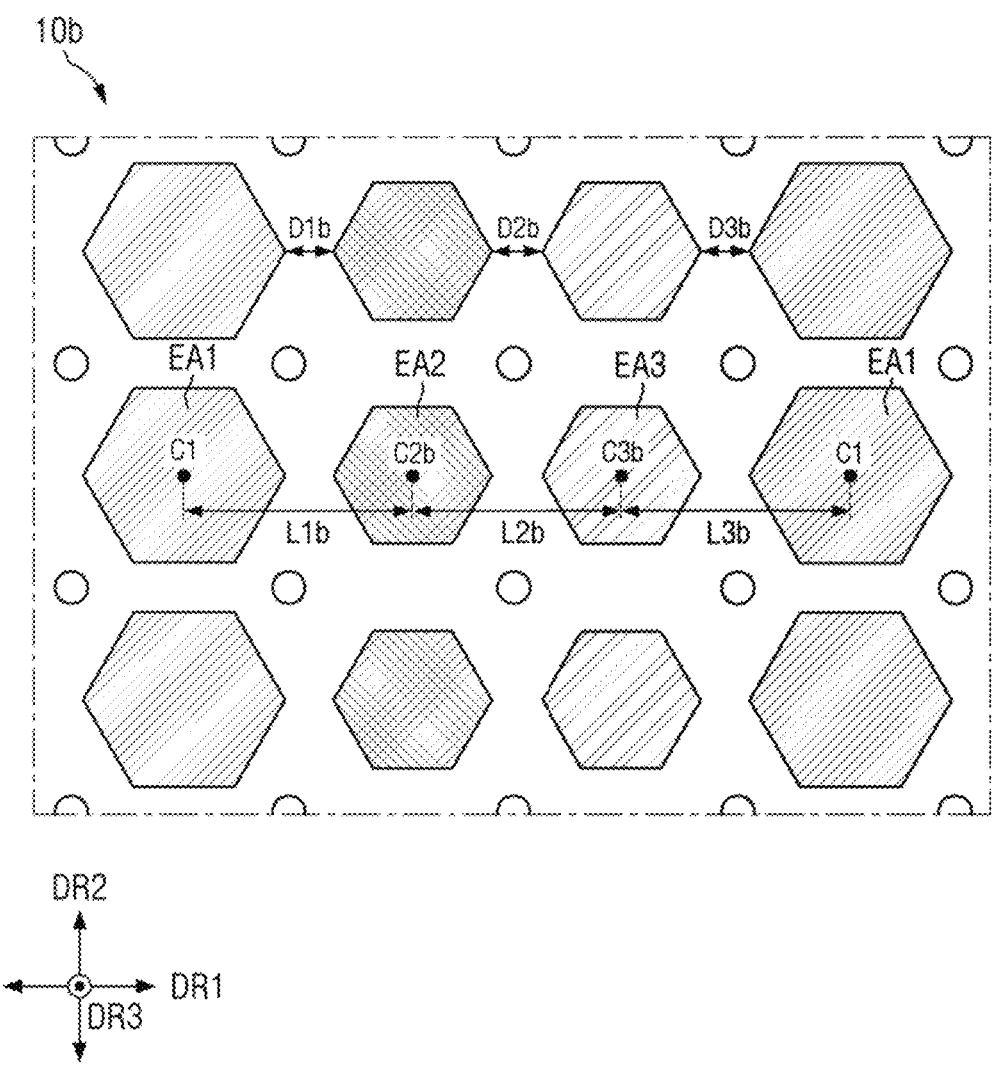

Referring to FIG. 38, each of a plurality of light emitting areas EA1 through EA3 may have a hexagonal planar shape having six sides. Each of the light emitting areas EA1 through EA3 may have a hexagonal planar shape having two sides parallel to the first direction DR1.

Figure 39:
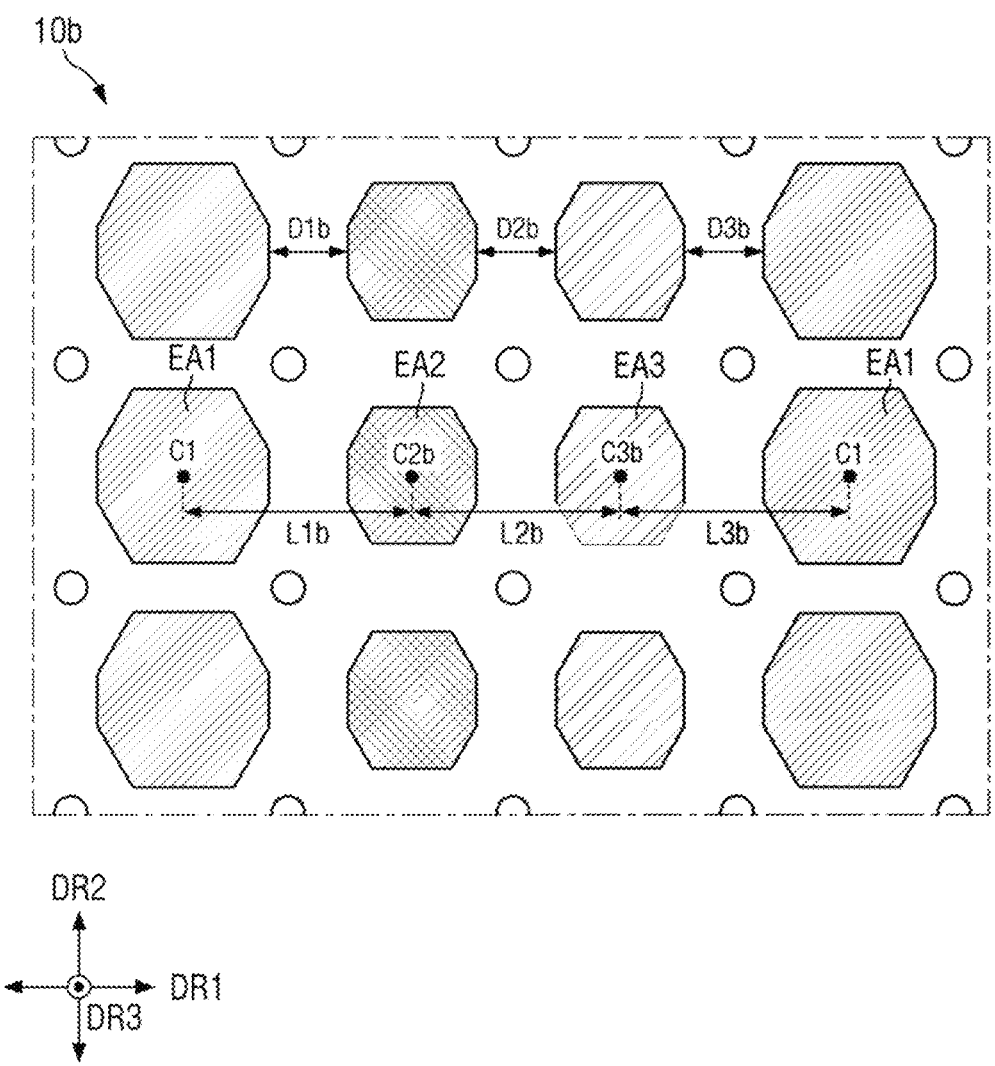

Referring to FIG. 39, each of a plurality of light emitting areas EA1 through EA3 may have an octagonal planar shape having eight sides. In each of the light emitting areas EA1 through EA3, two sides parallel to the first direction DR1 may be shorter than two sides parallel to the second direction DR2.

Figure 40:
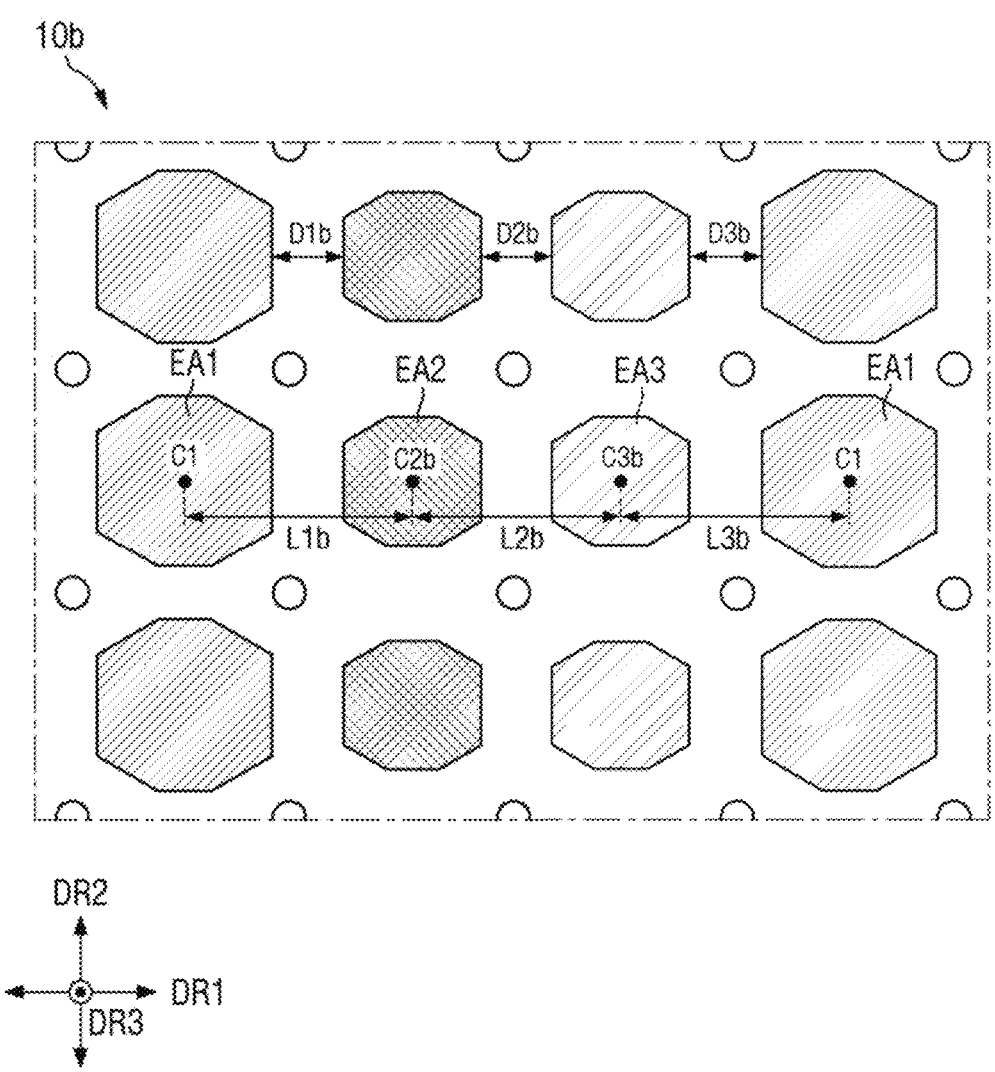

Referring to FIG. 40, each of a plurality of light emitting areas EA1 through EA3 may have an octagonal planar shape having eight sides. In each of the light emitting areas EA1 through EA3, two sides parallel to the first direction DR1 may be longer than two sides parallel to the second direction DR2.

Figure 41:
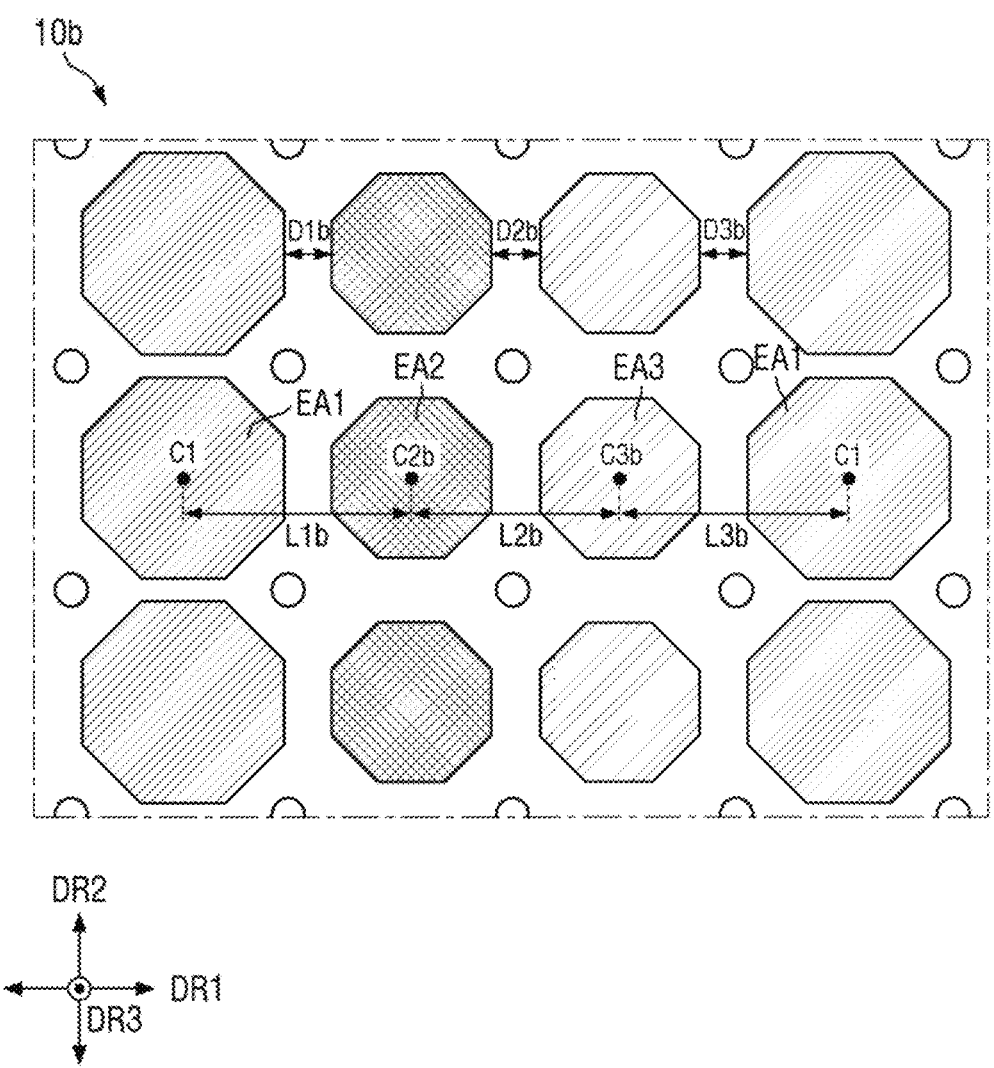

Referring to FIG. 41, each of a plurality of light emitting areas EA1 through EA3 may have a regular octagonal planar shape having eight sides, in which two sides parallel to the first direction DR1, two sides parallel to the second direction DR2, two sides parallel to the first diagonal direction DDR1, and two sides parallel to the second diagonal direction DDR2 have the same distance. However, embodiments of the present disclosure are not limited thereto, and each of the light emitting areas EA1 through EA3 may also have an octagonal planar shape modified to have outwardly rounded vertices.

Figure 42:
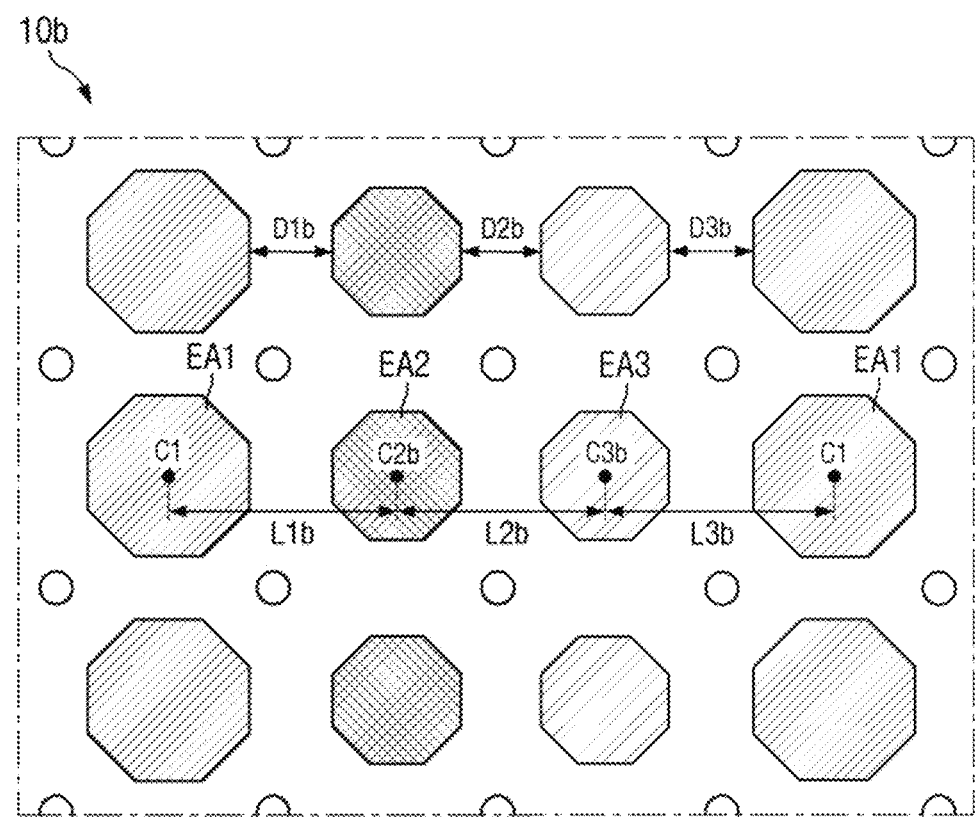
Figure 42:
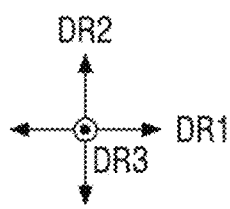

Referring to FIG. 42, each of a plurality of light emitting areas EA1 through EA3 may have an octagonal planar shape having eight sides. Because the area of each of the light emitting areas EA1 through EA3 is reduced, a distance between the light emitting areas may increase.

In FIGS. 30 through 42, because a center point C2b of the second light emitting area EA2 and a center point C3b of the third light emitting area EA3 are disposed adjacent to each other, a second center distance L2b may be greater than a first center distance L1b and a third center distance L3b. In addition, a first distance D1b, a second distance D2b, and a third distance D3b may be the same.

Accordingly, even when the area of the first light emitting area EA1 emitting first light (e.g., light in a red wavelength band) is larger than the areas of the second and third light emitting areas EA2 and EA3 emitting second light and third light, because minimum distances between the light emitting areas are the same, a display device having high luminous efficiency can be realized.

Figure 43:
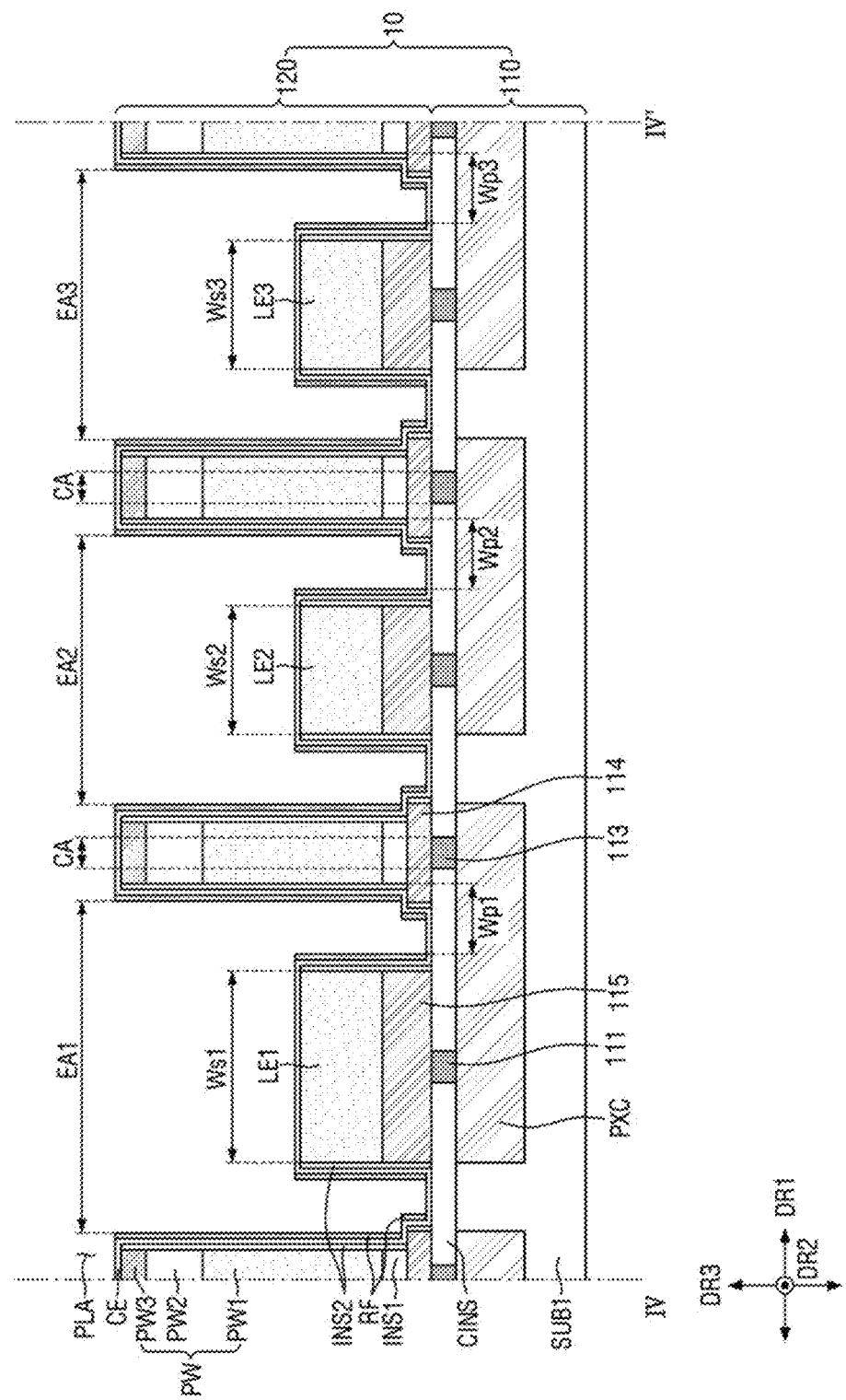
FIG. 43 is a cross-sectional view of a display device according to an embodiment.

A cross-sectional view of a display device 1 according to an embodiment will now be described. FIG. 43 is a cross-sectional view of a display device 1 according to an embodiment.

Referring to FIG. 43, the illustrated embodiment is different from the previously-described embodiments in that a partition wall PW of a light emitting element layer 120 includes a first partition wall PW1, a second partition wall PW2, and a third partition wall PW3.

Because the first partition wall PW1 is formed in the same process as light emitting elements LE, at least a part of the first partition wall PW1 may include the same material as the light emitting elements LE.

For example, the first partition wall PW1 may include a plurality of sub-partition walls SPW1 through SPW6 sequentially stacked in the third direction DR3. Different from the embodiment shown in FIG. 10, the first partition wall PW1 may include a sixth sub partition wall SPW6 in addition to first through fifth sub-partition walls SPW1 through SPW5.

The sixth sub-partition wall SPW6 may be made of a semiconductor layer not doped with a dopant, that is, an undoped semiconductor layer. For example, the sixth sub-partition wall SPW6 may be GaN not doped with a dopant. A thickness of the sixth sub-partition wall SPW6 may be greater than a thickness of a second semiconductor layer SEM2 of any one of first through third light emitting elements LE1 through LE3. The thickness of the sixth sub-partition wall SPW6 may be about 2 to about 3 μm.

The second partition wall PW2 may be disposed on the first partition wall PW1. The second partition wall PW2 may be made of an inorganic layer, such as a silicon oxide layer ($SiO_2$), an aluminum oxide layer ($Al_2O_3$), or a hafnium oxide layer ($HfO_x$). A thickness of the second partition wall PW2 may be about 1 to about 2 μm.

The third partition wall PW3 may be disposed on the second partition wall PW2. The third partition wall PW3 may include a conductive material, such as nickel (Ni). A thickness of the third partition wall PW3 may be about 0.01 to about 1 μm.

The second partition wall PW2 and the third partition wall PW3 may act as a mask for preventing the first partition wall PW1 from being etched in a manufacturing process for forming the light emitting elements and the partition wall PW.

Accordingly, a height of the partition wall PW may be greater than heights of the first through third light emitting elements LE1 through LE3.

In the display device 1 according to an embodiment, because the height of the partition wall PW is greater than the heights of the first through third light emitting elements LE1 through LE3, scattering between light can be suppressed even when a wavelength conversion layer or color filters are disposed. In addition, an optical material, such as an optical lens, can be stably placed on an upper surface of the display device 1.

Figure 44:
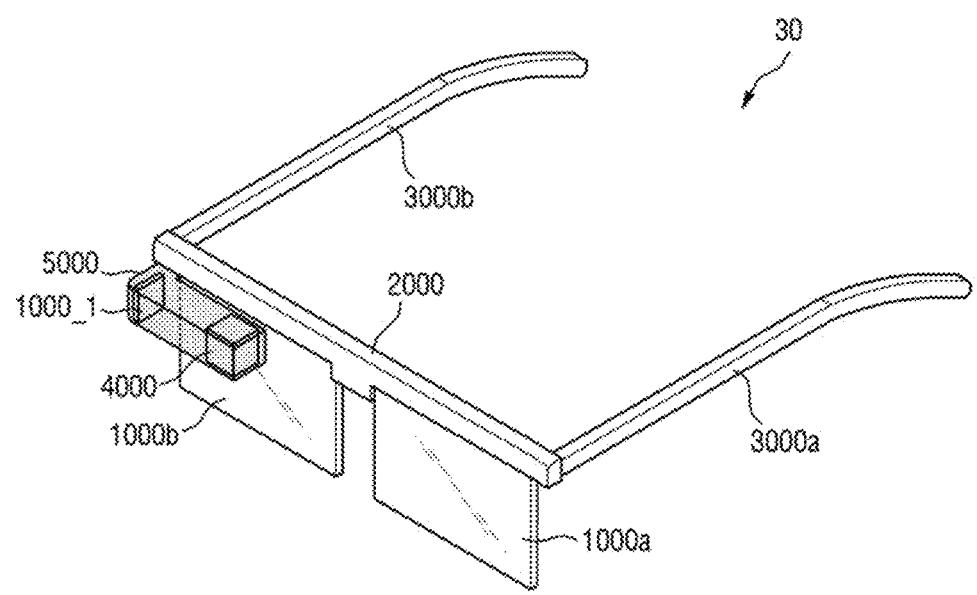
FIG. 44 is a view illustrating a virtual reality (VR) device including a display device according to an embodiment.

FIG. 44 is a view illustrating a virtual reality (VR) device including a display device according to an embodiment. FIG. 44 illustrates a VR device 30 to which a display device 1000_1 according to an embodiment is applied.

Referring to FIG. 44, the VR device 30 according to an embodiment may be a device in the form of glasses. The VR device 30 may include the display device 1000_1, a left lens 1000a, a right lens 1000b, a support frame 2000, eyeglass frame legs 3000a and 3000b, a reflective member 4000, and a display device accommodating unit 5000.

In FIG. 44, the VR device 30 including the eyeglass frame legs 3000a and 3000b is illustrated as an example. However, the VR device 30 according to the embodiment may also be applied to a head-mounted display including a head-mounted band, which can be mounted on the head, instead of the eyeglass frame legs 3000a and 3000b. For example, the VR device 30 according to an embodiment is not limited to that illustrated in FIG. 44 and can be applied in various forms to various other electronic devices.

The display device accommodating unit 5000 may include the display device 1000_1 and the reflective member 4000. An image displayed on the display device 1000_1 may be reflected by the reflective member 4000 and provided to a user's right eye through the right lens 1000b. Accordingly, the user may view a VR image displayed on the display device 1000_1 through the right eye.

The display device accommodating unit 5000 is disposed at a right end of the support frame 2000 in FIG. 44, but embodiments of the present disclosure are not limited thereto. For example, the display device accommodating unit 5000 may also be disposed at a left end of the support frame 2000. In such an embodiment, an image displayed on the display device 1000_1 may be reflected by the reflective member 4000 and provided to the user's left eye through the left lens 1000a. Accordingly, the user may view a VR image displayed on the display device 1000_1 through the left eye. In other embodiments, the display device accommodating unit 5000 may be disposed at both the left end and the right end of the support frame 2000. In such an embodiment, the user may view a VR image displayed on the display device 1000_1 through both the left eye and the right eye.

Figure 45:
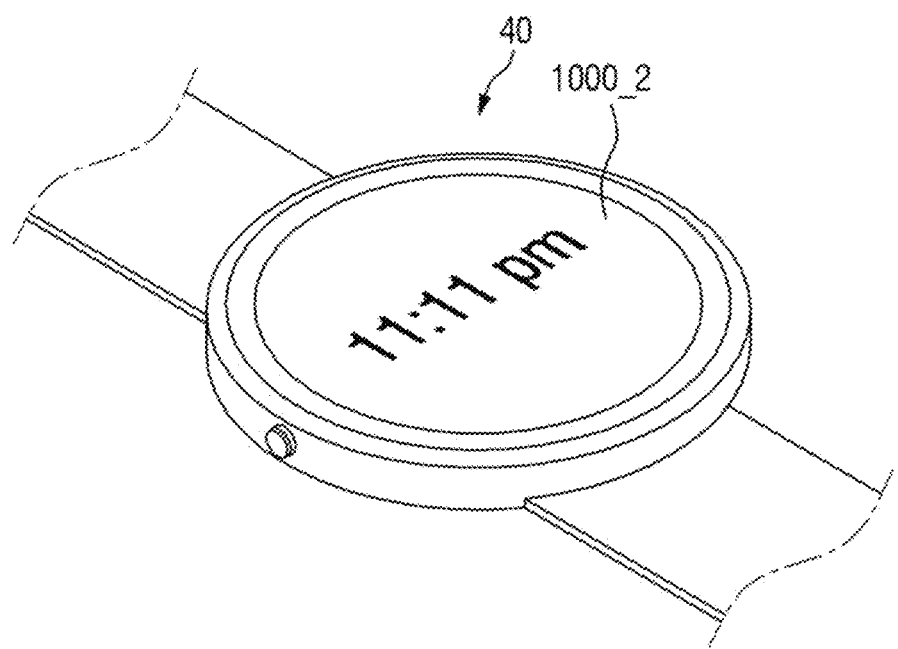
FIG. 45 is a view illustrating a smart device to which a display device according to an embodiment is applied.

FIG. 45 is a view illustrating a smart device to which a display device 1000_2 according to an embodiment is applied.

Referring to FIG. 45, the display device 1000_2 according to an embodiment may be applied to a smart watch 40, which is one of smart devices.

Figure 46:
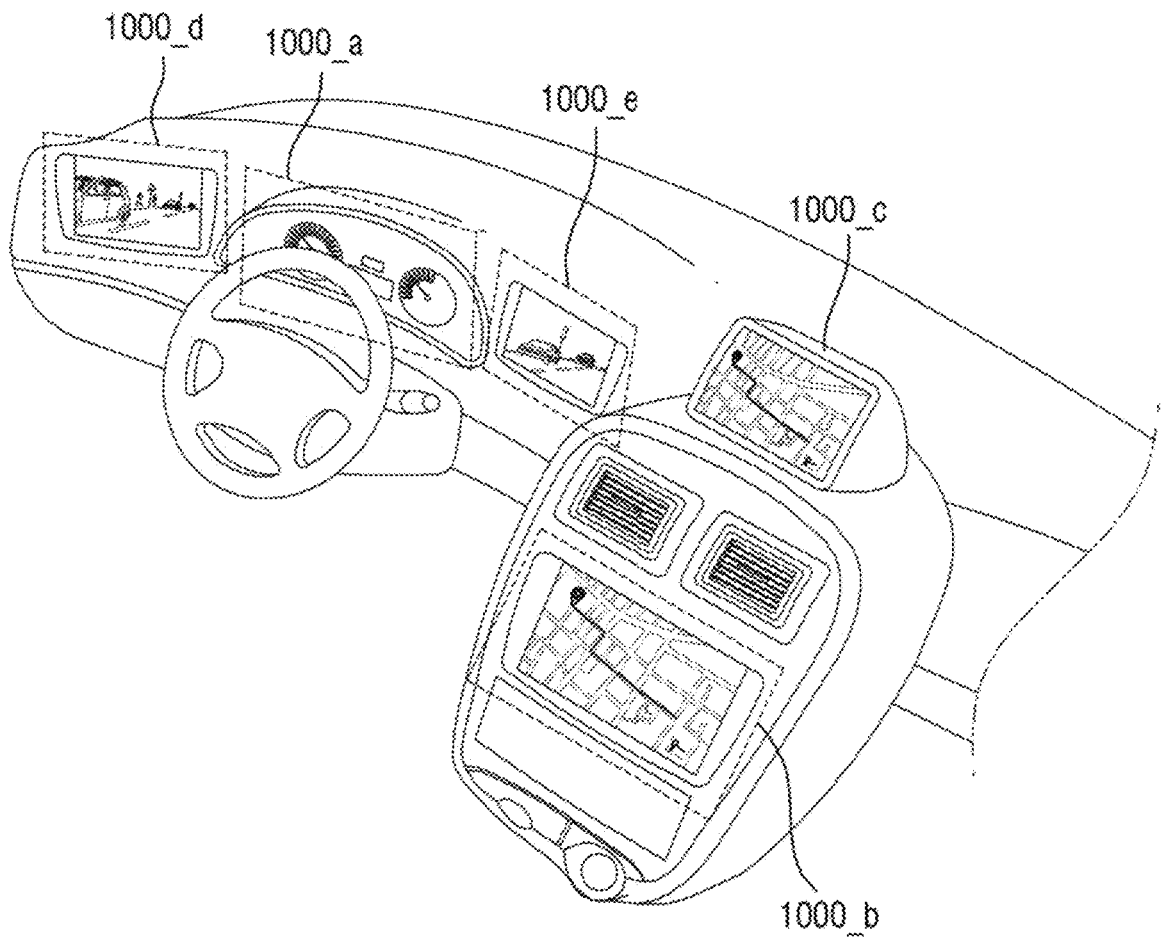
FIG. 46 is a view illustrating a dashboard and a center fascia of a vehicle including display devices according to an embodiment.

FIG. 46 is a view illustrating a dashboard and a center fascia of a vehicle including display devices according to an embodiment. FIG. 46 illustrates a vehicle to which display devices 1000_a through 1000_e according to an embodiment are applied.

Referring to FIG. 46, the display devices 1000_a through 1000_c according to an embodiment may be applied to a dashboard of a vehicle, a center fascia of the vehicle, and/or a center information display (CID) disposed on the dashboard of the vehicle. In addition, the display devices 10_d and 10_e according to an embodiment may be applied to room mirror displays that replace side mirrors of the vehicle.

Figure 47:
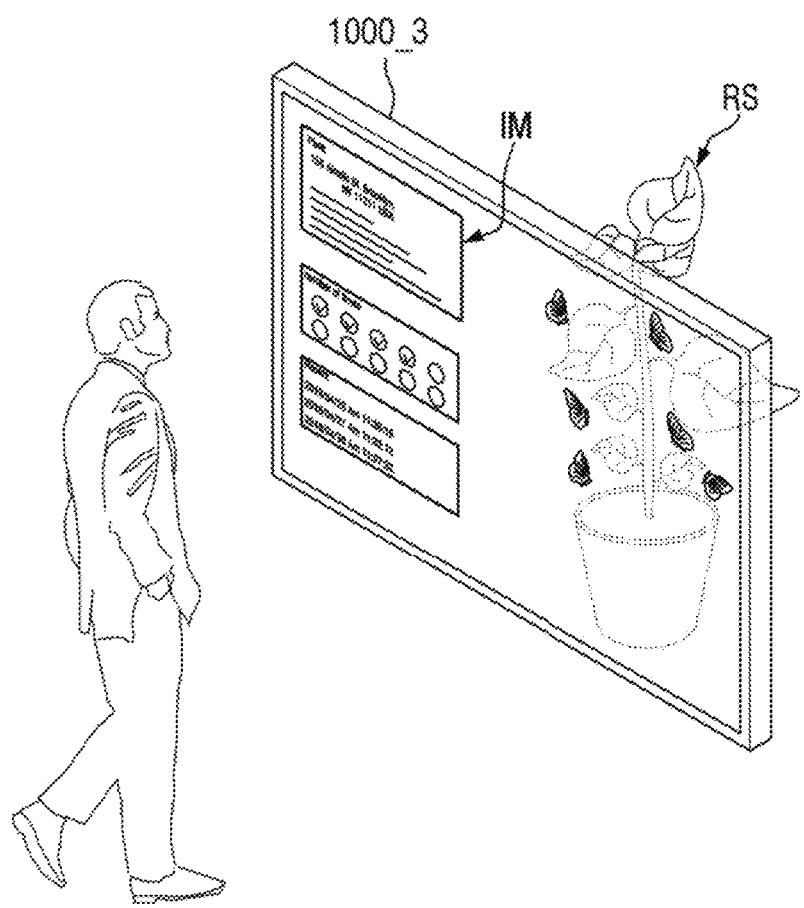
FIG. 47 is a view illustrating a transparent display device including a display device according to an embodiment.

FIG. 47 is a view illustrating a transparent display device including a display device 1000_3 according to an embodiment.

Referring to FIG. 47, the display device 1000_3 according to an embodiment may be applied to the transparent display device. The transparent display device may transmit light while displaying an image IM. Therefore, a user located in front of the transparent display device may not only view the image IM displayed on the display device 1000_3 but also view an object RS and/or the background located behind the transparent display device. When the display device 1000_3 is applied to the transparent display device, a first substrate SUB1 (see, e.g., FIG. 7) of the display device 1000_3 may include a light transmitting part that can transmit light or may be made of a material that can transmit light.

In a display device according to embodiments, the area of light emitted by a micro light emitting diode emitting red light may be increased. Accordingly, a display device having high luminous efficiency can be provided.

However, the aspects and features of the present disclosure are not restricted to those set forth herein. The above and other aspects and features of the present disclosure will become more apparent to one of ordinary skill in the art to which the present disclosure pertains by referencing the claims and their equivalents.

What is claimed is:

1. A display device comprising:
   a substrate;
   a partition wall on the substrate and comprising a first part of a reflective film at an outer surface thereof;
   a plurality of light emitting areas on the substrate, the light emitting areas comprising a first light emitting area, a second light emitting area, and a third light emitting area partitioned by the partition wall;
   a first light emitting element in the first light emitting area, comprising a second part of the reflective film at an outer surface thereof, and configured to emit first light;
   a second light emitting element in the second light emitting area and configured to emit second light; and
   a third light emitting element in the third light emitting area and configured to emit third light,
   wherein the first part of the reflective film is separated from the second part of the reflective film,
   wherein an area of the first light emitting area is larger than an area of the first light emitting element such that the second part of the reflective film at the outer surface of the first light emitting element faces the first part of the reflective film at the outer surface of the partition wall defining the first light emitting area, and
   wherein the area of the first light emitting area is larger than an area of the second light emitting area and an area of the third light emitting area.

2. The display device of claim 1, wherein, when a minimum distance between the first light emitting area and the third light emitting area is defined as a first distance and a minimum distance between the second light emitting area and the third light emitting area is defined as a second distance, the first distance and the second distance are the same.

3. The display device of claim 2, wherein the light emitting areas further comprise:
   a fourth light emitting area comprising the first light emitting element; and
   a fifth light emitting area comprising the second light emitting element and having a larger area than the fourth light emitting area, and
   wherein, when a minimum distance between the fourth light emitting area and the third light emitting area is defined as a third distance and a minimum distance between the fifth light emitting area and the third light emitting area is defined as a fourth distance, the third distance and the fourth distance are the same.

4. The display device of claim 3, wherein the first distance, the second distance, the third distance, and the fourth distance are the same.

5. The display device of claim 1, wherein, when a distance between a center point of the first light emitting area and a center point of the third light emitting area is defined as a first center distance and a distance between a center point of the second light emitting area and the center point of the third light emitting area is defined as a second center distance, the first center distance is smaller than the second center distance.

6. The display device of claim 5, wherein the light emitting areas further comprise:
a fourth light emitting area comprising the first light emitting element; and
a fifth light emitting area comprising the second light emitting element and having a larger area than the fourth light emitting area, and
wherein, when a distance between a center point of the fourth light emitting area and the center point of the third light emitting area is defined as a third center distance and a distance between a center point of the fifth light emitting area and the center point of the third light emitting area is defined as a fourth center distance, the third center distance is smaller than the fourth center distance.

7. The display device of claim 6, wherein the first center distance is the same as the third center distance, and the second center distance is the same as the fourth center distance.

8. The display device of claim 1, wherein the first light is light in a red wavelength band.

9. The display device of claim 1, further comprising:
a plurality of common connection electrodes overlapping the partition wall;
a pixel electrode in each of the light emitting areas; and
a common electrode on the first light emitting element, the second light emitting element, the third light emitting element, and the partition wall,
wherein each of the common connection electrodes overlaps at least a part of a pixel circuit unit.

10. The display device of claim 1, wherein a width of the first light emitting element in a direction is greater than a width of the second light emitting element in the direction and a width of the third light emitting element in the direction.

11. The display device of claim 10, wherein a distance between the first light emitting element and the partition wall, a distance between the second light emitting element and the partition wall, and a distance between the third light emitting element and the partition wall are the same.

12. The display device of claim 1, wherein a width of the first light emitting element in a direction, a width of the second light emitting element in the direction, and a width of the third light emitting element in the direction are the same, and
wherein a distance between the first light emitting element and the partition wall is greater than a distance between the second light emitting element and the partition wall and a distance between the third light emitting element and the partition wall.

13. A display device comprising:
a substrate;
a pixel electrode on the substrate;
a common connection electrode on the substrate and spaced apart from the pixel electrode;
a light emitting element on the pixel electrode;
a first connection electrode on the common connection electrode;
a partition wall on the first connection electrode;
a first insulating layer on side surfaces of the light emitting element, side surfaces of the first connection electrode, and upper and side surfaces of the partition wall; and
a common electrode,
wherein at least a part of an upper surface of the first connection electrode is exposed without being covered by the partition wall, and
wherein the common electrode is connected to the upper surface of the first connection electrode exposed without being covered by the partition wall.

14. The display device of claim 13, wherein the common electrode is on an upper surface of the light emitting element and the first insulating layer.

15. The display device of claim 13, wherein the light emitting element comprises a first semiconductor layer, an active layer, and a second semiconductor layer sequentially stacked on each other.

16. The display device of claim 13, wherein a height of the light emitting element is the same as a height of the partition wall.

17. A display device comprising:
a substrate;
a partition wall on the substrate;
a plurality of light emitting areas comprising a first light emitting area, a second light emitting area, and a third light emitting area partitioned by the partition wall;
a light emitting element in each of the plurality of light emitting areas, each of the light emitting elements being electrically connected to a continuous common electrode and
a plurality of common connection areas electrically connected to the common electrode, spaced apart from each other, and spaced apart from each of the light emitting areas,
wherein a distance between a first common connection area from among the common connection areas and a center point of the first light emitting area adjacent to the first common connection area is the same as a distance between the first common connection area and a center point of the second light emitting area adjacent to the first common connection area and is the same as a distance between the first common connection area and a center point of the third light emitting area adjacent to the first common connection area.

18. The display device of claim 17, wherein the first light emitting area and the second light emitting area are arranged in a first direction, the second light emitting area and the third light emitting area are arranged in a first diagonal direction obliquely inclined to the first direction, and the first light emitting area and the third light emitting area are arranged in a second diagonal direction crossing the first diagonal direction.

19. The display device of claim 18, further comprising:
a fourth light emitting area partitioned by the partition wall on the substrate and adjacent to the second light emitting area and the third light emitting area in the first diagonal direction; and
a fifth light emitting area partitioned by the partition wall on the substrate and adjacent to the first light emitting area and the third light emitting area in the second diagonal direction.

20. The display device of claim 19, wherein a minimum distance from a second common connection area between the first light emitting area and the fourth light emitting area from among the common connection areas to the third light emitting area is greater than a minimum distance from a third common connection area between the second light emitting area and the fifth light emitting area to the third light emitting area.

21. The display device of claim 20, wherein the common connection areas further comprise a fourth common connection area between the fourth light emitting area and the fifth light emitting area, and wherein the first common connection area, the second common connection area, the third common connection area, and the fourth common connection area are arranged in a diamond shape.

* * * * *